United States Patent
Zhang et al.

(10) Patent No.: US 10,050,054 B2
(45) Date of Patent: Aug. 14, 2018

(54) THREE-DIMENSIONAL MEMORY DEVICE HAVING DRAIN SELECT LEVEL ISOLATION STRUCTURE AND METHOD OF MAKING THEREOF

(71) Applicant: SANDISK TECHNOLOGIES LLC, Plano, TX (US)

(72) Inventors: Yanli Zhang, San Jose, CA (US); Johann Alsmeier, San Jose, CA (US); Raghuveer S. Makala, Campbell, CA (US); Senaka Kanakamedala, San Jose, CA (US); Rahul Sharangpani, Fremont, CA (US); James Kai, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/286,063

(22) Filed: Oct. 5, 2016

(65) Prior Publication Data
US 2018/0097009 A1    Apr. 5, 2018

(51) Int. Cl.
| | |
|---|---|
| *H01L 21/768* | (2006.01) |
| *H01L 27/11582* | (2017.01) |
| *H01L 27/11519* | (2017.01) |
| *H01L 27/11565* | (2017.01) |
| *H01L 27/11524* | (2017.01) |

(Continued)

(52) U.S. Cl.
CPC .... *H01L 27/11582* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC .............. H01L 27/11524; H01L 21/76816
See application file for complete search history.

(56) References Cited

U.S. PATENT DOCUMENTS

| | | | |
|---|---|---|---|
| 5,915,167 A | 6/1999 | Leedy | |
| 6,028,788 A | 2/2000 | Choi et al. | |

(Continued)

FOREIGN PATENT DOCUMENTS

| | | |
|---|---|---|
| WO | WO2002/015277 A1 | 2/2002 |
| WO | WO2017112014 A1 | 6/2017 |

OTHER PUBLICATIONS

Endoh, T. et al., "Novel Ultra high Density Memory with a Stacked-Surrounding Gate Transistor (S-SGT) Structured Cell," IEDM Proc. 2001, pp. 33-36, (2001).

(Continued)

*Primary Examiner* — Thomas L Dickey
(74) *Attorney, Agent, or Firm* — The Marbury Law Group PLLC

(57) ABSTRACT

A layer stack including an alternating stack of insulating layers and sacrificial material layers is formed over a substrate. After formation of memory stack structures, backside trenches are formed through the layer stack. The sacrificial material layers are replaced with electrically conductive layers. Drain select level dielectric isolation structures are formed through drain select level of the stack after formation of the electrically conductive layers. The drain select level dielectric isolation structures laterally separate portions of conductive layers that are employed as drain select level gate electrodes for the memory stack structures.

9 Claims, 64 Drawing Sheets

(51) Int. Cl.
H01L 27/1157 (2017.01)
H01L 27/11556 (2017.01)

(56) References Cited

U.S. PATENT DOCUMENTS

| | | | |
|---|---|---|---|
| 6,759,333 | B2 | 7/2004 | Okajima et al. |
| 7,005,350 | B2 | 2/2006 | Walker et al. |
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,349,681 | B2 | 1/2013 | Alsmeier et al. |
| 8,658,499 | B2 | 2/2014 | Makala et al. |
| 9,023,719 | B2 | 5/2015 | Pachamuthu et al. |
| 9,177,966 | B1 | 11/2015 | Rabkin et al. |
| 9,484,296 | B2 | 11/2016 | Takahashi et al. |
| 9,613,975 | B2 | 4/2017 | Huang et al. |
| 2007/0210338 | A1 | 9/2007 | Orlowski |
| 2007/0252201 | A1 | 11/2007 | Kito et al. |
| 2009/0242967 | A1 | 10/2009 | Katsumata et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0198687 | A1 | 8/2011 | Lee |
| 2011/0248327 | A1 | 10/2011 | Son et al. |
| 2011/0266606 | A1 | 11/2011 | Park et al. |
| 2011/0280077 | A1 | 11/2011 | Fishburn |
| 2011/0310670 | A1 | 12/2011 | Shim et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0032245 | A1 | 2/2012 | Hwang et al. |
| 2012/0092926 | A1 | 4/2012 | Whang |
| 2012/0146122 | A1 | 6/2012 | Whang et al. |
| 2013/0264631 | A1 | 10/2013 | Alsmeier et al. |
| 2013/0313627 | A1 | 11/2013 | Lee et al. |
| 2014/0001530 | A1 | 1/2014 | Song |
| 2014/0138760 | A1 | 5/2014 | Makala et al. |
| 2014/0284693 | A1 | 9/2014 | Sato et al. |
| 2015/0076584 | A1 | 3/2015 | Pachamuthu et al. |
| 2015/0179660 | A1 | 6/2015 | Yada et al. |
| 2015/0348637 | A1 | 12/2015 | Han et al. |
| 2015/0348984 | A1 | 12/2015 | Yada et al. |
| 2016/0093635 | A1 | 3/2016 | Rabkin et al. |
| 2016/0149049 | A1 | 5/2016 | Sharangpani et al. |
| 2016/0204117 | A1 | 7/2016 | Liu et al. |
| 2016/0204122 | A1* | 7/2016 | Shoji .............. H01L 27/11582 257/324 |
| 2017/0125433 | A1 | 5/2017 | Ogawa et al. |
| 2017/0278571 | A1 | 9/2017 | Chowdhury et al. |

OTHER PUBLICATIONS

Pan, W. S. et al., "Selective Reactive Ion Etching of Tungsten Films in CHF3 and Other Fluorinated Gases," J. Vac. Sci. Technol. B, vol. 5, No. 4, pp. 1073-1080, (1988).

U.S. Appl. No. 15/155,639, filed May 16, 2016, SanDisk Technologies LLC.

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Tanaka et al., "Bit-Cost Scalable Technology for Low-Cost and Ultrahigh-Density Flash Memory," Toshiba Review, vol. 63, No. 2, 2008, pp. 28-31.

Kimura, M., "3D Cells Make Terabit NAND Flash Possible," Nikkei Electronics Asia, Sep. 17, 2009, 6pgs.

International Search Report and Written Opinion, International Application No. PCT/US2011/042566, dated Jan. 17, 2012.

Invitation to Pay Additional Fees & Partial International Search Report, PCT/US2011/042566, dated Sep. 28, 2011.

Chen et al., "Reliability Characteristics of NiSi Nanocrystals Embedded in Oxide and Nitride Layers for Nonvolatile Memory Application," Applied Physics Letters, 92, 152114 (2008).

Invitation to Pay Additional Search Fees, International Application No. PCT/2013/048508, dated Sep. 18, 2013.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

International Search Report and Written Opinion, International Application No. PCT/US2013/048508, dated Dec. 18, 2013.

Chen et al., "Formation of $NiSi_2/SiN_x$ Compound Nanocrystal for Nonvolatile Memory Application," Thin Solid Films, Elsevier-Sequoia S.A., Lausanne, Switzerland, vol. 518, No. 24, pp. 7324-7327 (2010).

Diaz, "Low-κ Dielectrics: Materials and Process Technology," EE518, Penn State University, Apr. 13, 2006.

Saraswat, "Low-κ Dieletrics," Department of Electrical Engineering, Stanford University, Jul. 2008.

Invitation to Pay Additional Fees and Communication Relating to the Results of the Partial International Search from the International Searching Authority for International Patent Application No. PCT/US2017/014172, dated Apr. 28, 2017, 12 pages.

International Search Report and Written Opinion of the International Searching Authority for International Patent Application No. PCT/US2017/014172, dated Jun. 20, 2017, 17 pages.

Invitation to Pay Additional Fees and, Where Applicable, Protest Fee from the International Searching Authority for International Patent Application No. PCT/US2017/049445, dated Dec. 6, 2017, 17 pages.

International Search Report and Written Opinion of the International Searching Authority for International Patent Application No. PCT/US2017/049445, dated Jan. 29, 2018, 23 pages.

\* cited by examiner

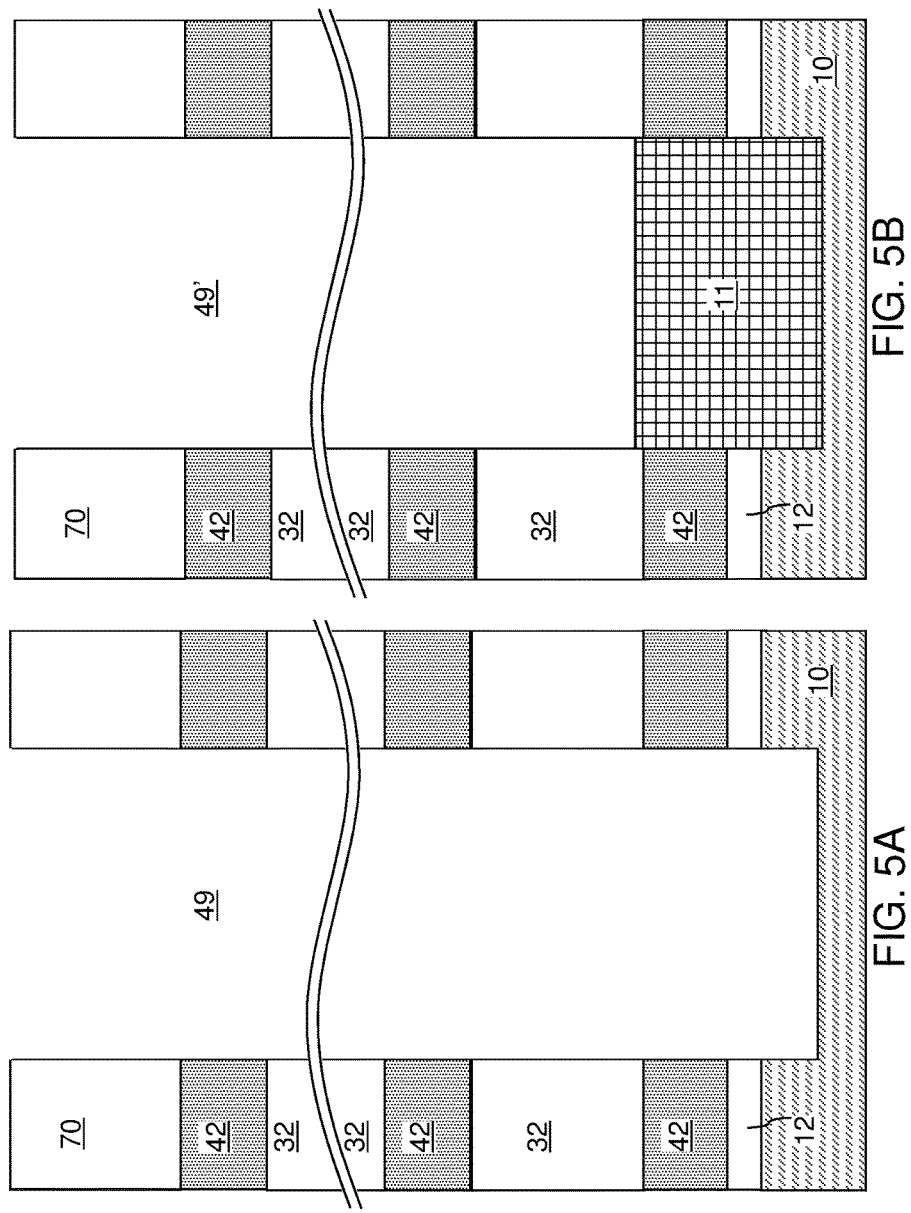

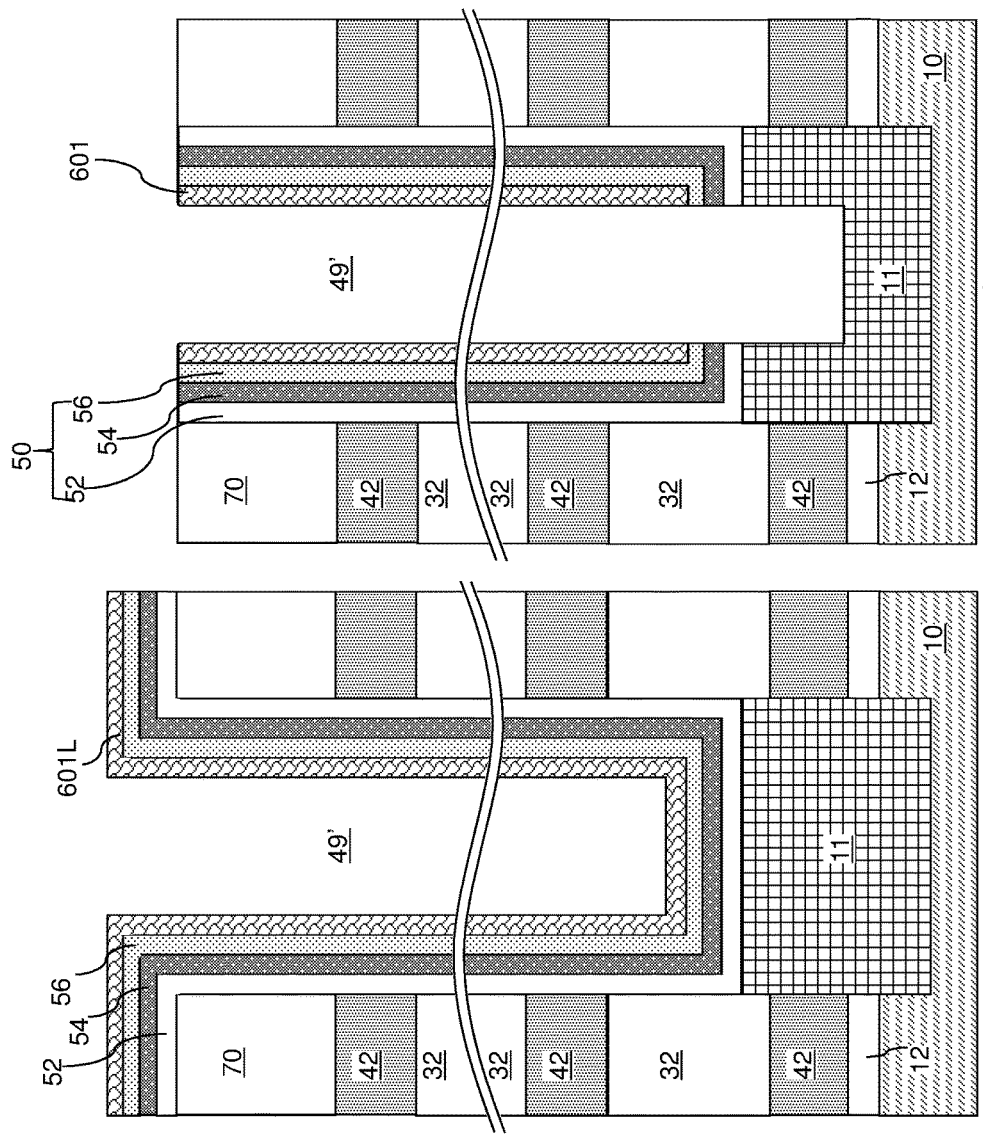

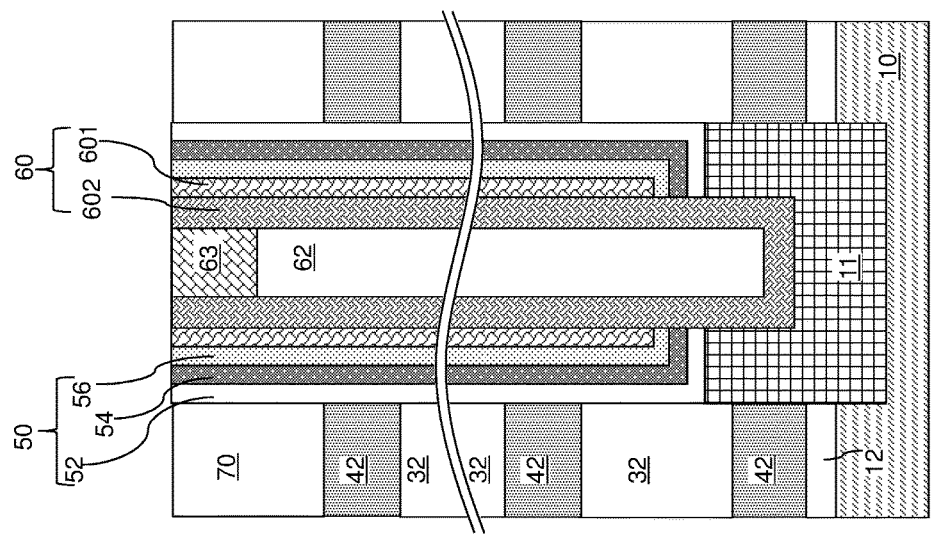
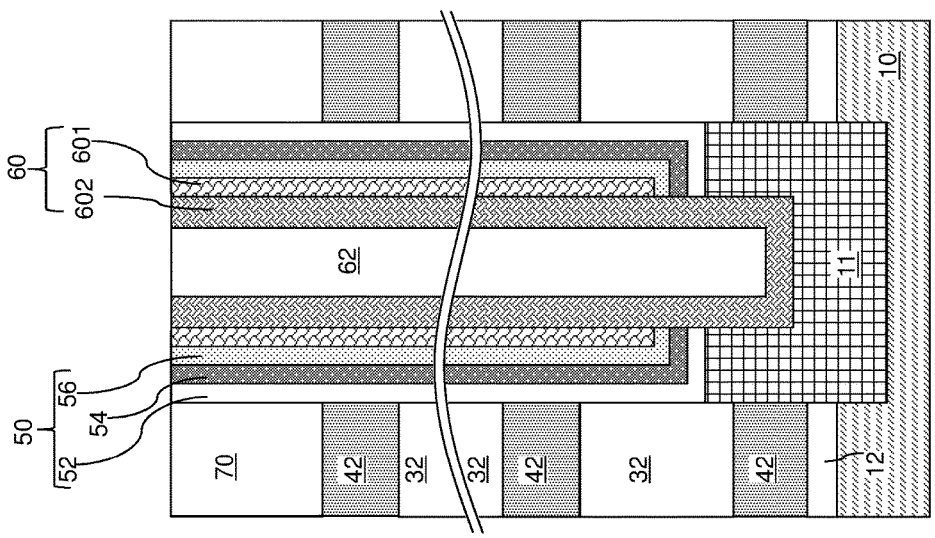

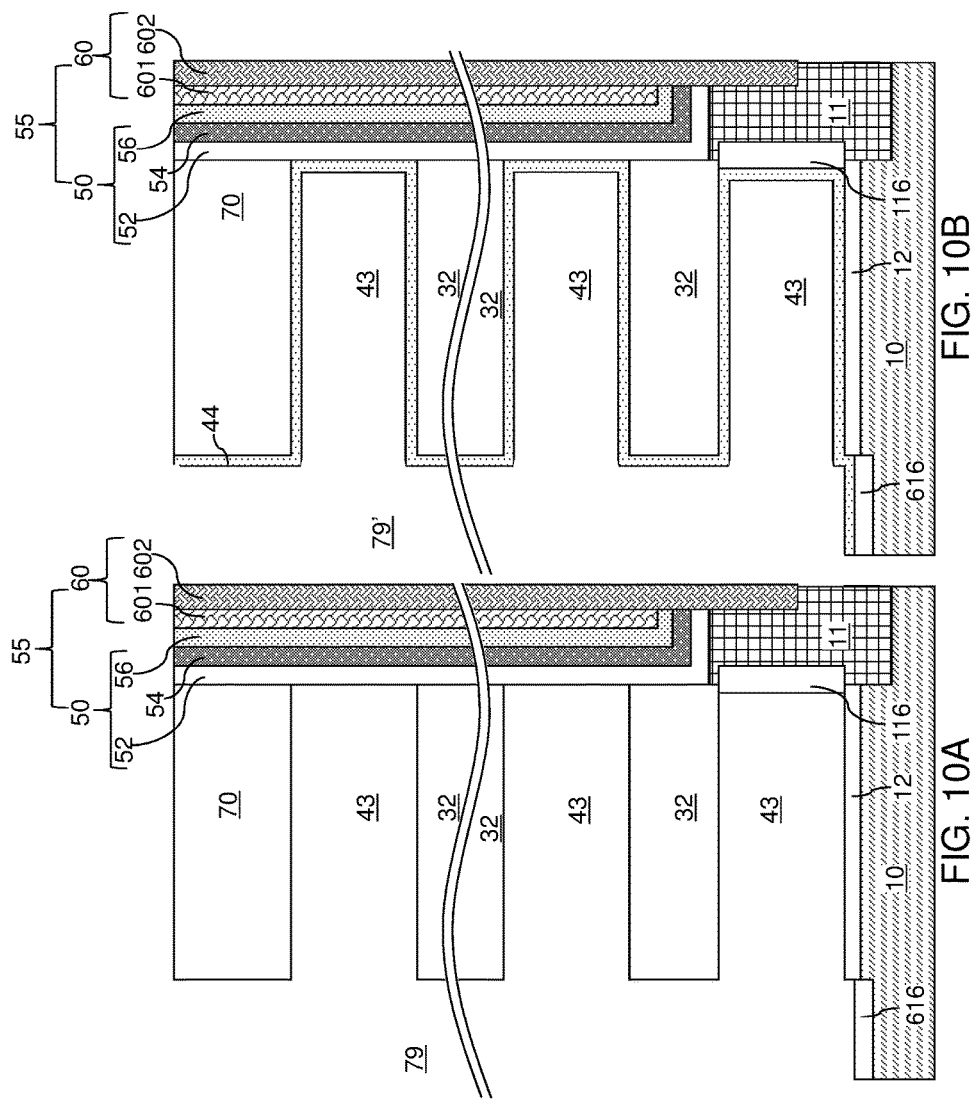

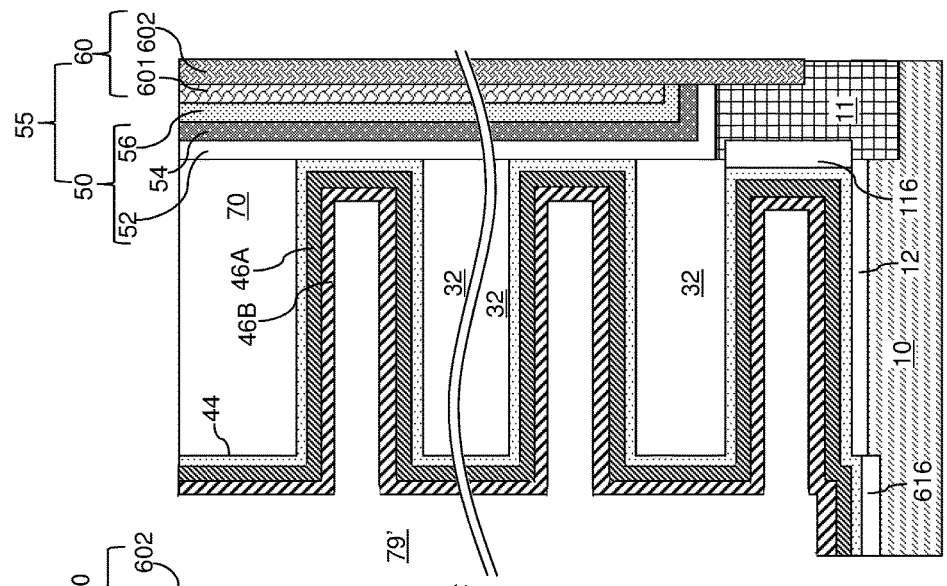
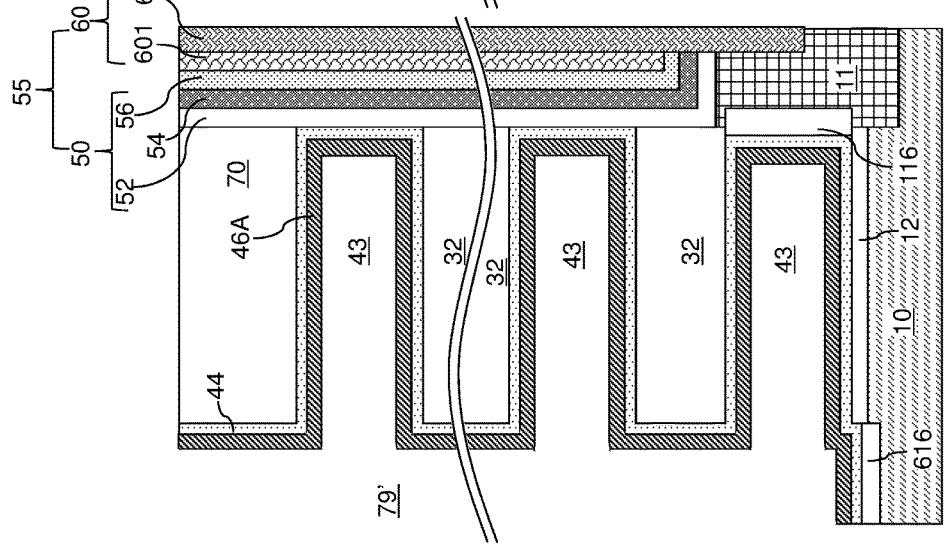

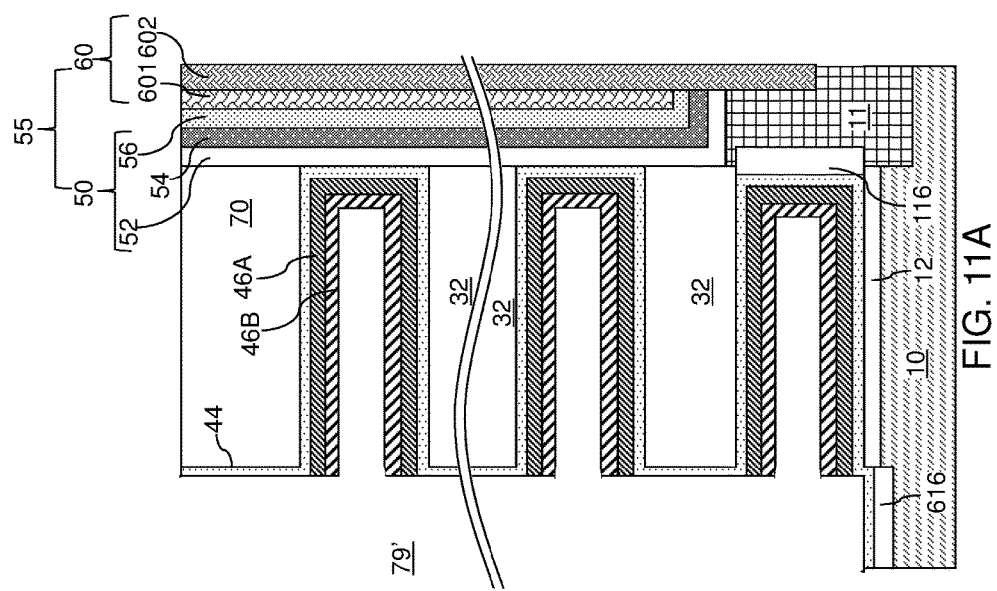

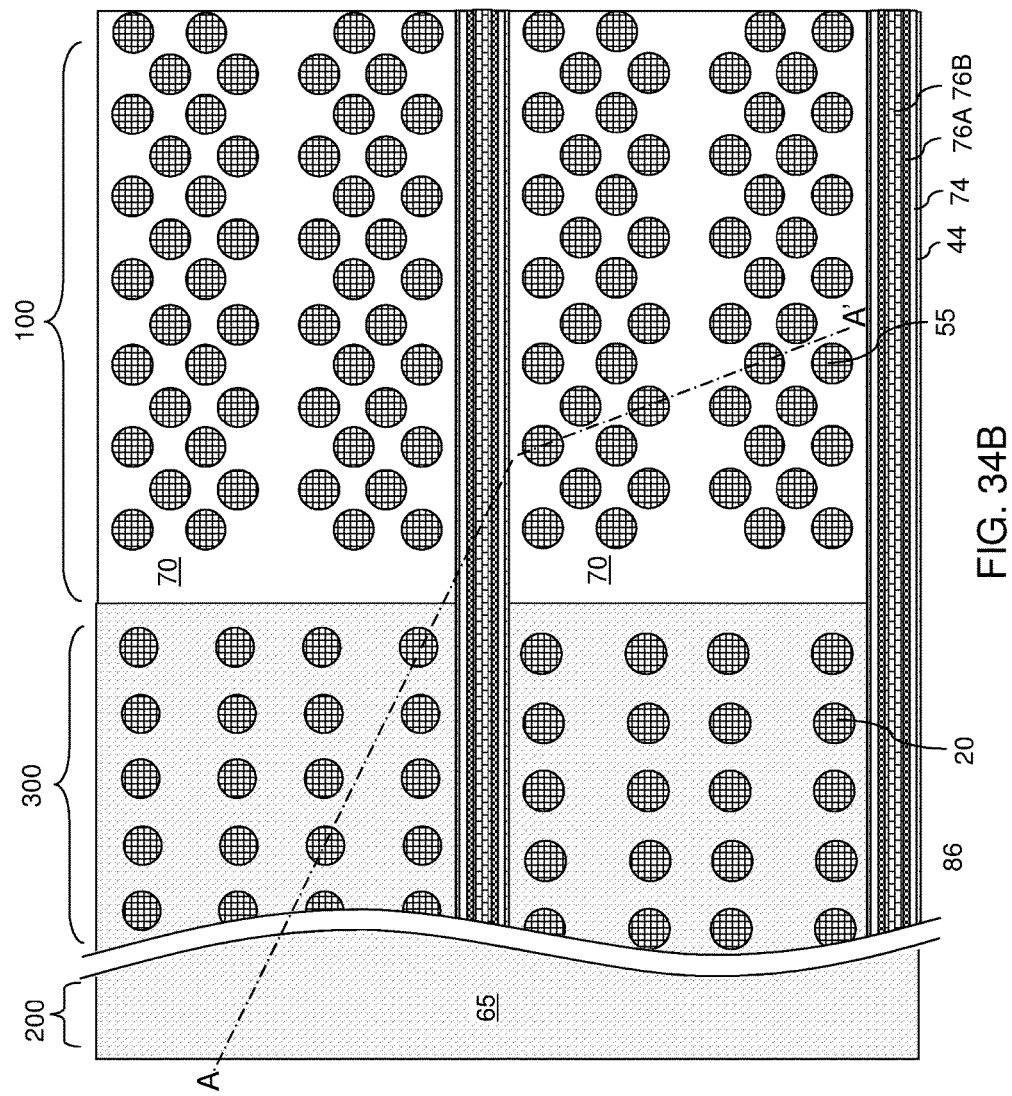

10,050,054 B2

THREE-DIMENSIONAL MEMORY DEVICE HAVING DRAIN SELECT LEVEL ISOLATION STRUCTURE AND METHOD OF MAKING THEREOF

FIELD

The present disclosure relates generally to the field of semiconductor devices, and particular to a three-dimensional memory device employing drain select level isolation structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of forming a three-dimensional memory device comprises forming a layer stack over a substrate, wherein the layer stack comprises an alternating stack of insulating layers and sacrificial material layers, forming memory stack structures through the alternating stack, forming a backside trench through the alternating stack, forming backside recesses by removing the sacrificial material layers selective to the insulating layers, forming electrically conductive layers in the backside recesses, and forming a dielectric isolation structure in drain select level of the three-dimensional memory device after formation of the electrically conductive layers.

According to another aspect of the present disclosure, a three-dimensional memory device comprises an alternating stack of insulating layers and electrically conductive layers located over a substrate, memory stack structures extending through the alternating stack, wherein each of the memory stack structures comprises a memory film and a vertical semiconductor channel contacting an inner sidewall of the memory film, and a dielectric isolation structure extending through a first subset of layers within the alternating stack that is less than an entirety of the alternating stack. The first subset of layers within the alternating stack is located in an upper portion of the alternating stack, and each electrically conductive layer within the first subset of layers comprises a drain select gate of the three-dimensional memory device that physically contacts a sidewall of the dielectric isolation structure.

According to another aspect of the present disclosure, a three-dimensional memory device comprises an alternating stack of insulating layers and first electrically conductive layers located over a substrate, at least one second electrically conductive layer located over the alternating stack and comprising a metal-semiconductor alloy material that has a composition different from any material within the first electrically conductive layers; memory stack structures extending through the alternating stack and the at least one second electrically conductive layer, wherein each of the memory stack structures comprises a memory film and a vertical semiconductor channel contacting an inner sidewall of the memory film; and a dielectric isolation structure located above the first electrically conductive layers, and contacting a sidewall of at least a topmost layer of the at least one second electrically conductive layer.

BRIEF DESCRIPTION OF THE DRAWINGS

FIGS. 5A-5H are sequential schematic vertical cross-sectional views of a memory opening within the first exemplary structure during processing steps employed to form memory stack structures according to the first embodiment of the present disclosure.

FIGS. 10A-10D are sequential vertical cross-sectional views of a region of the first exemplary structure around a backside trench during formation of electrically conductive layers according to the first embodiment of the present disclosure.

FIG. 11A is a vertical cross-sectional view of the region of the first exemplary structure around the backside trench after an anisotropic etch according to the first embodiment of the present disclosure.

FIG. 34B is a top-down view of the fourth exemplary structure of FIG. 34A. The vertical plane A-A' is the plane of the schematic vertical cross-sectional view of FIG. 34A.

DETAILED DESCRIPTION

Figure 1:
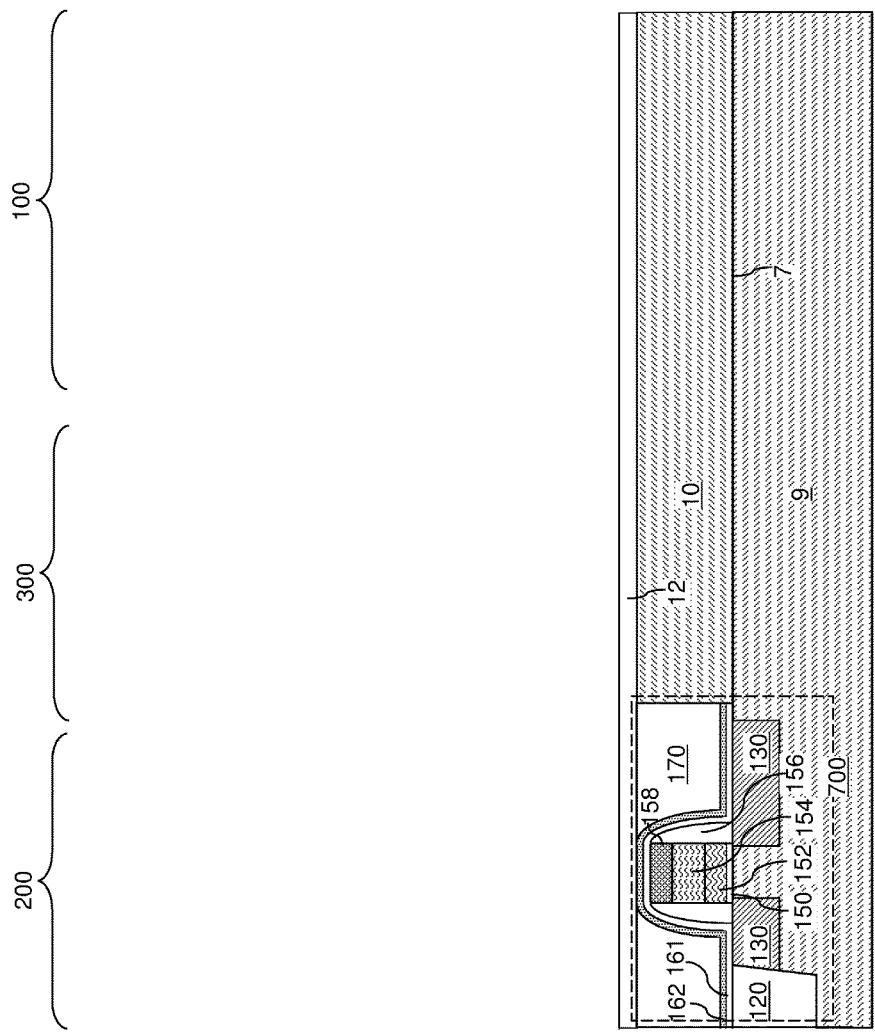
FIG. 1 is a schematic vertical cross-sectional view of a first exemplary structure after formation of at least one peripheral device, a semiconductor material layer, and a gate dielectric layer according to a first embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

The various embodiments of the present disclosure can be employed to form drain select level isolation structures which permit selection of one group of memory stack structures (e.g., NAND strings) among multiple groups of memory stack structures connected to same set of bit lines. In case more than two groups of memory stack structures are provided between a neighboring pair of backside trenches, formation of drain select level isolation structures prior to replacement of sacrificial material layers with electrically conductive layers prevents replacement of center portions of the sacrificial material layers between drain select level isolation structures.

In view of this, methods of forming electrically conductive layers and drain select level isolation structures of various embodiments are provided which permit replacement of center portions of the sacrificial material layers between drain select level isolation structures. As used herein, a drain select level corresponds to the location of the drain select gate(s) of the three-dimensional memory device. For example, the drain select level may be located between the bottom surface of the lowest drain select gate and the top surface of the highest drain select gate.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Figure 2:
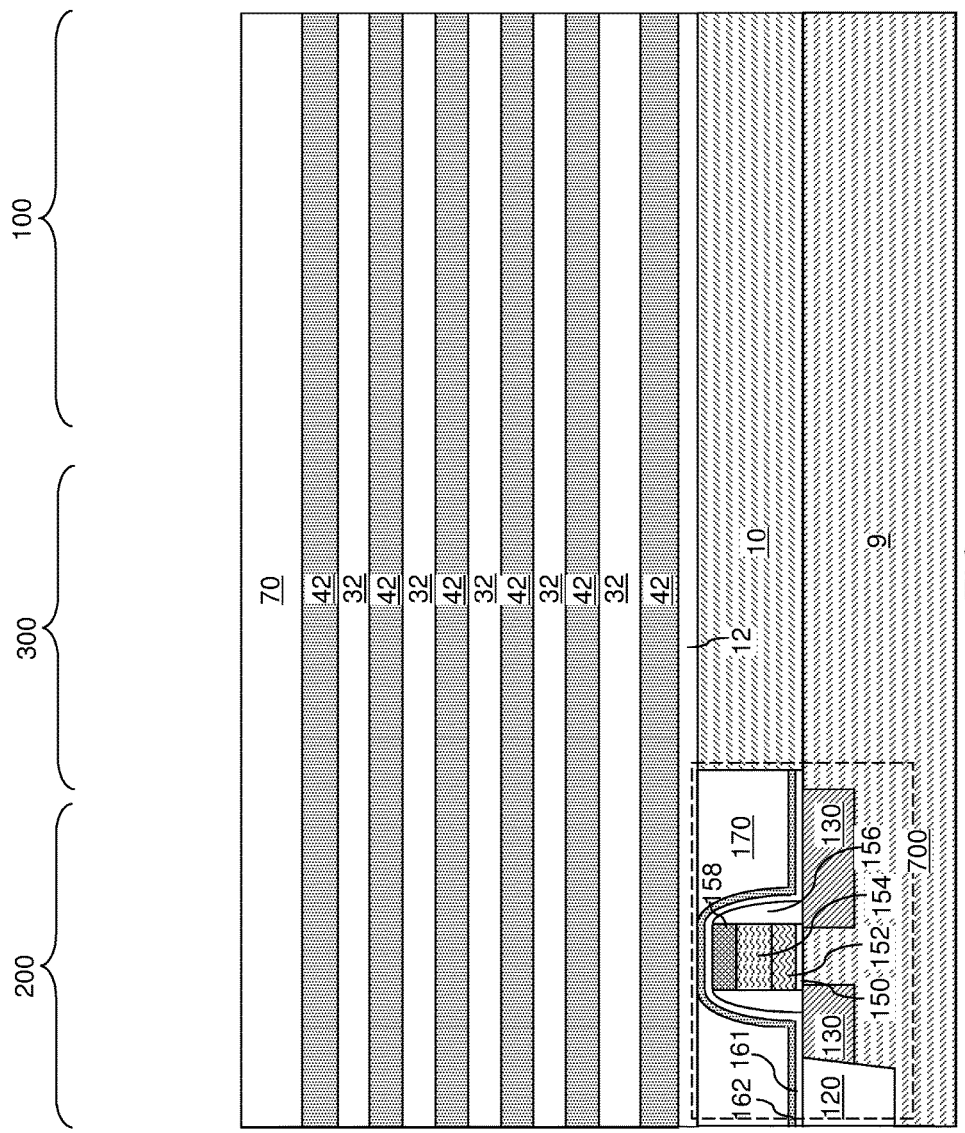
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
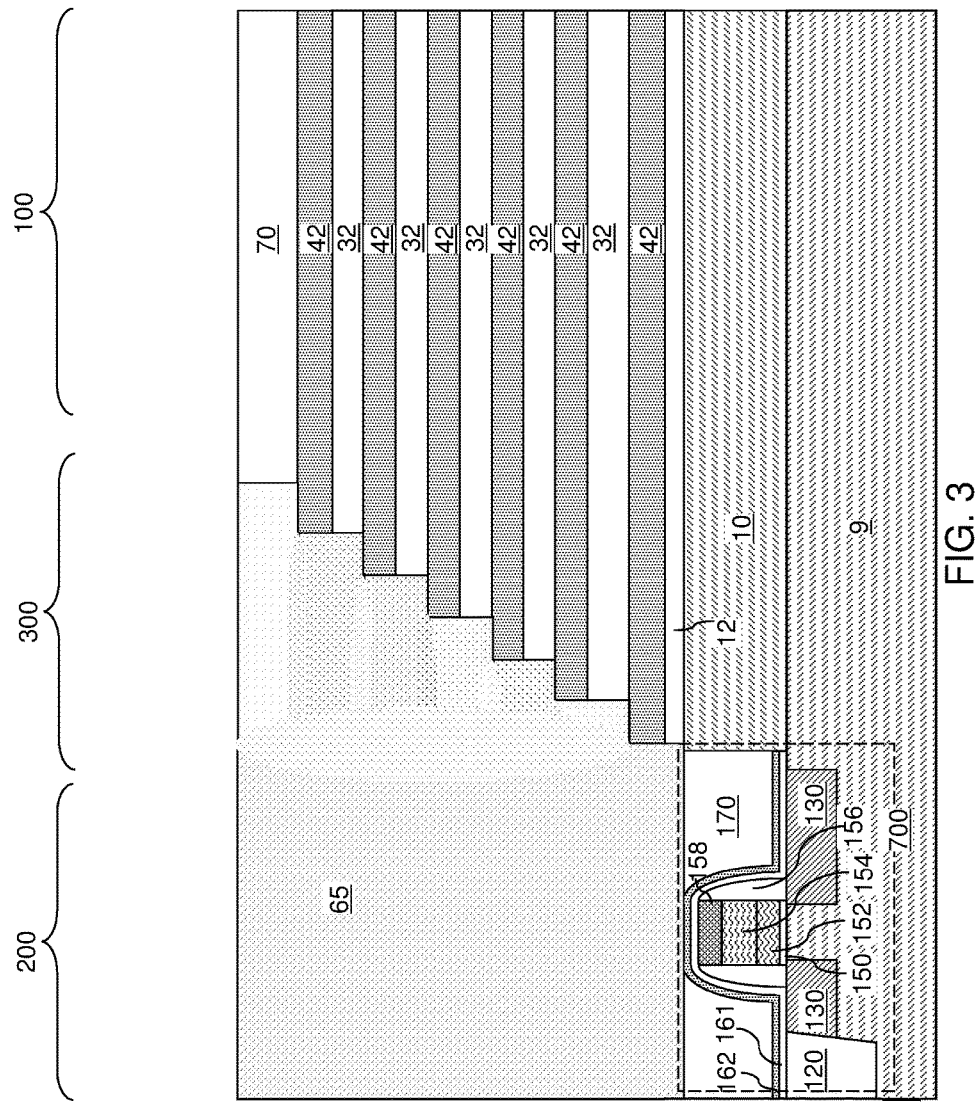
FIG. 3 is a schematic vertical cross-sectional view of the first exemplary structure after formation of stepped terraces and a retro-stepped dielectric material portion according to the first embodiment of the present disclosure.

Referring to FIG. 3, a stepped cavity can be formed within the contact region 300 which is located between the memory array region (e.g., device region) 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP).

The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
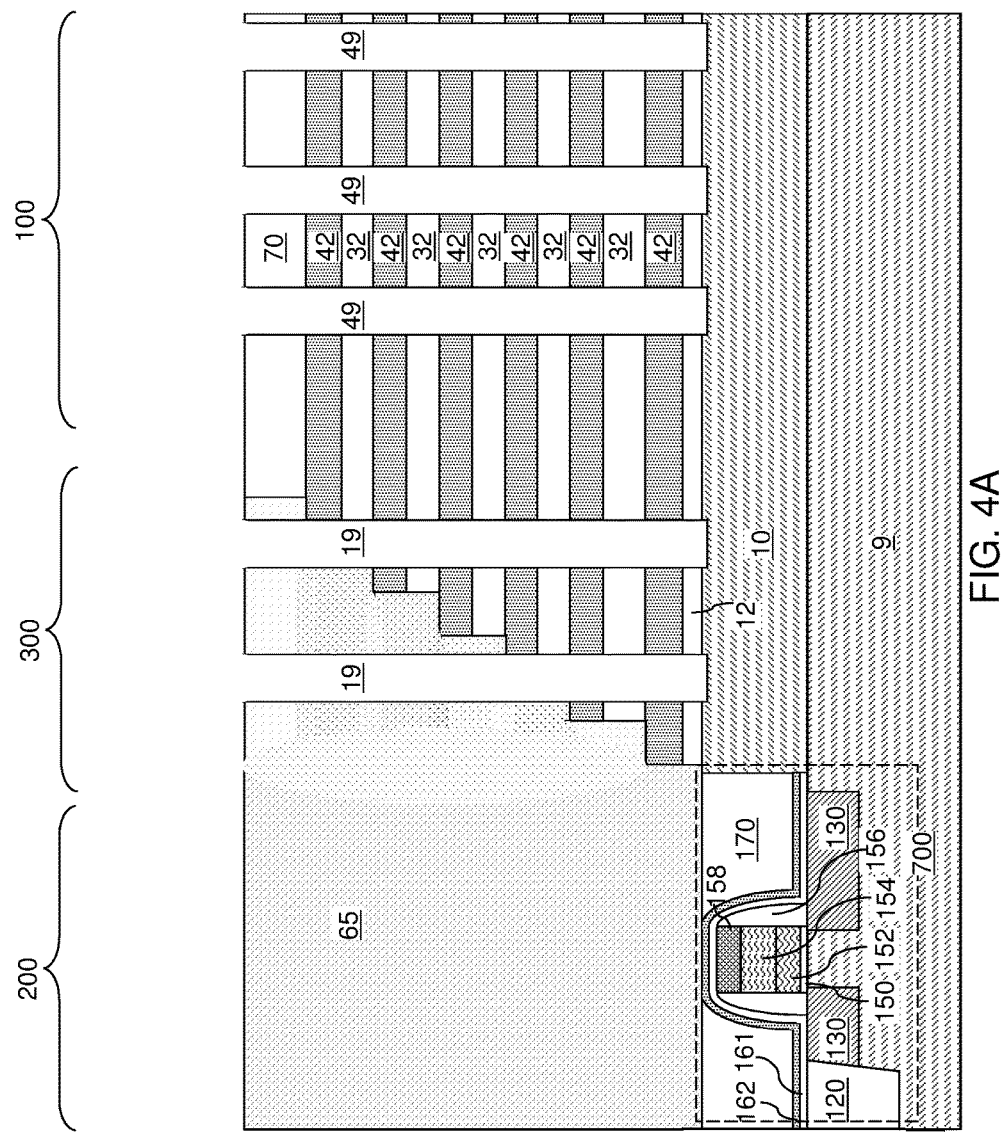
FIG. 4A is a schematic vertical cross-sectional view of the first exemplary structure after formation of memory openings and support openings according to the first embodiment of the present disclosure.
Figure 4B:
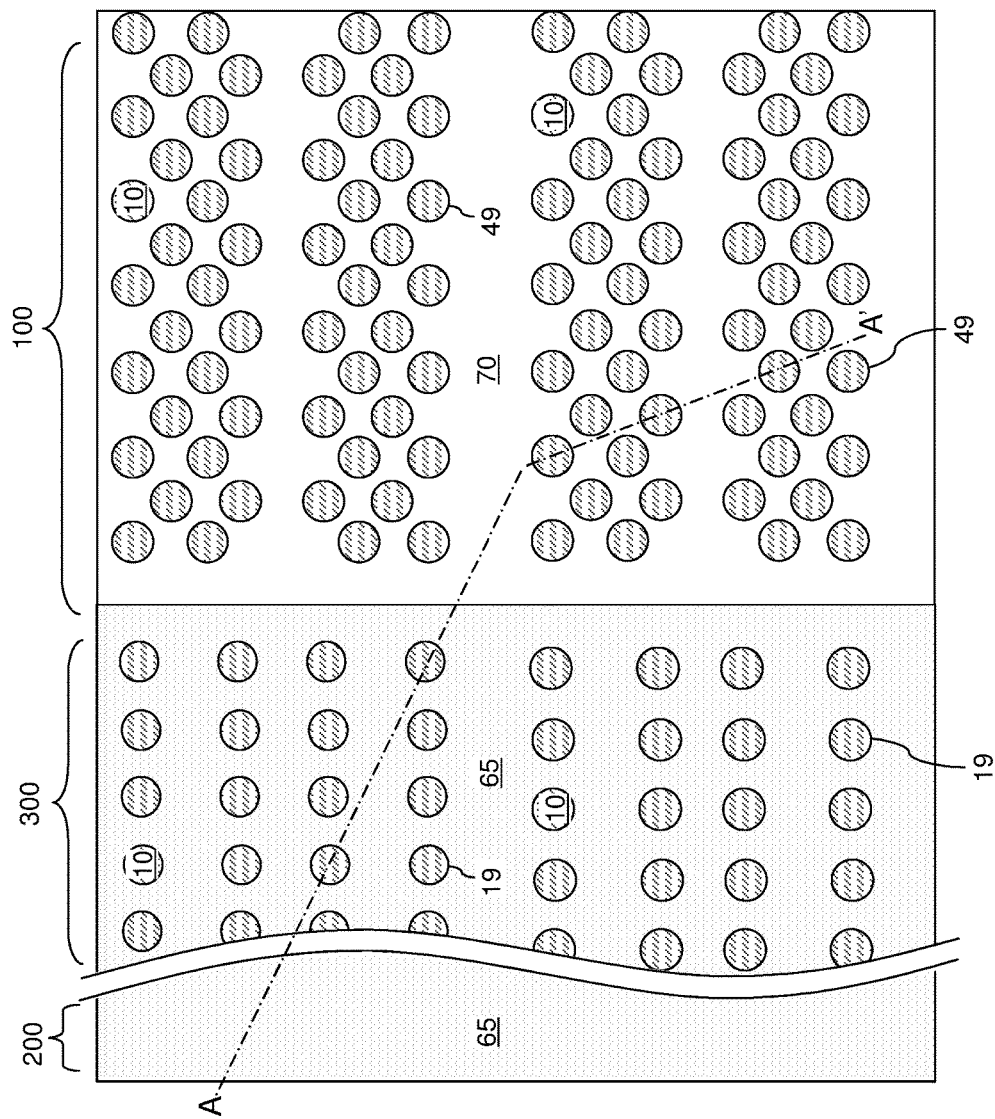
FIG. 4B is a top-down view of the first exemplary structure of FIG. 4A. The vertical plane A-A' is the plane of the schematic vertical cross-sectional view of FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the gate dielectric layer 12 so that the memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), the gate dielectric layer 12, and optionally into an upper portion of the semiconductor material layer 10. At this processing step, each support opening 19 can extend through the retro-stepped dielectric material portion 65, a subset of layers in the alternating stack (32, 42), the gate dielectric layer 12, and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional epitaxial channel portion (e.g., an epitaxial pedestal) 11 can be formed at the bottom portion of each memory opening 49 and each support openings 19, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10.

In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by anisotropic etch process.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the epitaxial channel portion 11 (or a surface of the semiconductor material layer 10 in case the epitaxial channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figures 5E, 5F:
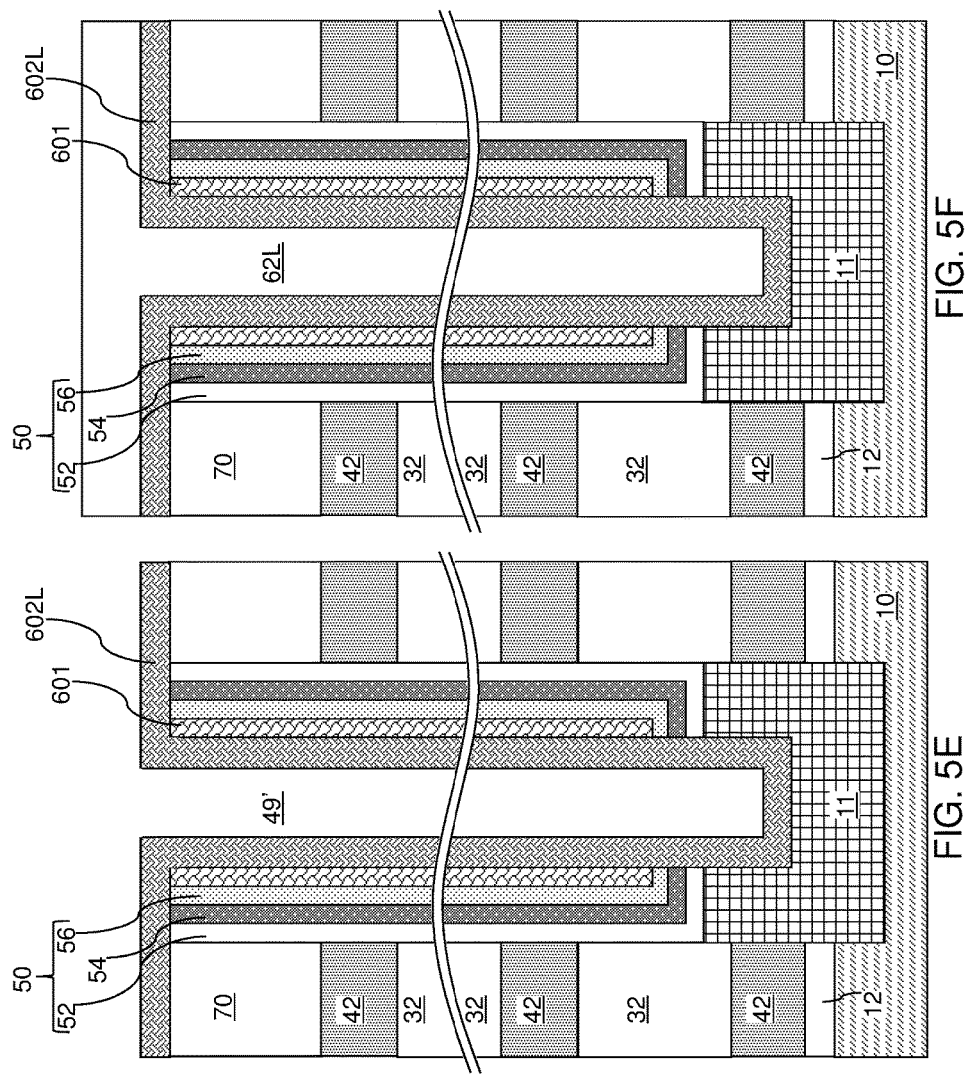

Referring to FIG. 5E, a second semiconductor channel layer 602 can be deposited directly on the semiconductor surface of the epitaxial channel portion 11 or the semiconductor substrate layer 10 if portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of an epitaxial channel portion 11 (if present), a memory stack structure 55, a dielectric core 62, and a drain region 63 within a memory opening 49 is herein referred to as a memory opening fill structure (11, 55, 62, 63). Each combination of an epitaxial channel portion 11 (if present), a memory film 50 (which is referred to as a dielectric layer stack 50' when it is located in the support opening 19), a vertical semiconductor channel 60, a dielectric core 62, and a dummy drain region 63' (i.e., a drain region which is not electrically connected to a bit line) within each support opening 19 fills the respective support openings 19, and constitutes a support pillar structure 20, as shown in FIG. 6A.

Figure 6A:
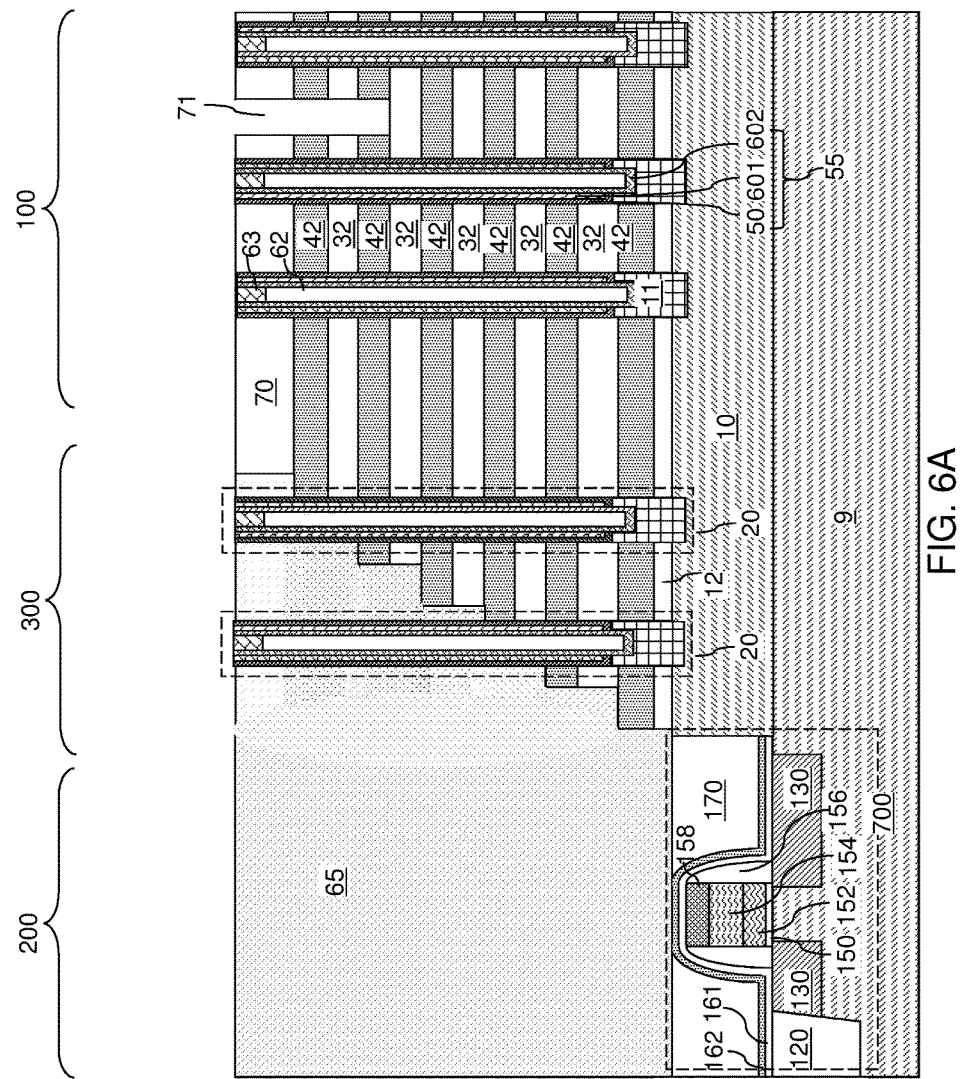
FIG. 6A is a schematic vertical cross-sectional view of the first exemplary structure after formation of isolation trenches according to the first embodiment of the present disclosure.
Figure 6B:
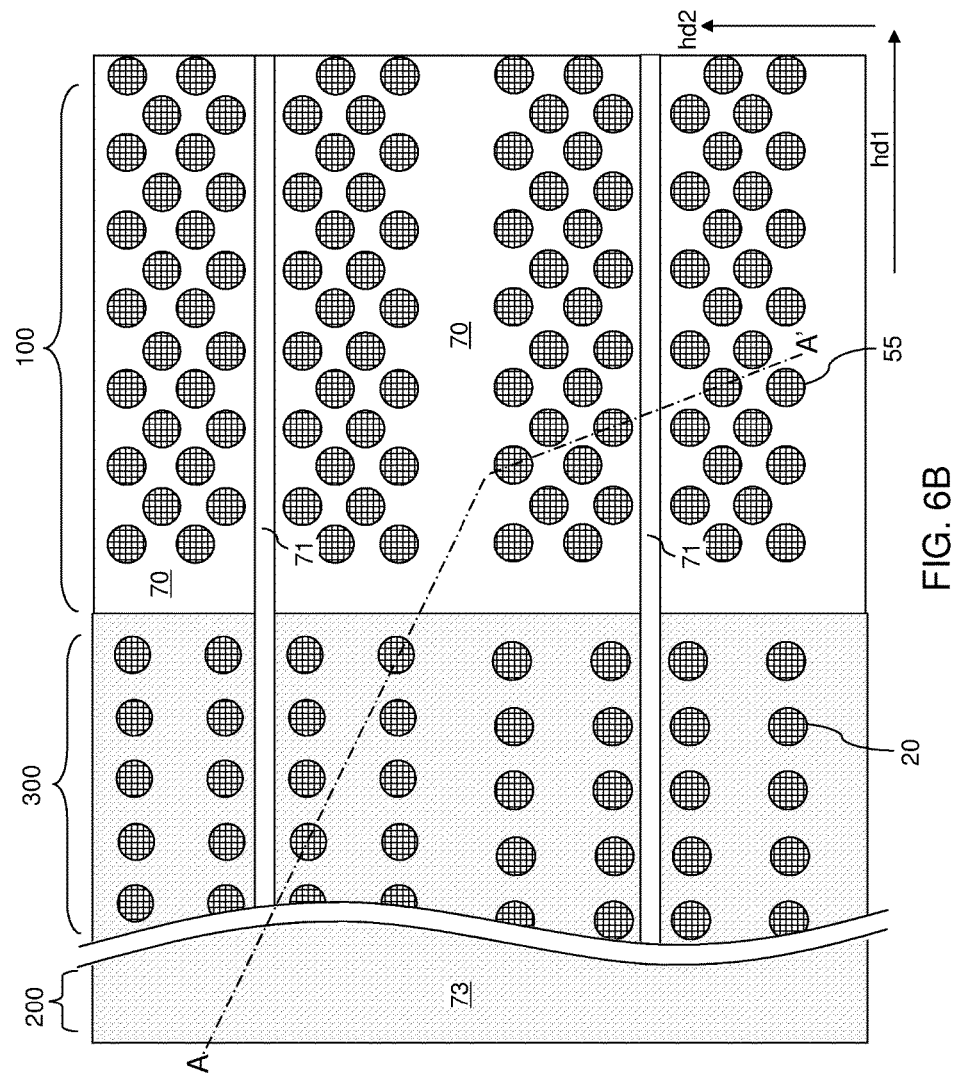
FIG. 6B is a top-down view of the first exemplary structure of FIG. 6A. The vertical plane A-A' is the plane of the schematic vertical cross-sectional view of FIG. 6A.

Referring to FIGS. 6A and 6B, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each exemplary memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Isolation trenches 71 can be formed through the insulating cap layer 70, insulating layers 32 and the sacrificial material layers 42 located at drain select gate levels. As used herein, a drain select gate level refers to a level of a drain select gate (SGD), which is a select gate electrode located in proximity to drain regions of the vertical NAND string. For example, a photoresist layer (not shown) can be applied over the insulating cap layer 70 and the retro-stepped dielectric material portion 65, and can be lithographically patterned to form laterally extending openings, which can extend along a first horizontal direction hd1 (e.g., word line direction). The laterally extending openings can be mutually spaced from one another along a second horizontal direction hd2 (e.g., bit line direction), which may be perpendicular to the first horizontal direction. The openings in the photoresist layer can overlie regions between groups of memory stack structures 55 and support pillar structures 20, i.e., in regions free of the memory stack structures 55 and the support pillar structures 20. An anisotropic etch can be performed to transfer the pattern in the photoresist layer into the insulating cap layer 70, the sacrificial material layers 42 located at the drain select gate levels, and a subset of the insulating layers 32 located between the sacrificial material layer 42 at the bottommost drain select gate level. The transferred pattern through the insulating cap layer 70, the sacrificial material layers 42 located at the drain select gate levels, and intervening insulating layers 32 constitutes the isolation trenches 71. Each isolation trench 71 can extend through the memory array region 100 and the contact region 300, and can laterally separate different groups of the memory stack structures 55 and the support pillar structures 20.

A subset of layers within the alternating stack (32, 42) is located in an upper portion of the alternating stack (32, 42). The subset of layers includes sacrificial material layers 42 located at drain select gate levels and insulating layers 32 located above the sacrificial material layer 42 at the bottommost drain select gate level. Each layer within the subset of layers is laterally divided into a pair of physically disjoined portions by each isolation trench 71.

Figure 7:
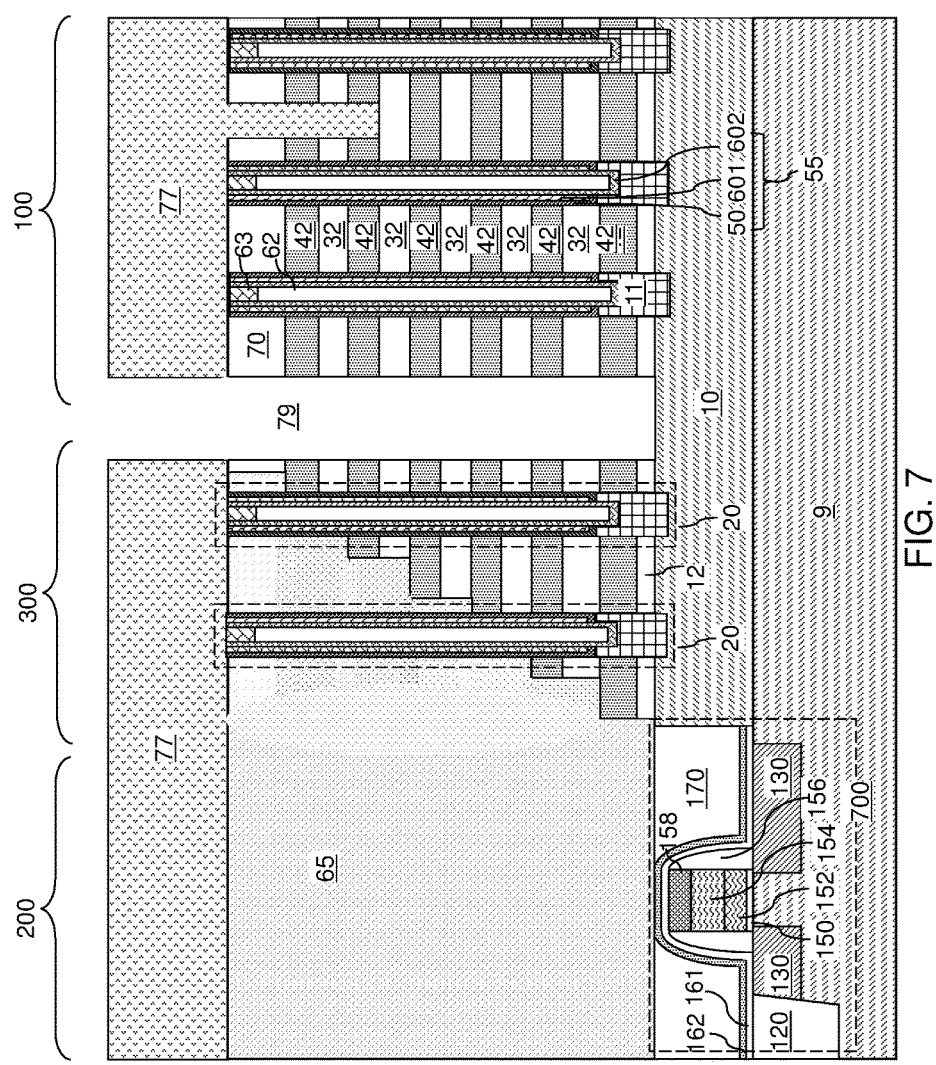
FIG. 7 is a schematic vertical cross-sectional view of the first exemplary structure after formation of a backside trench according to the first embodiment of the present disclosure.

Referring to FIG. 7, a photoresist layer 77 can be applied over the alternating stack (32, 42) and in the isolation trenches 71, such that the photoresist layer 77 fills the isolation trenches 71. The photoresist layer is lithographically patterned to form openings in areas between clusters of memory stack structures 55. The pattern in the photoresist layer can be transferred through the alternating stack (32, 42) and/or the retro-stepped dielectric material portion 65 employing an anisotropic etch to form the backside trenches 79, which vertically extend at least to the top surface of the substrate (9, 10), and laterally extend in direction hd1 through the memory array region 100 and the contact region 300. In one embodiment, the backside trenches 79 can include a source contact opening in which a source contact via structure can be subsequently formed.

Figure 8A:
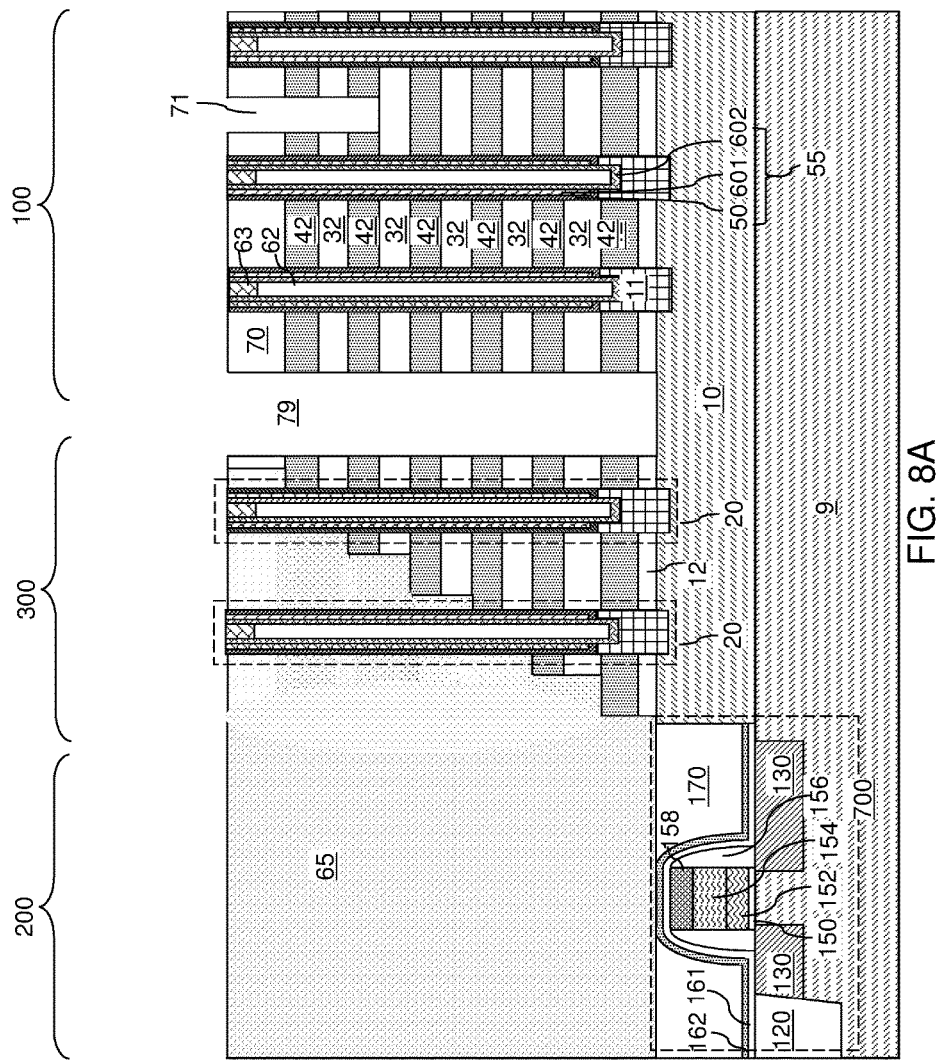
FIG. 8A is a schematic vertical cross-sectional view of the first exemplary structure after removal of a photoresist layer according to the first embodiment of the present disclosure.
Figure 8B:
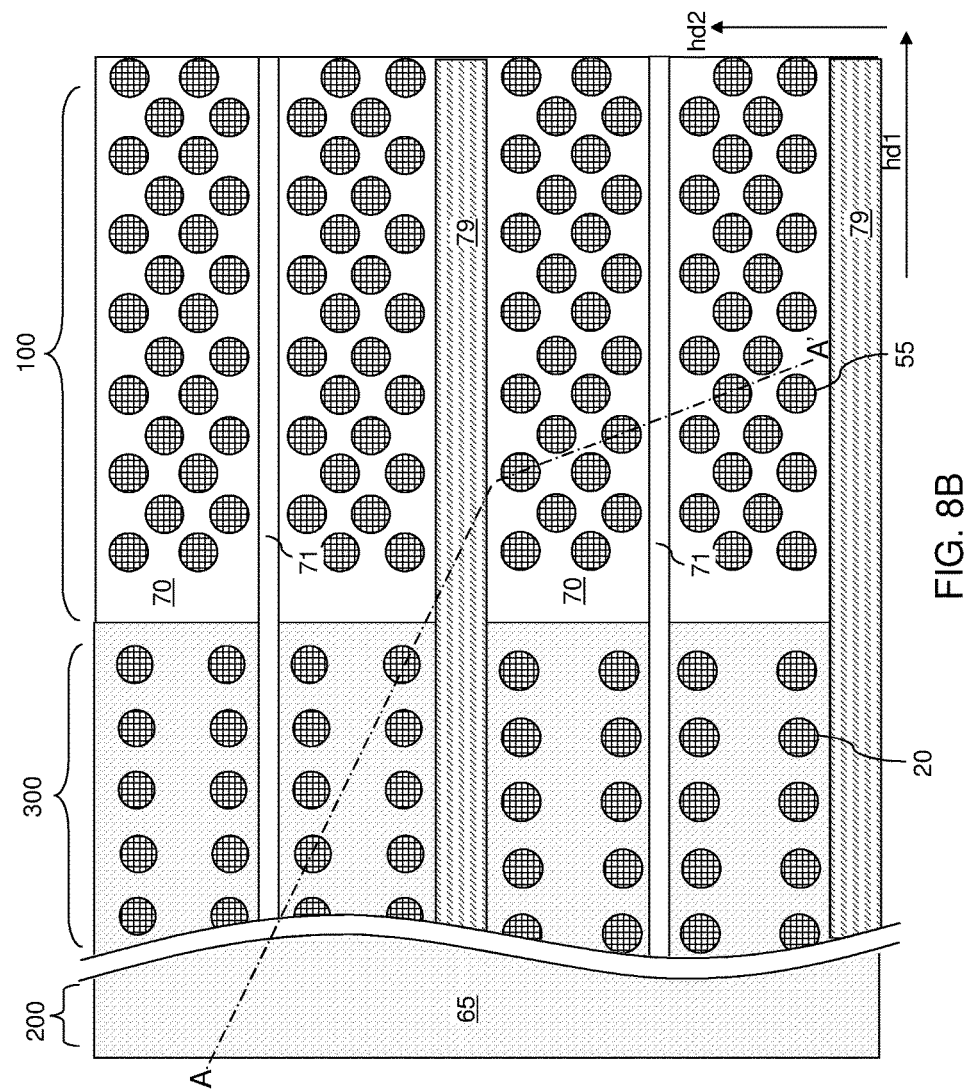
FIG. 8B is a top-down view of the first exemplary structure of FIG. 8A. The vertical plane A-A' is the plane of the schematic vertical cross-sectional view of FIG. 8A.

Referring to FIGS. 8A and 8B, the photoresist layer can be removed, for example, by ashing. The backside trenches 79 can extend along the first horizontal direction hd1, which is parallel to the lengthwise direction of the isolation trenches 71. Each backside trench 79 can be located between isolation trenches 71, and each isolation trench 71 can be located between backside trenches 79.

Figure 9:
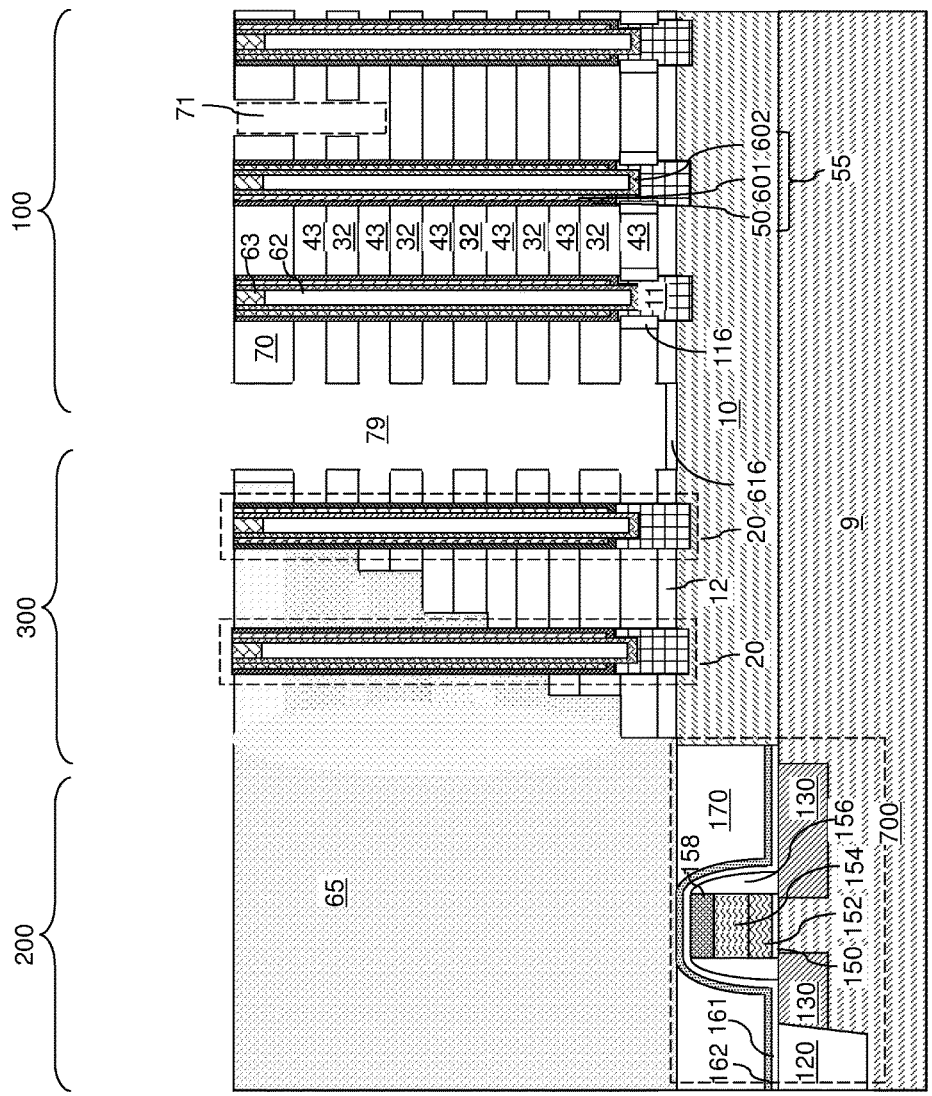
FIG. 9 is a schematic vertical cross-sectional view of the first exemplary structure after formation of backside recesses according to the first embodiment of the present disclosure.

Referring to FIGS. 9 and 10A, an etchant that selectively etches the second material of the sacrificial material layers 42 with respect to the first material of the insulating layers 32 can be introduced into the backside trenches 79, for example, employing an etch process. FIG. 10A illustrates a region of the exemplary structure of FIG. 9. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50 and the dielectric layer stacks 50'. In one embodiment, the sacrificial material layers 42 can include silicon nitride, and the materials of the insulating layers 32, the support pillar structure 20, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32 and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the gate dielectric layer 12, i.e., to avoid physical exposure of the top surface of the semiconductor material layer 10.

The etch process that removes the second material selective to the first material and the outermost layer of the memory films 50 and the dielectric layer stacks 50' can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 10B, a backside blocking dielectric layer 44 can be optionally formed. FIG. 10B shows a region below the top surface of the insulating cap layer 70, and thus, the portion of the blocking dielectric layer 44 above the top surface of the insulating cap layer 70 is not shown. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer.

Referring to FIG. 10C, a metallic liner layer 46A can be deposited in the backside recesses. FIG. 10C shows a region below the top surface of the insulating cap layer 70, and thus, structures above the top surface of the insulating cap layer 70 are not shown. In one embodiment, the metallic liner layer 46A includes an electrically conductive metallic material that can function as a diffusion barrier layer and/or adhesion promotion layer for a metallic fill material to be subsequently deposited. The metallic liner layer 46A can include a conductive metallic nitride material such as TiN, TaN, WN, or a stack thereof, or can include a conductive metallic carbide material such as TiC, TaC, WC, or a stack thereof. In one embodiment, the metallic liner layer 46A can be deposited by a conformal deposition process such as chemical vapor deposition (CVD) or atomic layer deposition (ALD). The thickness of the metallic liner layer 46A can be in a range from 2 nm to 8 nm, such as from 3 nm to 6 nm, although lesser and greater thicknesses can also be employed. In one embodiment, the metallic liner layer 46A can consist essentially of a conductive metal nitride such as TiN.

Figure 10E:
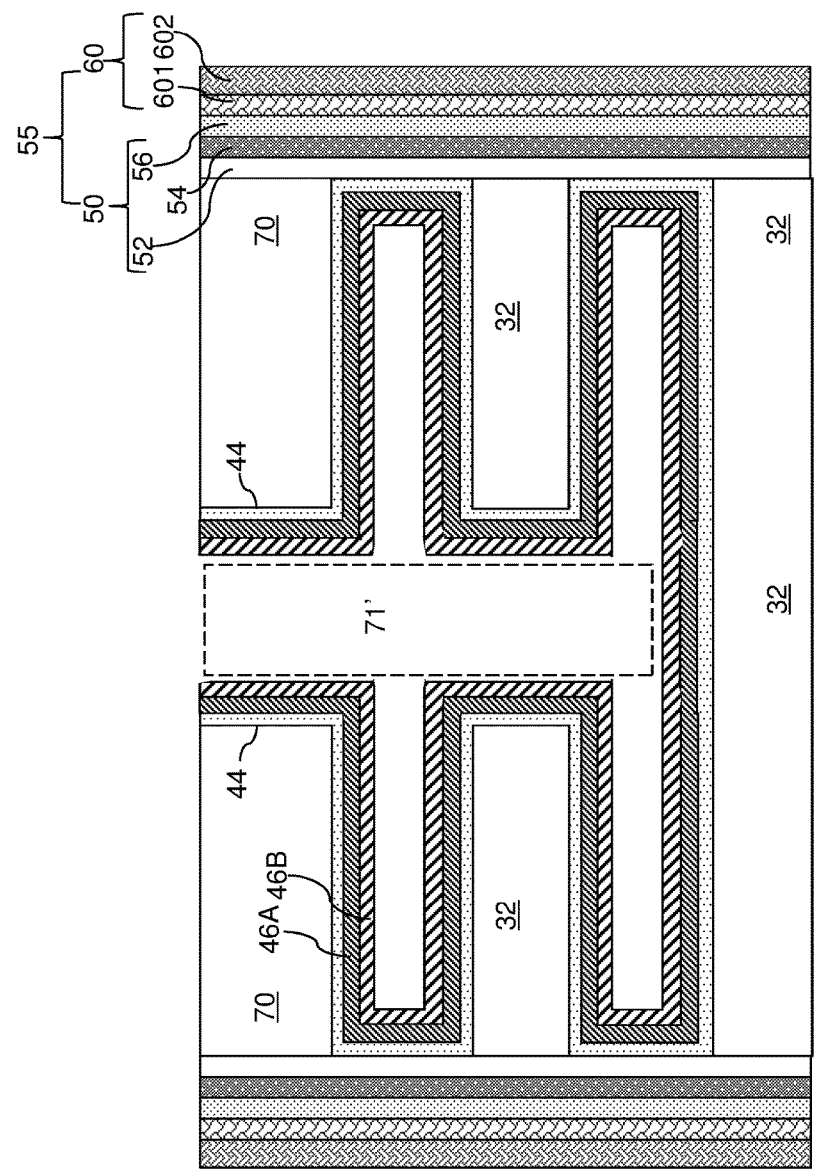
FIG. 10E is a vertical cross-sectional view of an isolation trench at the processing step of FIG. 10D.

Referring to FIGS. 10D and 10E, a metallic fill material layer 46B can be deposited in the plurality of backside recesses 43, on the sidewalls of the at least one the backside trench 79, and over the top surface of the insulating cap layer 70. FIG. 10D shows a region around a backside trench 79 below the top surface of the insulating cap layer 70, and thus, structures above the top surface of the insulating cap layer 70 are not shown. FIG. 10E shows a region around the isolation trench 71 below the top surface of the insulating cap layer 70, and thus, structures above the top surface of the insulating cap layer 70 are not shown. The metallic fill material layer 46B can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic liner layer 46A, which can be a metallic barrier layer that blocks diffusion of fluorine atoms therethrough. The thickness of the metallic fill material layer 46B can be in a range from 2 nm to 8 nm, such as from 3 nm to 6 nm, although lesser and greater thicknesses can also be employed.

The thicknesses of the metallic liner layer 46A and the metallic fill material layer 46B can be selected such that each backside recess 43 and isolation trench 71 is not completely filled with the metallic liner layer 46A and the metallic fill material layer 46B. For example, a drain select level cavity 71' is present within each isolation trench 71.

Figure 11B:
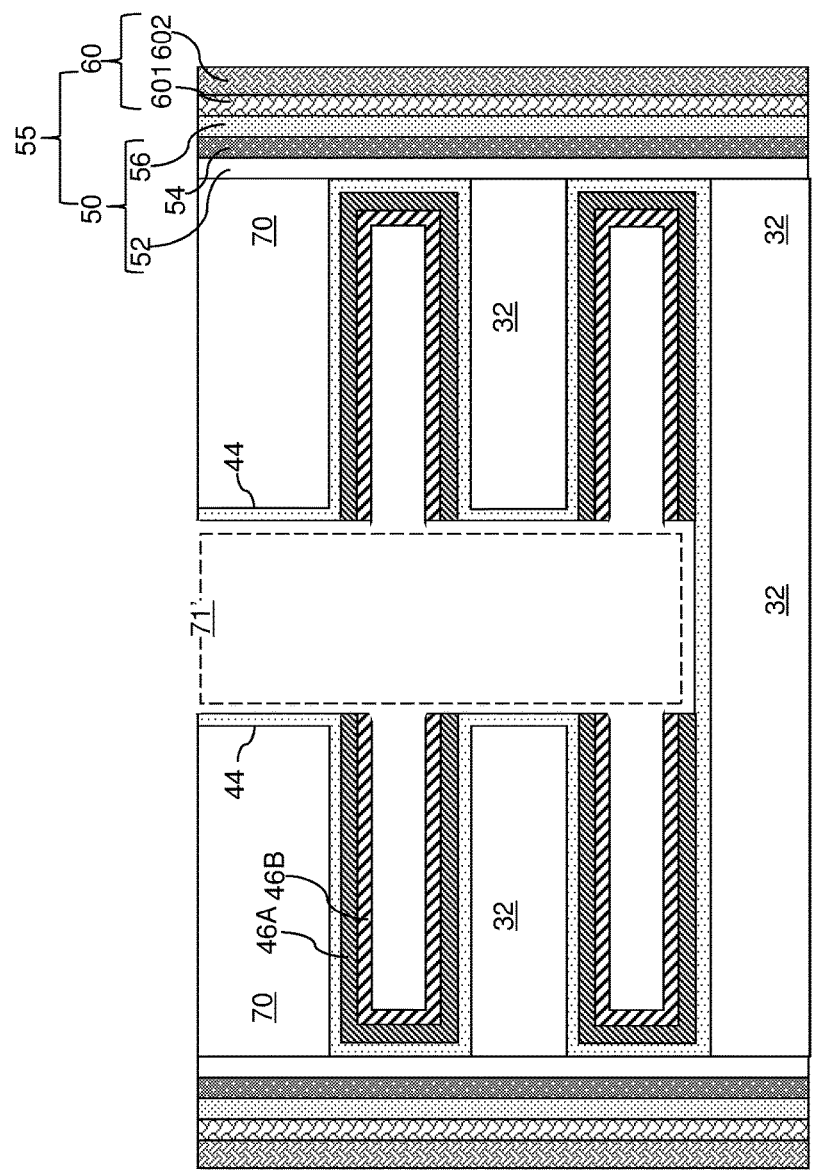
FIG. 11B is a vertical cross-sectional view of the isolation trench after the anisotropic etch according to the first embodiment of the present disclosure.

Referring to FIGS. 11A and 11B, an anisotropic etch is performed to remove vertical portions of the metallic liner layer 46A and the metallic fill material layer 46B from inside the backside trenches 79 and from inside the isolation trenches 71. The anisotropic etch may be selective to the dielectric material of the insulating cap layer 70 and/or the dielectric materials of the backside blocking dielectric layer 44 and the planar dielectric portions 616.

Figure 12A:
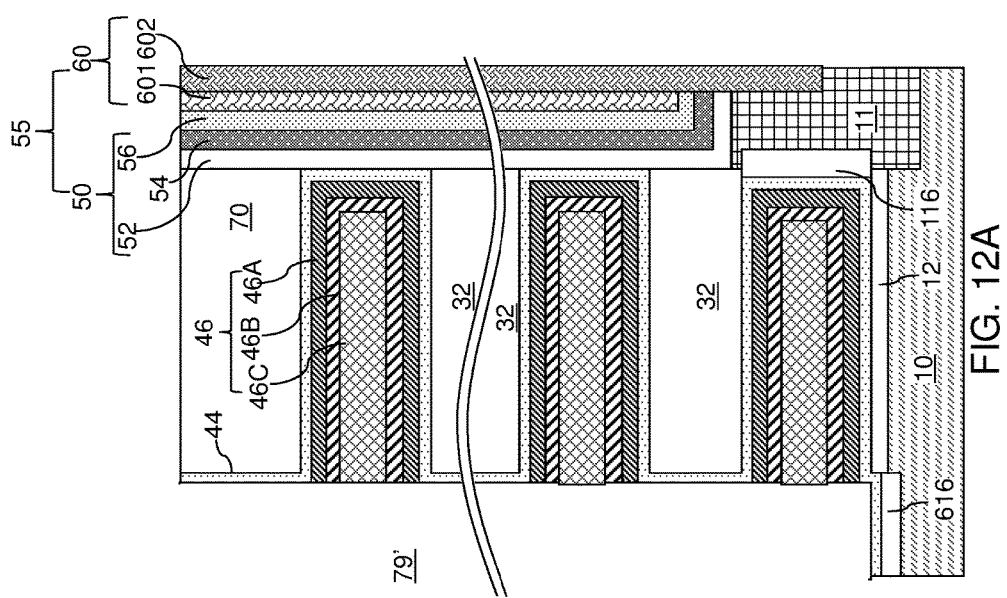
FIG. 12A is a vertical cross-sectional view of the region of the first exemplary structure around the backside trench after formation of electrically conductive layers according to the first embodiment of the present disclosure.
Figure 12B:
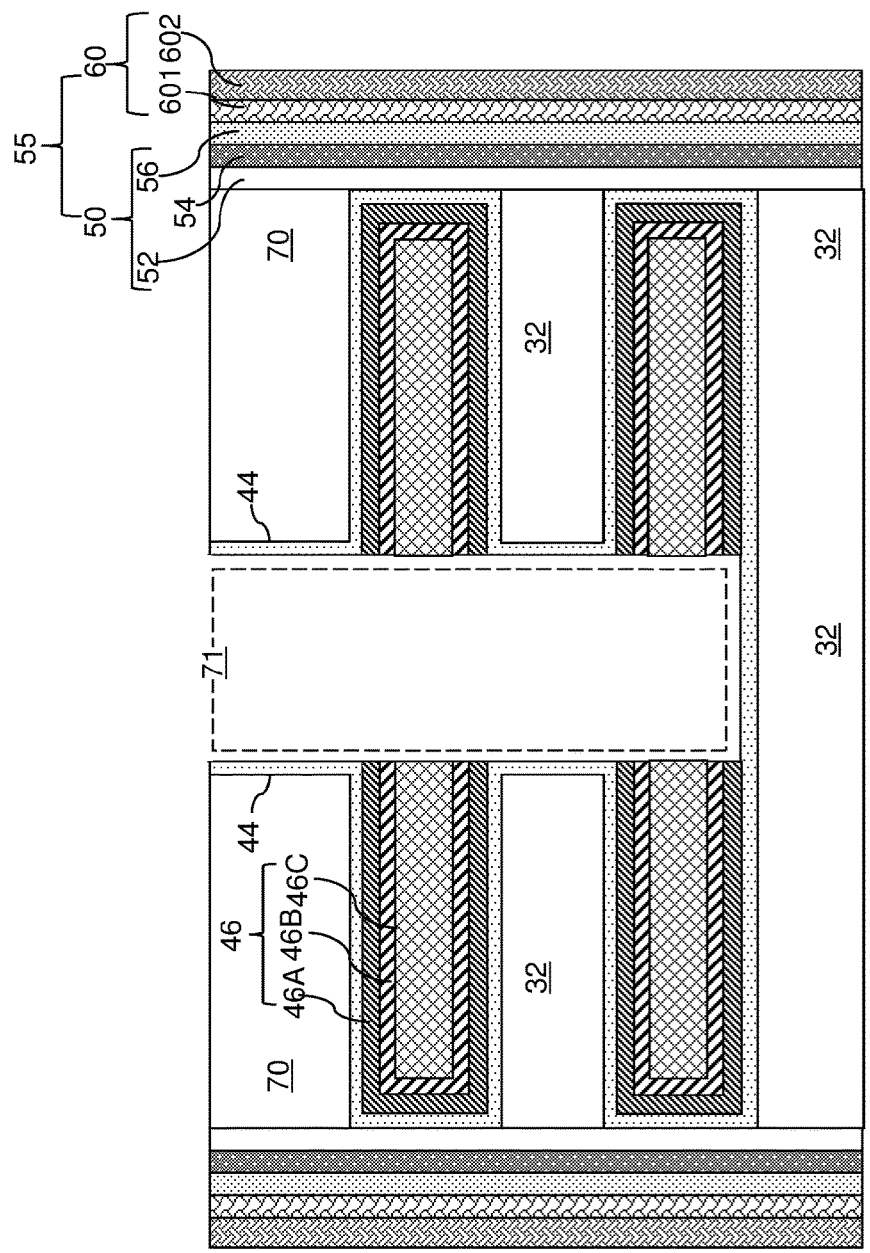
FIG. 12B is a vertical cross-sectional view of the isolation trench after formation of the electrically conductive layers according to the first embodiment of the present disclosure.

Referring to FIGS. 12A and 12B, the processing steps of FIGS. 10D, 10E, 11A and 11B can be repeated at least once to fill the remaining volumes of the backside recesses, while not filling the volumes of the backside trenches 79 and the isolation trenches 71. Specifically, at least one additional metallic fill material layer can be deposited by respective conformal deposition methods in the remaining volumes of the backside recesses 43 and in the backside trenches 79 and the isolation trenches 71 such that the backside recesses 43 are completely filled with the one or more metallic fill material layers deposited through the backside trenches 79 and the isolation trenches 71. The at least one additional metallic fill material layer can include any of the material that can be employed for the metallic fill material layer 46B. An anisotropic etch is performed to remove the portions of the at least one additional metallic fill material layer from the backside trenches 79 and the isolation trenches 71. Each of a plurality of metallic fill material layers that are deposited in the isolation trenches 71 and the backside trenches 79 are subsequently removed from the backside trenches 79 and the isolation trenches 71 by selective anisotropic etching, while the plurality of metallic fill material layers accumulates in the backside recesses 43 to form a metallic fill material portion 46C within each backside recess 43. For example, for tungsten metallic fill material portion 46C, a reactive ion etch using oxygen and a fluorinated gas plasma, such as $SF_6$, $CF_4$, $CBrF_3$ and $CHF_3$ may be used. Each metallic material portion 46C includes an instance of at least one additional metallic fill material layer.

Thus, a metallic fill material portion 46C is formed within each remaining volume of the backside recesses. Each set of a metallic liner layer 46A, a metallic fill material layer 46B, and a metallic fill material portion 46C constitutes an electrically conductive layer 46. A plurality of electrically conductive layers 46 can be formed in the plurality of backside recesses 43. Thus, each sacrificial material layer 42 can be replaced with an electrically conductive layer 46. A backside cavity 79' is present in the portion of each backside trench 79 that is not filled with the backside blocking dielectric layer 44. A tubular dielectric spacer 116 laterally surrounds an epitaxial channel portion 11. A bottommost electrically conductive layer 46 laterally surrounds each tubular dielectric spacer 116 upon formation of the electrically conductive layers 46.

Figure 13A:
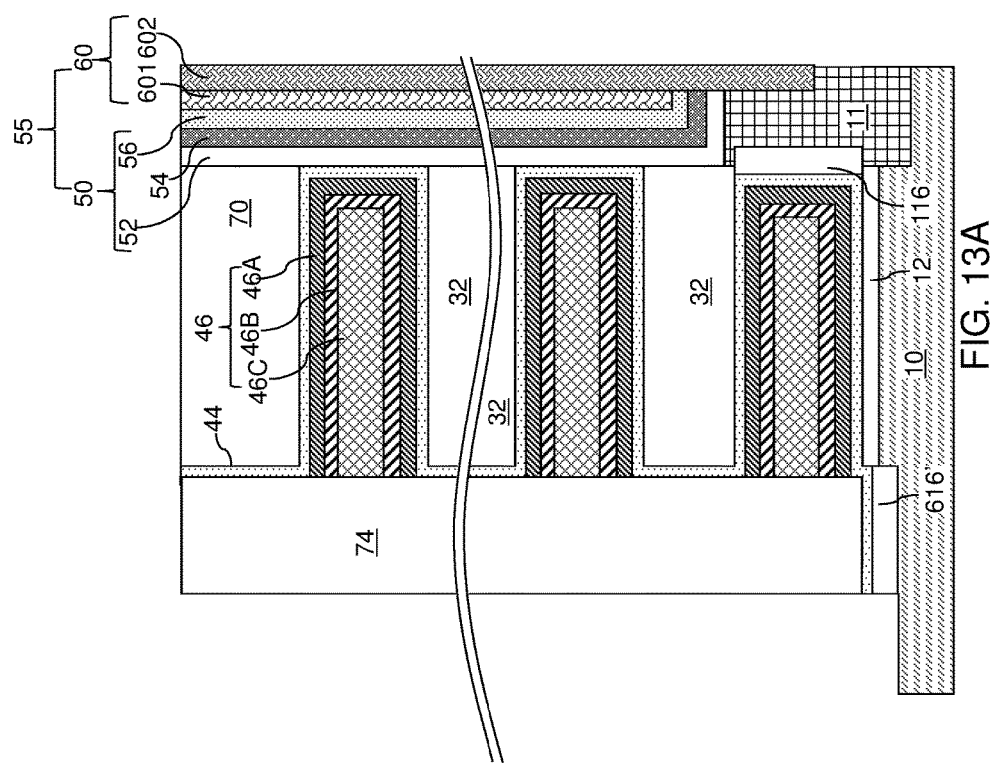
FIG. 13A is a vertical cross-sectional view of the region of the first exemplary structure around the backside trench after formation of an insulating spacer according to the first embodiment of the present disclosure.
Figure 13B:
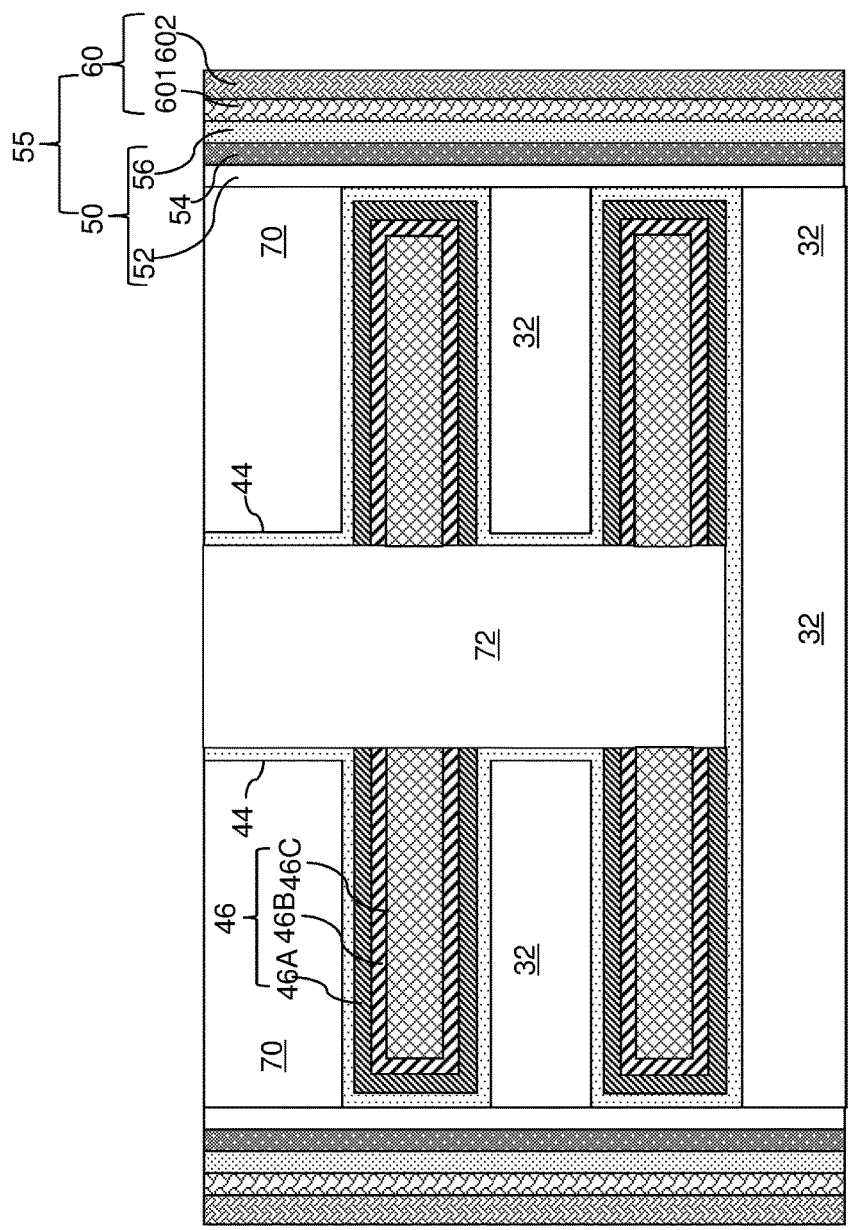
FIG. 13B is a vertical cross-sectional view of the isolation trench after formation of a dielectric isolation structure according to the first embodiment of the present disclosure.
Figure 14:
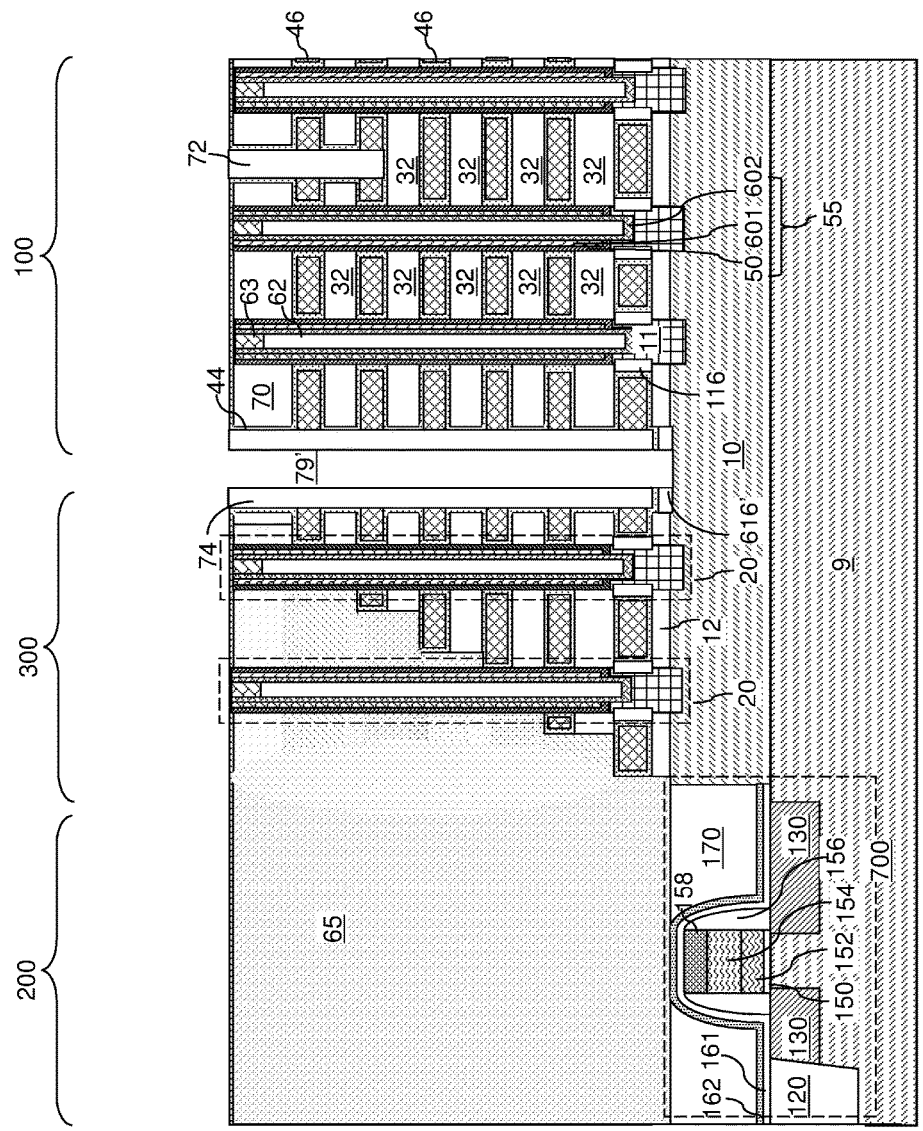
FIG. 14 is a vertical cross-sectional view of the first exemplary structure at the processing steps of FIGS. 13A and 13B.

Referring to FIGS. 13A, 13B, and 14, an insulating material layer can be formed in the backside trench 79 and in the isolation trenches 71 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be greater than one half of the maximum width of the isolation trenches 71. In this case, the isolation trenches 71 can be completely filled with the insulating material layer, while the backside trenches 79 are not completely filled with the insulating material layer because the backside trenches 79 are wider than the isolation trenches 71. For example, the thickness of the insulating material layer can be in a range from 16 nm to 100 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46. An anisotropic etch is performed to remove horizontal portions of the insulating material layer from above the insulating cap layer 70 and at the bottom of each backside trench 79. Each remaining portion of the insulating material layer in the backside trenches 79 constitutes an insulating spacer 74. A backside cavity 79' is present within a volume surrounded by each insulating spacer 74. Each portion of the insulating material layer in the isolation trenches 71 constitutes a dielectric isolation structure 72. The a dielectric isolation structure 72 may be slightly recessed in the isolation trench 71 during the etching of the insulating spacer 74.

The first example structure includes a layer stack, which includes the insulating cap layer 70 and an alternating stack of insulating layers 32 and electrically conductive layers 46. The dielectric isolation structures 72 are formed through a set of layers within the layer stack. Specifically, the set of layers within the layer stack that the dielectric isolation structures 72 extend through includes the insulating cap layer 70, a set of at least one electrically conductive layers 46 including the topmost electrically conductive layer 46 and located at drain select levels, and any insulating layer 32 above a bottommost electrically conductive layer 46 located at the bottommost drain select level in case more than two electrically conductive layers 46 are located at the drain select levels.

Figure 15:
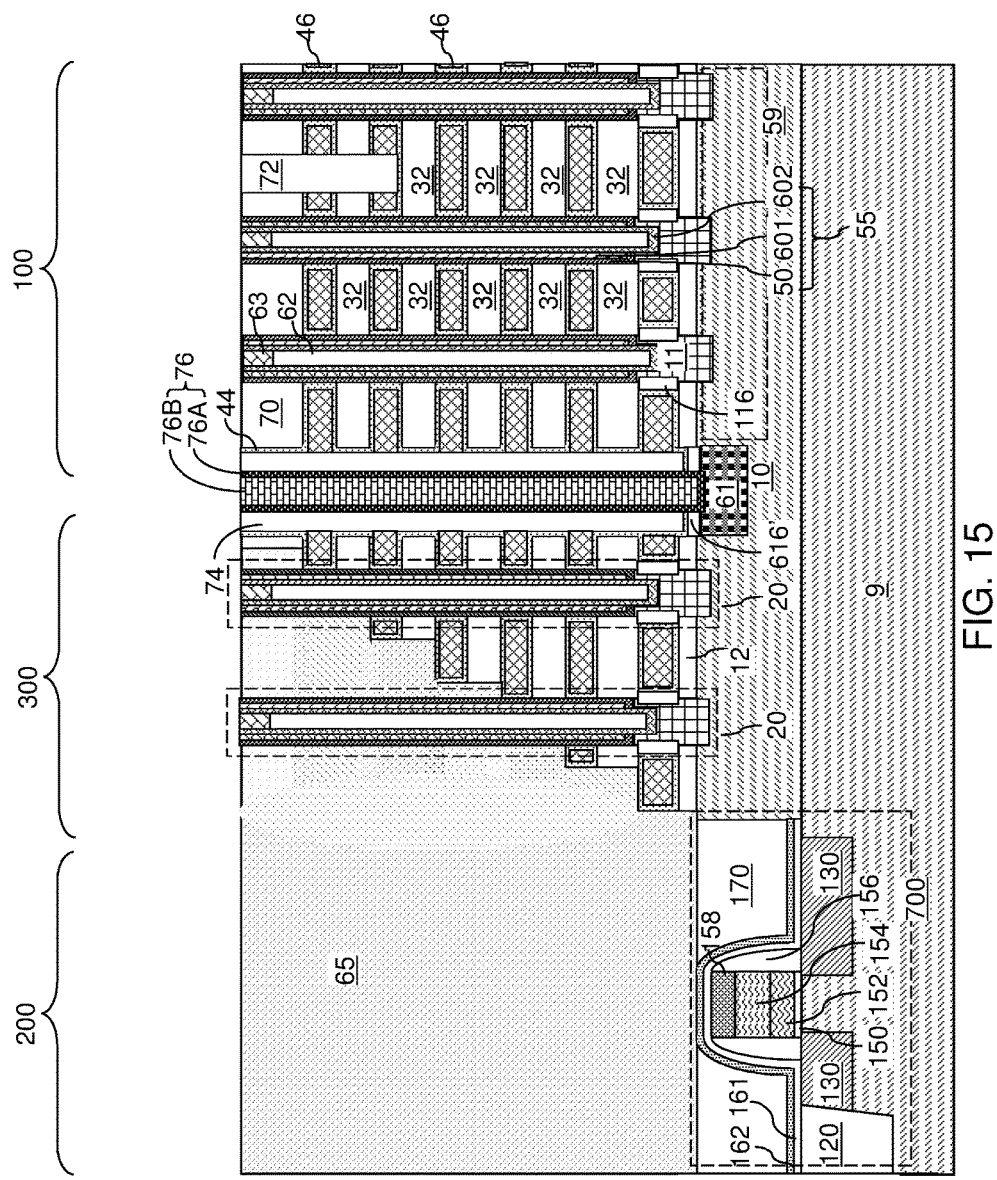
FIG. 15 is a schematic vertical cross-sectional view of the first exemplary structure after formation of backside contact structures according to the first embodiment of the present disclosure.

Referring to FIG. 15, a source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial channel portions 11 constitutes a horizontal semiconductor channel 59 for a plurality of field effect transistors. The horizontal semiconductor channel 59 is connected to multiple vertical semiconductor channels 60 through respective epitaxial channel portions 11. The horizontal semiconductor channel 59 contacts the source region 61 and the plurality of epitaxial channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A contact via structure 76 can be formed within each cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the insulating cap layer 70 overlying the alternating stack (32, 46) as a stopping layer. If chemical mechanical planarization (CMP) process is employed, the insulating cap layer 70 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 16A:
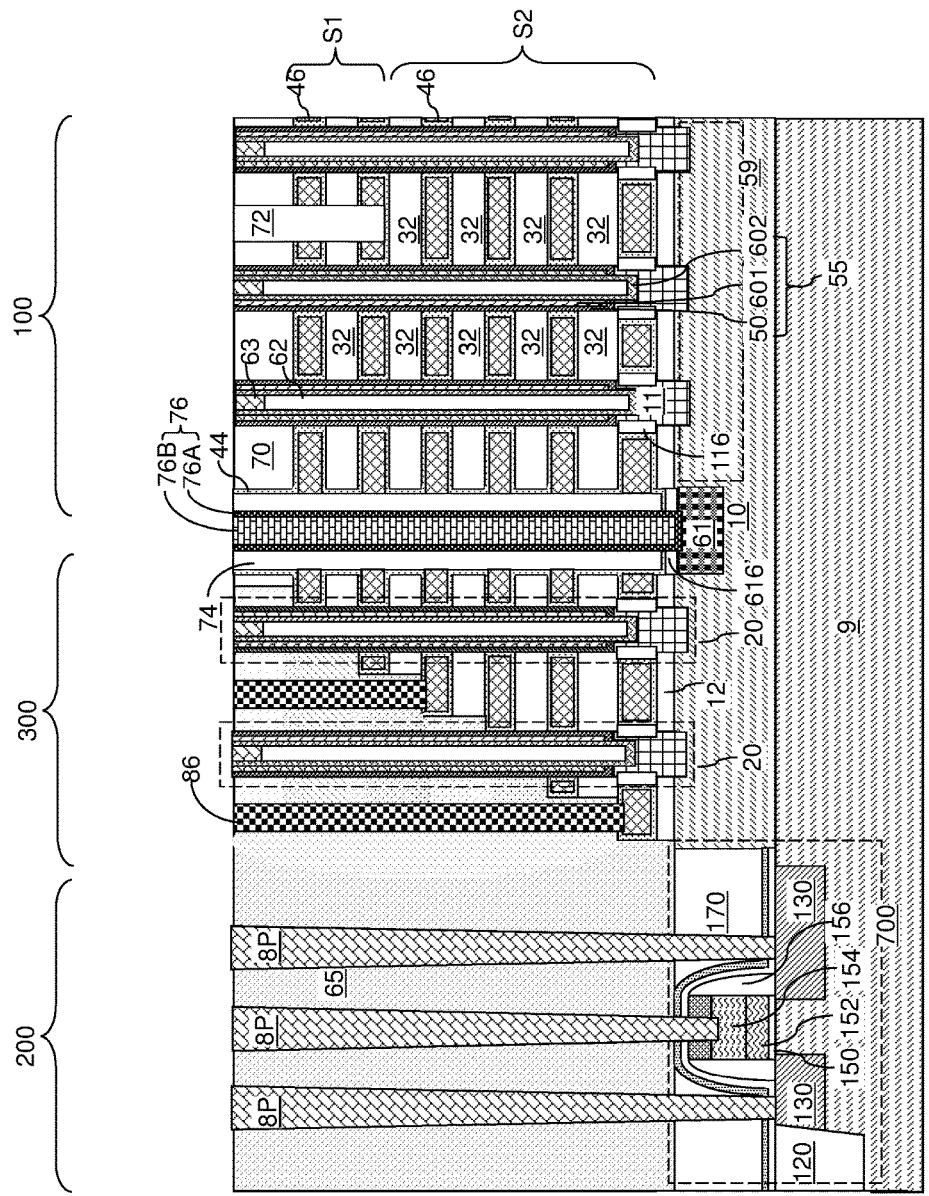
FIG. 16A is a schematic vertical cross-sectional view of the first exemplary structure after formation of additional contact via structures according to the first embodiment of the present disclosure.
Figure 16B:
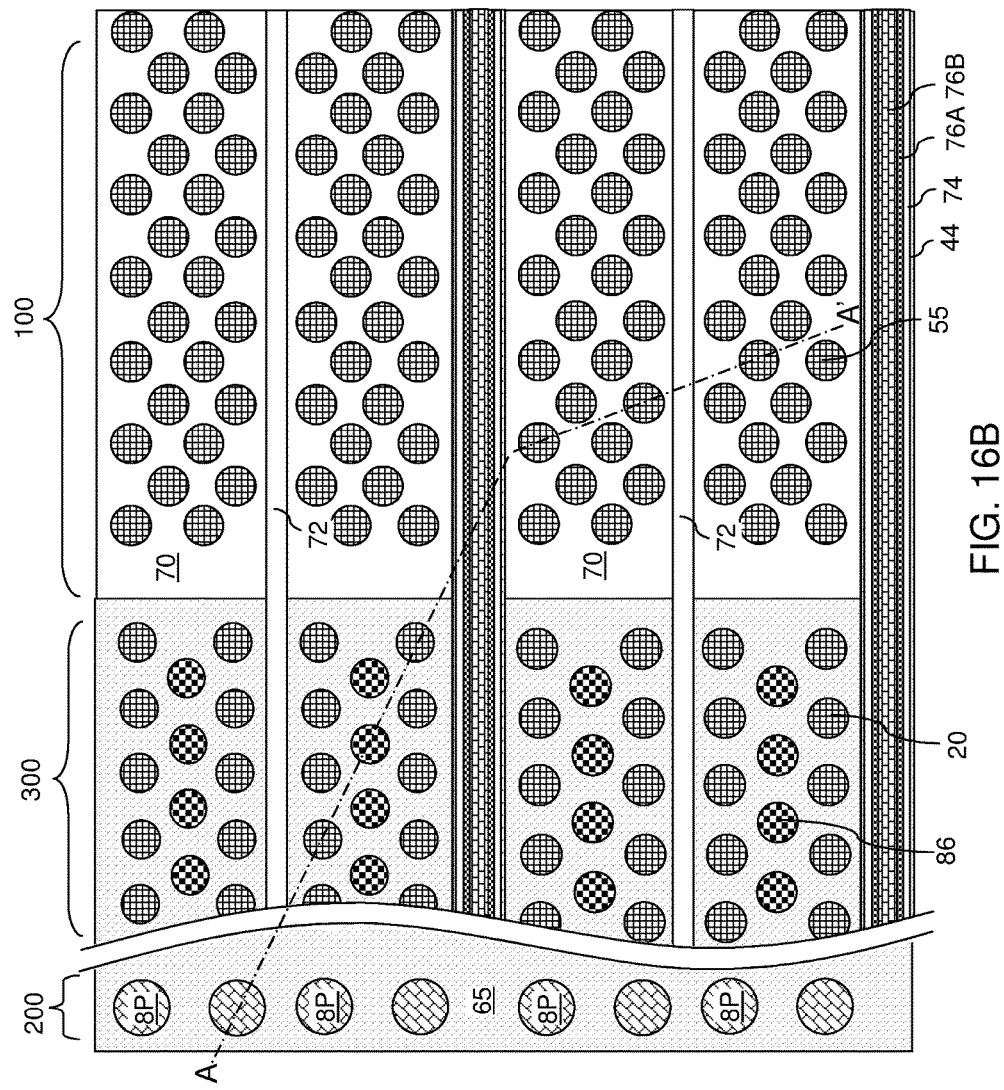
FIG. 16B is a top-down view of the first exemplary structure of FIG. 16A. The vertical plane A-A' is the plane of the schematic vertical cross-sectional view of FIG. 16A.

Referring to FIGS. 16A and 16B, additional contact via structures (86, 8P) can be formed through the insulating cap layer 70, and optionally through the retro-stepped dielectric material portion 65. Word line contact via structures 86 can be formed on the electrically conductive layers 46 through the insulating cap layer 70, and through the retro-stepped dielectric material portion 65. Peripheral device contact via structures 8P can be formed through the retro-stepped dielectric material portion 65 directly on respective nodes of the peripheral devices. Additional drain contact via structures and bit lines (not shown) in electrical contact with the drain regions 63 may be formed in the same or a subsequent step.

Referring collectively to FIGS. 13B, 16A and 16B, the first exemplary structure includes a three-dimensional memory device. The three-dimensional memory device can include: an alternating stack (32, 46) of insulating layers 32 and electrically conductive layers 46 located over a substrate (9, 10); memory stack structures 55 extending through the alternating stack (32, 46), wherein each of the memory stack structures 55 comprises a memory film 50 and a vertical semiconductor channel 60 contacting an inner sidewall of the memory film 50; and a dielectric isolation structure 72 extending through a first subset S1 of layers in the drain select level within the alternating stack (32, 46) that is less than an entirety of the alternating stack (32, 46). The first subset S1 of layers within the alternating stack (32, 46) is located in an upper portion of the alternating stack (32, 46). Each electrically conductive layer 46 within the first subset S1 of layers comprises a drain select gate of the three-dimensional memory device (e.g., vertical NAND string). Each drain select gate can include an instance of a metallic liner layer 46A and an instance of at least one metallic fill material layer (46B, 46C) that physically contacts sidewalls of the dielectric isolation structures 72 as illustrated in FIG. 13B. A second subset S2 of layers that is a complementary subset of the first subset S1 of layers underlies the first subset S1 below the drain select level. The bottom surface of each layer within second subset S2 of layers is located below a horizontal plane including the bottom surfaces of the dielectric isolation structure 72. Each electrically conductive layer 46 within the second subset S2 comprises either a word line (e.g., control gate) or a source select gate (SGS) of the three-dimensional memory device (e.g., vertical NAND string). The source select gates are located below the word lines in the alternating stack (32, 46). Each word line or source select gate within the second subset S2 can include a respective instance of the metallic liner layer 46 and a respective instance of the at least one metallic fill material layer (46B, 46C).

In one embodiment, the at least one metallic fill material layer (46B, 46C) comprises a plurality of metallic fill material layers (46B, 46C) having a thickness less than one half of a width of the dielectric isolation structure 72. In one embodiment, the metallic liner layer 46A comprises a conductive metallic nitride material, and each of the at least one metallic fill material layer (46B, 46C) comprises a material selected from tungsten, cobalt, ruthenium, molybdenum, and copper.

In one embodiment, the three-dimensional memory device further comprises a backside blocking dielectric layer 44 that contacts outer sidewalls of the memory stack structures 55 and is located between each vertically neighboring pair of an insulating layer 32 and an electrically conductive layer 46 within the alternating stack (32, 46). The dielectric isolation structure 72 can be laterally isolated from each insulating layer 32 among the first subset S1 of layers in the drain select level by the backside blocking dielectric layers 44 as illustrated in FIG. 13B.

Figure 17A:
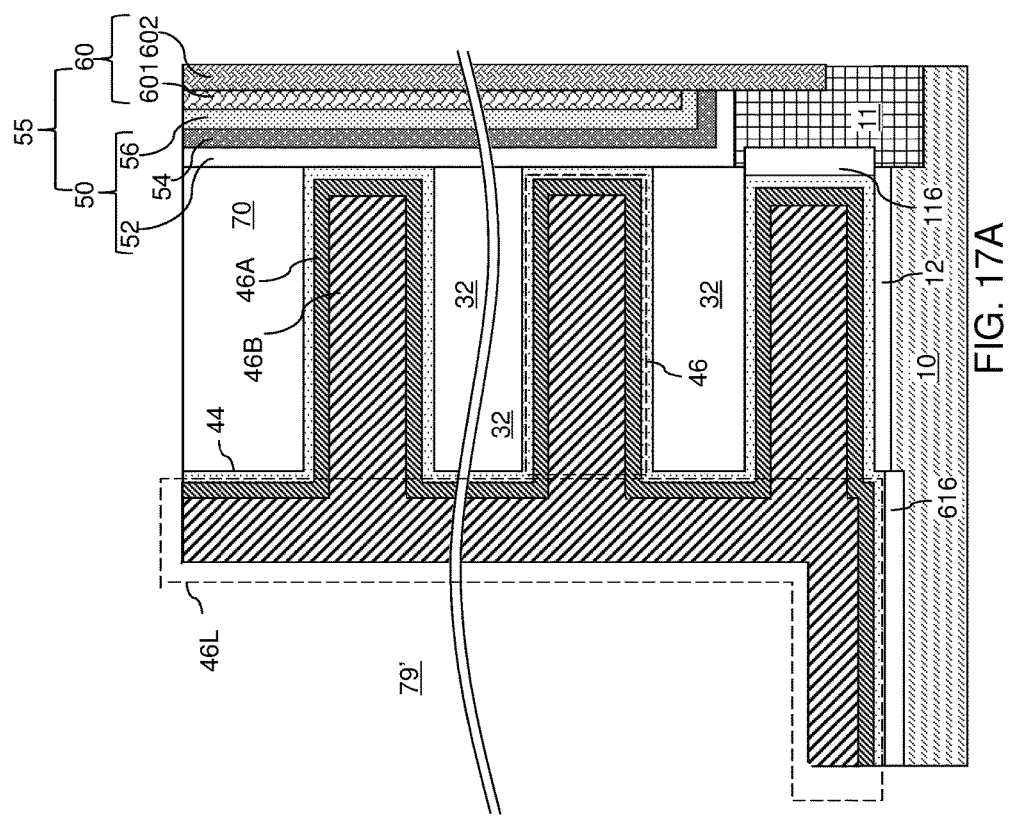
FIG. 17A is a vertical cross-sectional view of the region of a second exemplary structure around the backside trench after formation of electrically conductive layers according to a second embodiment of the present disclosure.
Figure 17B:
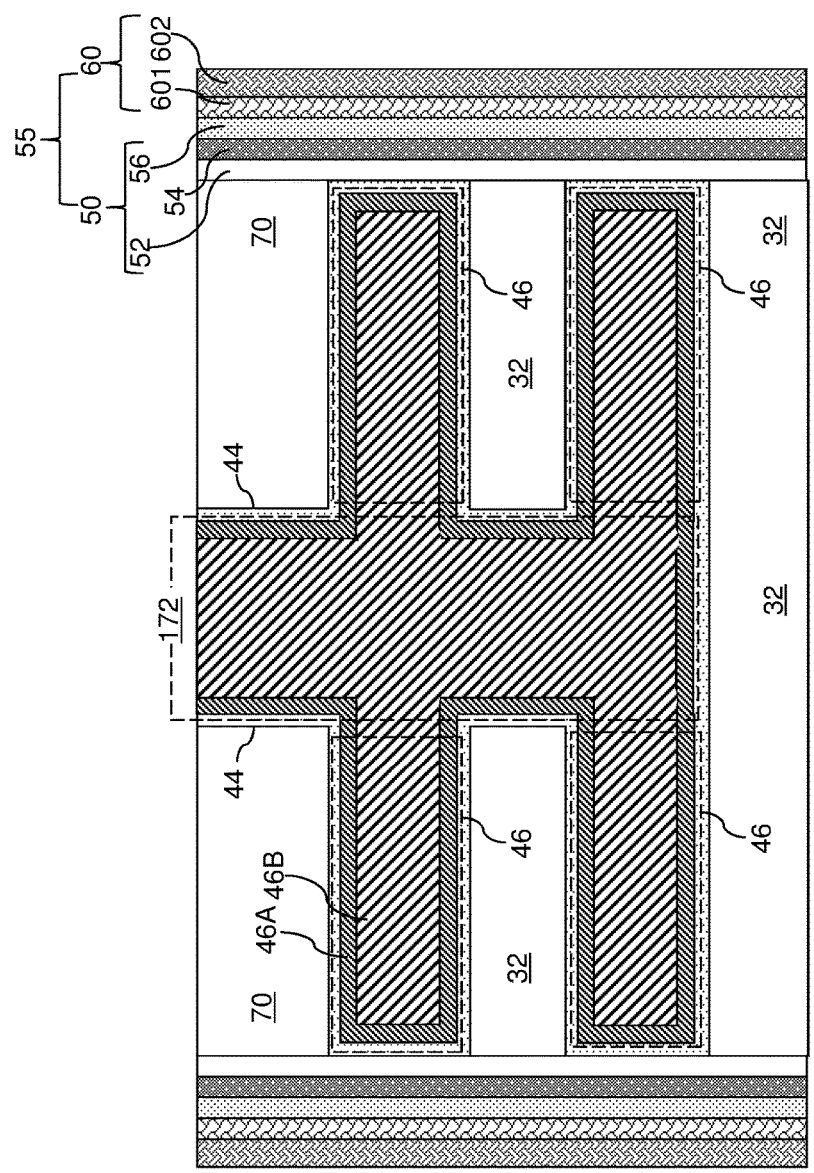
FIG. 17B is a vertical cross-sectional view of a region of an isolation trench after formation of the electrically conductive layers according to the second embodiment of the present disclosure.
Figure 18:
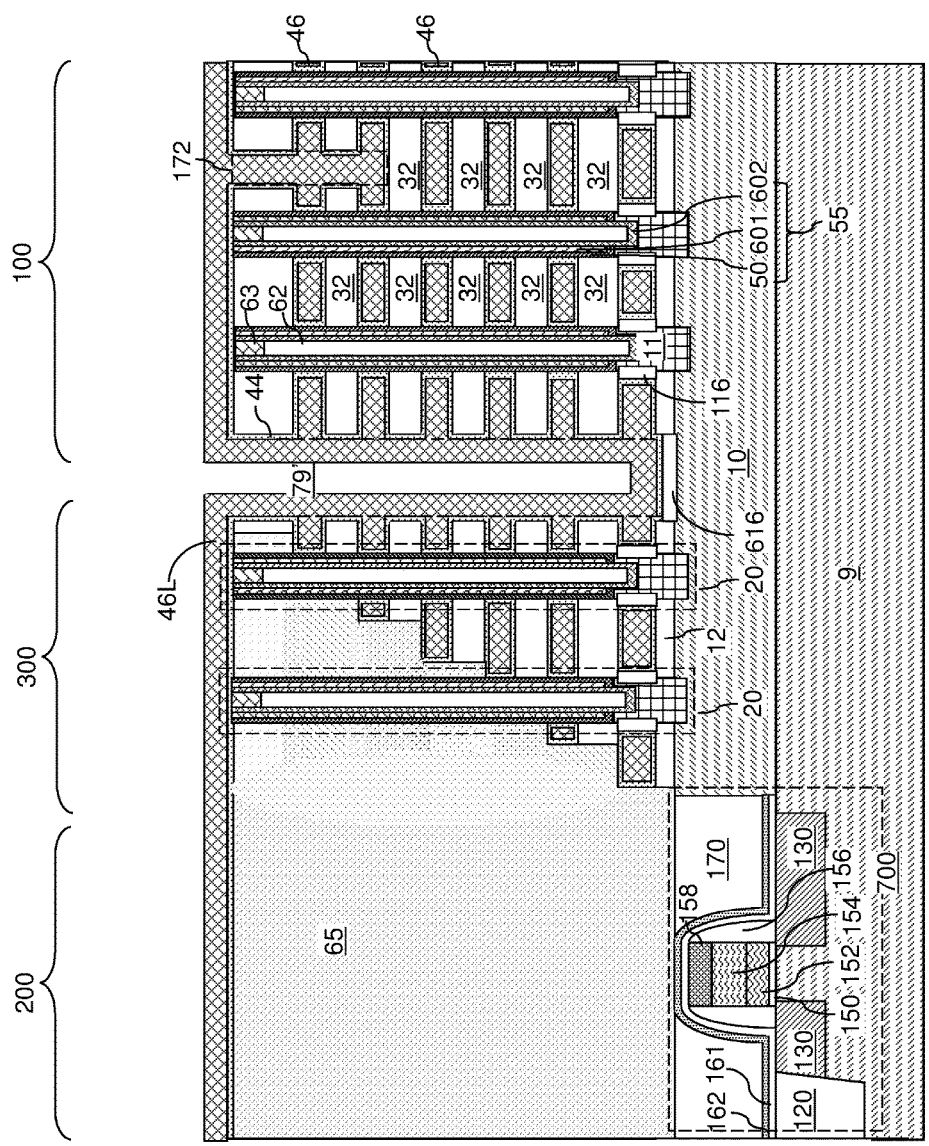
FIG. 18 is a vertical cross-sectional view of the second exemplary structure at the processing steps of FIGS. 17A and 17B.

Referring to FIGS. 17A, 17B, and 18, a second exemplary structure according to a second embodiment of the present disclosure can be derived from the first exemplary structure of FIGS. 9 and 10A by sequentially performing the processing steps of FIGS. 10B and 10C, and by performing the processing steps of FIGS. 10D and 10E with modification to the thickness of the metallic fill material layer 46B. Specifically, the thickness of the metallic fill material layer 46B is increases such that the metallic fill material layer 46B completely fills each backside recess 43 and isolation trench 71. Each portion of the metallic liner layer 46A and the metallic fill material layer 46B filling a backside recess 43 constitutes an electrically conductive layer 46. Each portion of the metallic liner layer 46A and the metallic fill material layer 46B filling an isolation trench 71 constitutes a conductive fill structure 172.

A continuous metallic material layer 46L can be formed on the sidewalls of each backside trench 79 and over the insulating cap layer 70. The continuous metallic material layer 46L completely fills the isolation trench 71 but does not completely fill each backside trench 79 because the backside trench 79 is wider than the isolation trench 71. Each electrically conductive layer 46 includes a portion of the metallic barrier layer 46A and a portion of the metallic fill material layer 46B that are located between a vertically neighboring pair of dielectric material layers, which can be a pair of insulating layers 32, a bottommost insulating layer and a gate dielectric layer 12, or a topmost insulating layer and the insulating cap layer 70. The continuous metallic material layer 46L includes a continuous portion of the metallic barrier layer 46A and a continuous portion of the metallic fill material layer 46B that are located in the backside trenches 79 or above the insulating cap layer 70.

Each sacrificial material layer 42 can be replaced with an electrically conductive layer 46. A backside cavity 79' is present in the portion of each backside trench 79 that is not filled with the backside blocking dielectric layer and the continuous metallic material layer 46L. A tubular dielectric spacer 116 laterally surrounds an epitaxial channel portion 11. A bottommost electrically conductive layer 46 laterally surrounds each tubular dielectric spacer 116 upon formation of the electrically conductive layers 46.

Figure 19:
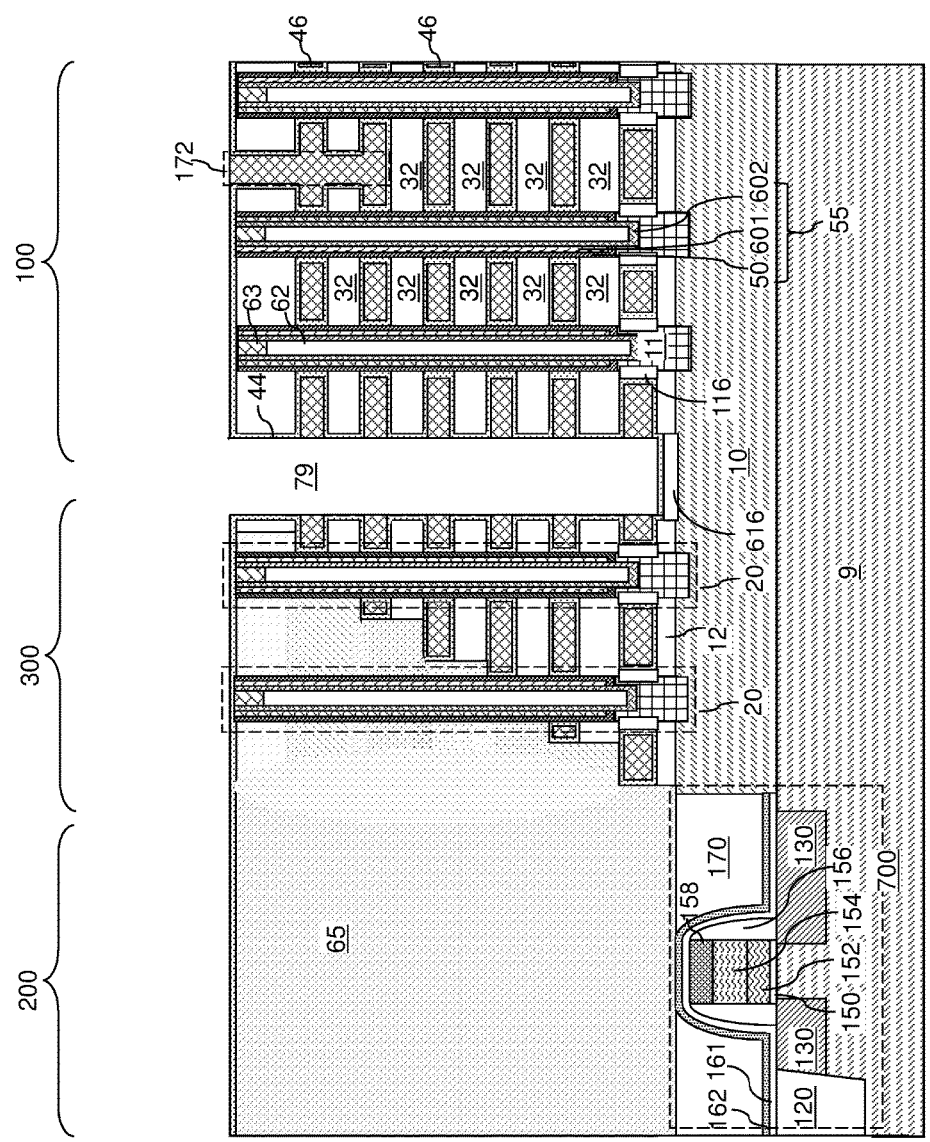
FIG. 19 is a vertical cross-sectional view of the second exemplary structure after removal of conductive fill structures from inside backside trenches according to the second embodiment of the present disclosure.

Referring to FIG. 19, the deposited metallic material of the continuous electrically conductive material layer 46L is etched back from the sidewalls of each backside trench 79 and from above the insulating cap layer 70, for example, by an isotropic wet etch, an anisotropic dry etch, or a combination thereof. Each remaining portion of the deposited metallic material in the backside recesses 43 constitutes an electrically conductive layer 46. Each remaining portion of the deposited metallic material in the isolation trenches 71 constitutes a conductive fill structure 172. The conductive fill structure 172 may be recessed in the isolation trench 71 during the etching step depending on layer thicknesses and etch parameters. Thus, the sacrificial material layers 42 are replaced with the electrically conductive layers 46.

Each electrically conductive layer 46 below the conductive fill structure 172 can function as either a source select gate or a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Each electrically conductive layer 46 located at the same vertical level as the conductive fill structure 172 comprises a drain select gate.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. The gate dielectric layer 12 can be vertically spaced from the backside trench 79 by the horizontal portion of the backside blocking dielectric layer 44.

In another embodiment, the removal of the continuous electrically conductive material layer 46L may not be selective to the material of the backside blocking dielectric layer 44 or, the backside blocking dielectric layer 44 may not be employed. In this case, a top surface and/or sidewall surface, of the gate dielectric layer 12 can be physically exposed at the bottom of the backside trench 79 depending on whether the gate dielectric layer 12 is not removed or partially removed during removal of the continuous electrically conductive material layer 46L. In one embodiment, a top surface of the cap gate dielectric layer 616 can be physically exposed at the bottom of the backside trench 79 after removal of the continuous electrically conductive material layer 46L. A backside cavity 79' is present within each backside trench 79.

Figure 20:
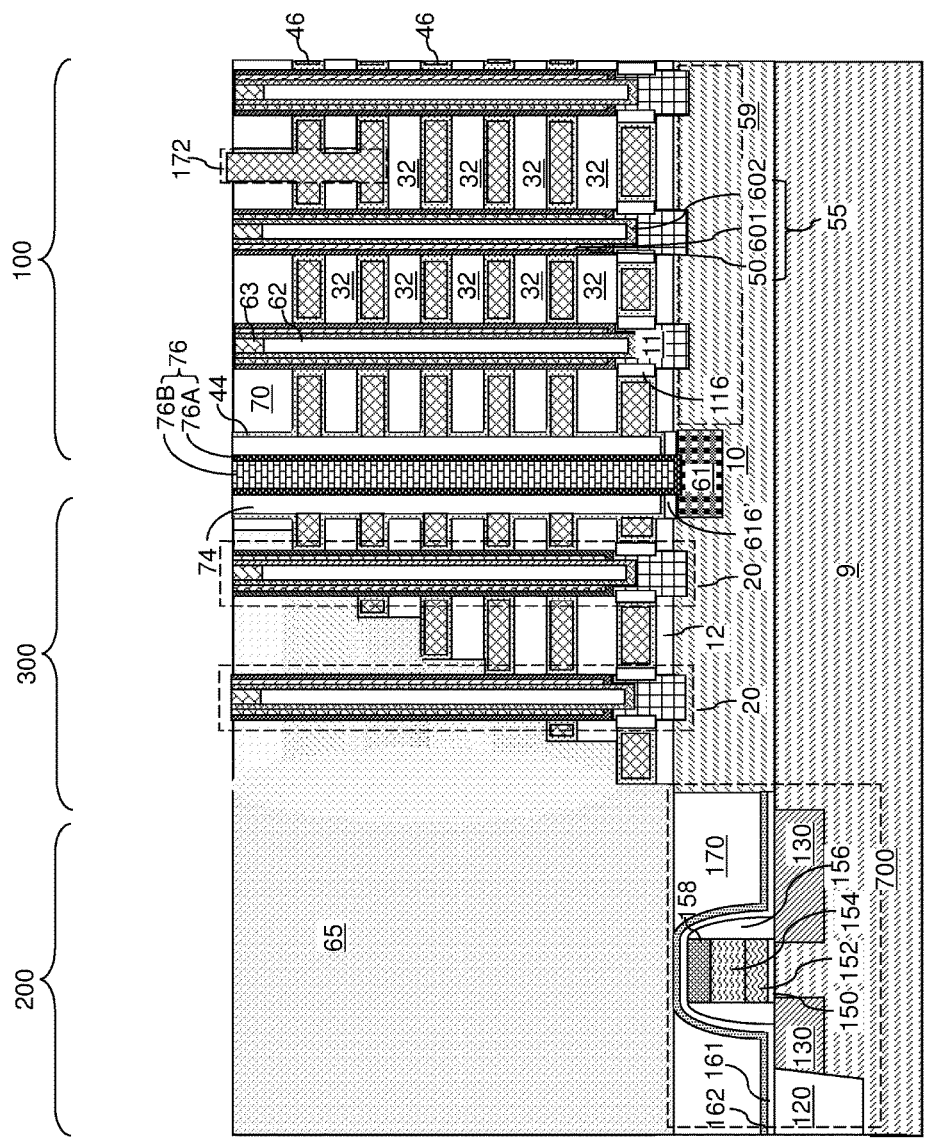
FIG. 20 is a schematic vertical cross-sectional view of the second exemplary structure after formation of backside contact structures according to the second embodiment of the present disclosure.

Referring to FIG. 20, an insulating material layer can be formed in the at least one backside trench 79 and over the insulating cap layer 70 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the insulating cap layer 70 and at the bottom of each backside trench 79. Each remaining portion of the insulating material layer constitutes an insulating spacer 74. A backside cavity 79' (shown in FIG. 10B) is present within a volume surrounded by each insulating spacer 74.

The anisotropic etch process can continue with, or without, a change in the etch chemistry to remove portions of the optional backside blocking dielectric layer 44 and the planar dielectric portion 616 that underlies the opening through the insulating spacer 74. An opening is formed though the planar dielectric portion 616 underneath each backside cavity 79', thereby vertically extending the backside cavity 79'. A top surface of the semiconductor material layer 10 can be physically exposed at the bottom of each backside trench 79. The remaining portion of each planar dielectric portion 616 is herein referred to as an annular dielectric portion 616', which can include a dielectric oxide of the semiconductor material of the semiconductor material layer 10, have a uniform thickness, and an opening therethrough.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial channel portions 11 constitutes a horizontal semiconductor channel 59 for a plurality of field effect transistors. The horizontal semiconductor channel 59 is connected to multiple vertical semiconductor channels 60 through respective epitaxial channel portions 11. The horizontal semiconductor channel 59 contacts the source region 61 and the plurality of epitaxial channel portions 11. One or more bottommost electrically conductive layers 46 provided upon formation of the electrically conductive layers 46 within the alternating stack (32, 46) can comprise source select gate electrode(s) for the three-dimensional memory device. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A contact via structure 76 can be formed within each cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the insulating cap layer 70 overlying the alternating stack (32, 46) as a stopping layer. If chemical mechanical planarization (CMP) process is employed, the insulating cap layer 70 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 21:
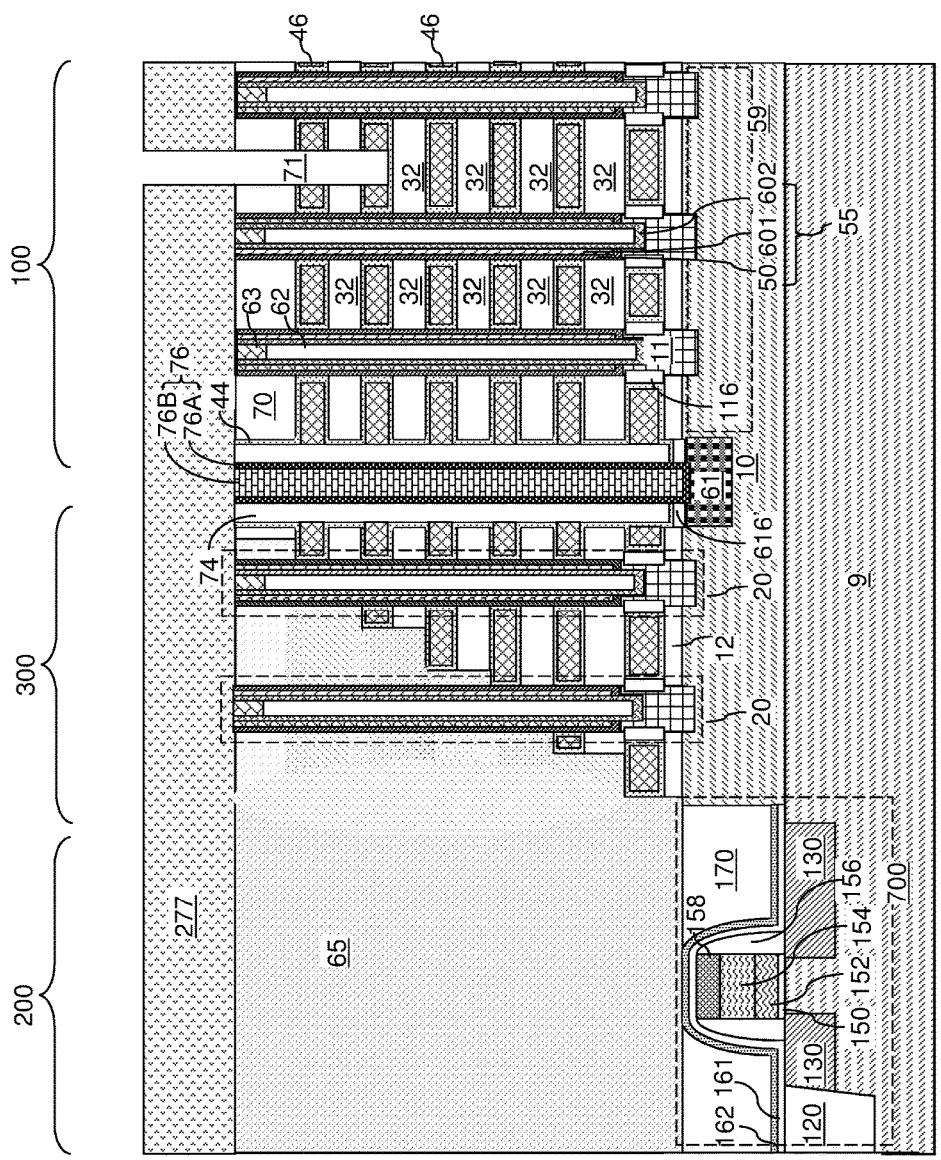
FIG. 21 is a schematic vertical cross-sectional view of the second exemplary structure after removal of conductive fill structures from the isolation trenches according to the second embodiment of the present disclosure.

Referring to FIG. 21, a photoresist layer 277 can be applied over the insulating cap layer 70 and the retro-stepped dielectric material portion 65, and can be lithographically patterned to form openings in areas that overlie the conductive fill structures 172. An anisotropic etch process that etches the conductive materials of the conductive fill structures 172 can be performed to remove the conductive fill structures 172. The anisotropic etch process may, or may not, be selective to the dielectric materials of the insulating cap layer 70 and the insulating layers 32. The conductive fill structures 172 are removed from the isolation trenches 71. For example, if the conductive fill structures 172 comprise tungsten, then a reactive ion etch including oxygen and fluorinated gas plasma can be used to remove the conductive fill structures 172 by etching. The photoresist layer 277 can be subsequently removed, for example, by ashing.

Figure 22A:
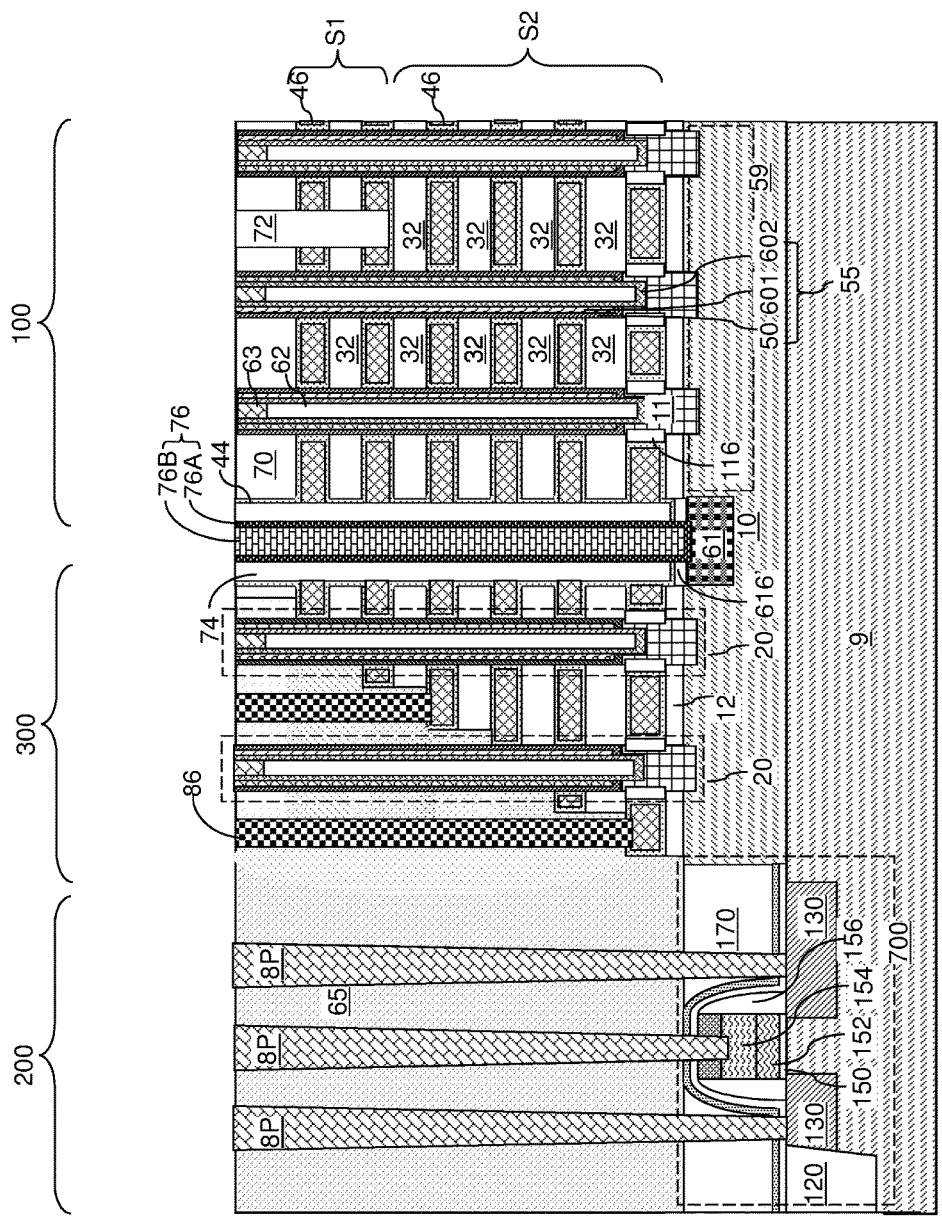
FIG. 22A is a schematic vertical cross-sectional view of the second exemplary structure after formation of dielectric isolation structures and additional contact via structures according to the second embodiment of the present disclosure.
Figure 22B:
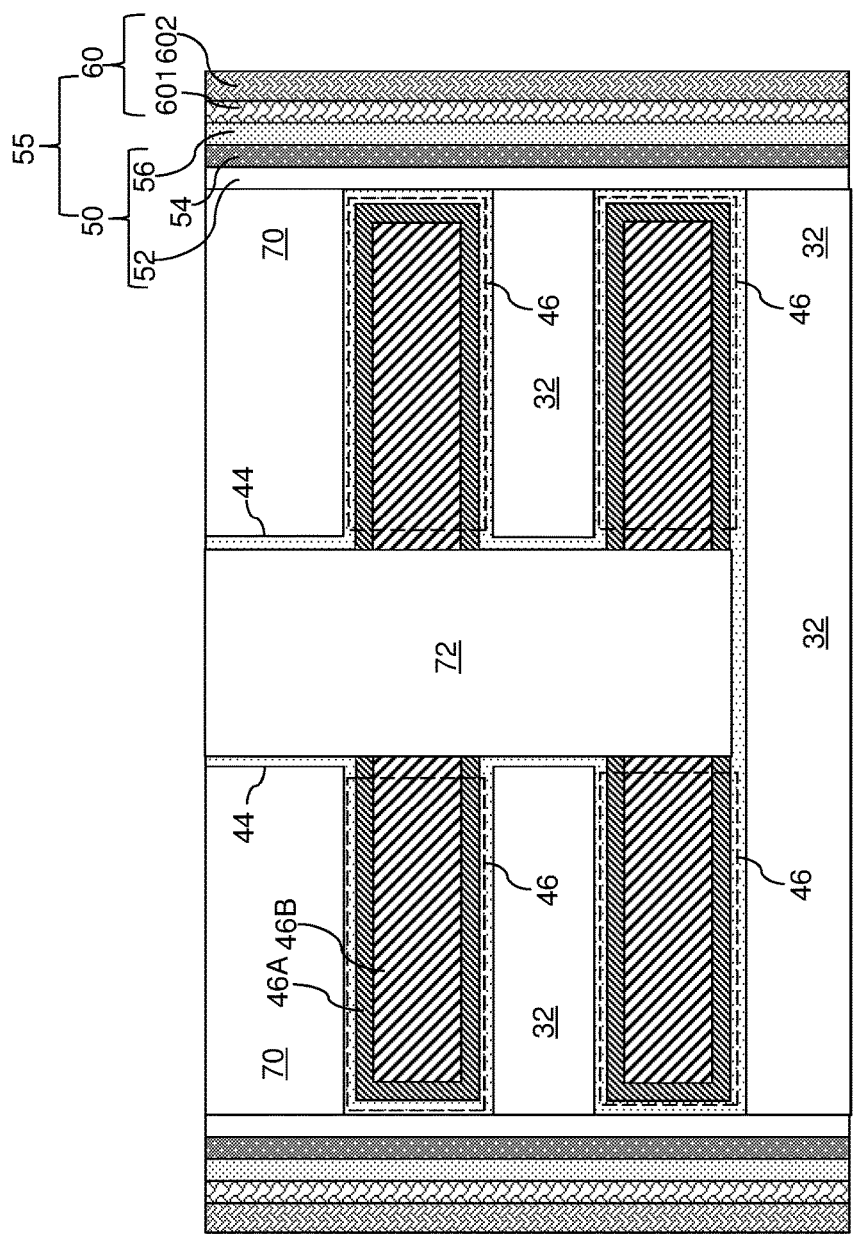
FIG. 22B is a magnified view of a region including a dielectric isolation structure in the second exemplary structure of FIG. 22A.

Referring to FIGS. 22A and 22B, a dielectric material is deposited within each of the isolation trenches 71 to form dielectric isolation structures 72. The dielectric isolation structures 72 include at least one dielectric material such as silicon oxide, silicon nitride, and/or a dielectric metal oxide. Excess portions of the dielectric material above a horizontal plane including the top surface of the insulating cap layer 70 can be removed, for example, by chemical mechanical planarization (CMP).

The processing steps of FIGS. 16A and 16B can be performed prior to, or after, formation of the dielectric isolation structures.

Figure 23:
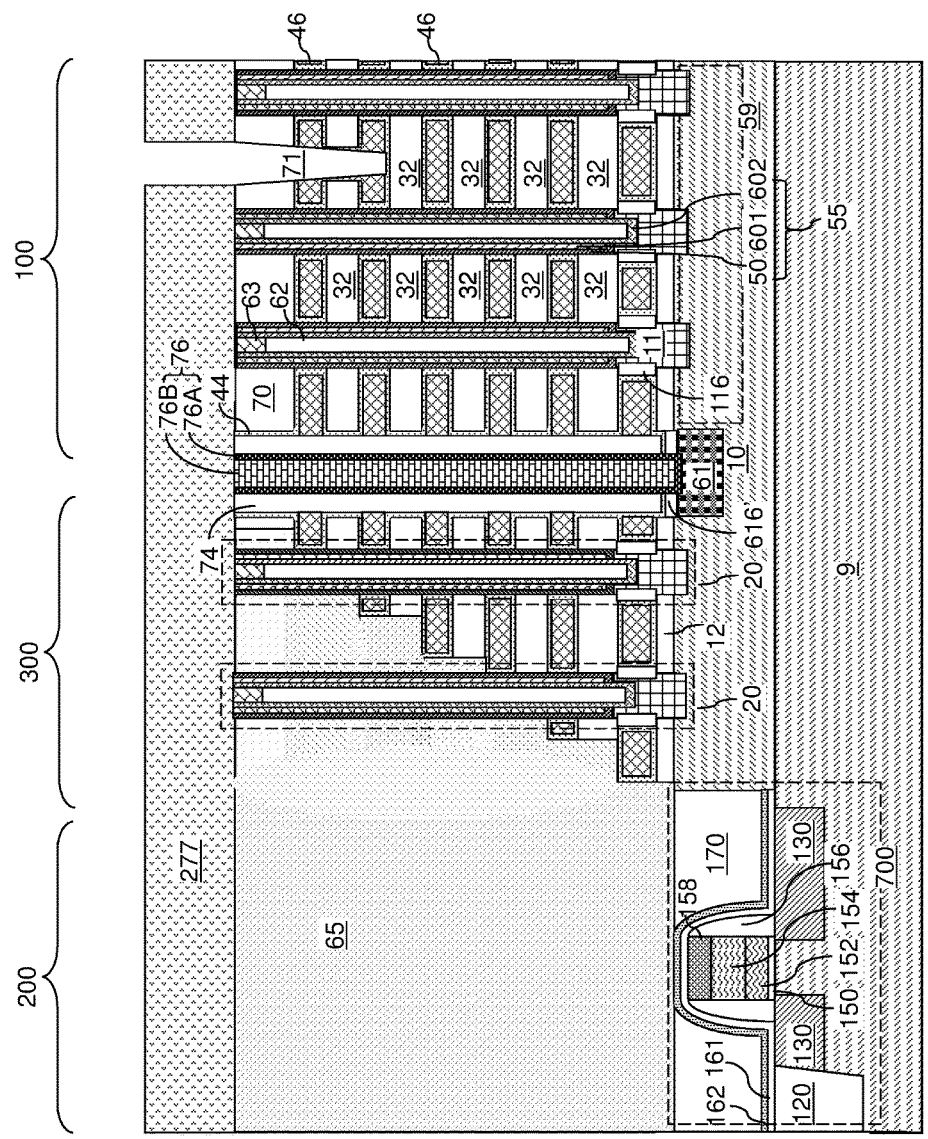
FIG. 23 is a schematic vertical cross-sectional view of an alternate embodiment of the second exemplary structure after removal of conductive fill structures from the isolation trenches according to the second embodiment of the present disclosure.

Referring to FIG. 23, an alternate embodiment of the second exemplary structure is illustrated at the processing steps of FIG. 21. Portions of the metallic fill material layer 46B and the metallic liner layer 46A can be removed from within the isolation trenches 71. In this alternate embodiment, an anisotropic etch can be performed with a non-zero taper angle during removal of the conductive fill structures 172. As a consequence, the isolation trenches 71 can be formed with a non-zero taper angle. In other words, the sidewalls of the isolation trenches 71 can be at a non-zero angle (i.e., a taper angel) with respect to the vertical direction that is perpendicular to the top surface of the substrate (9, 10). The non-zero taper angle can be in a range from 1 degree to 15 degrees, although lesser and greater angles can also be employed. After the anisotropic etch, an isotropic etch may be performed to remove residual portions of the conductive fill structures 172. Isolation trenches 71 having a greater top width than a bottom width can be provided.

Figure 24:
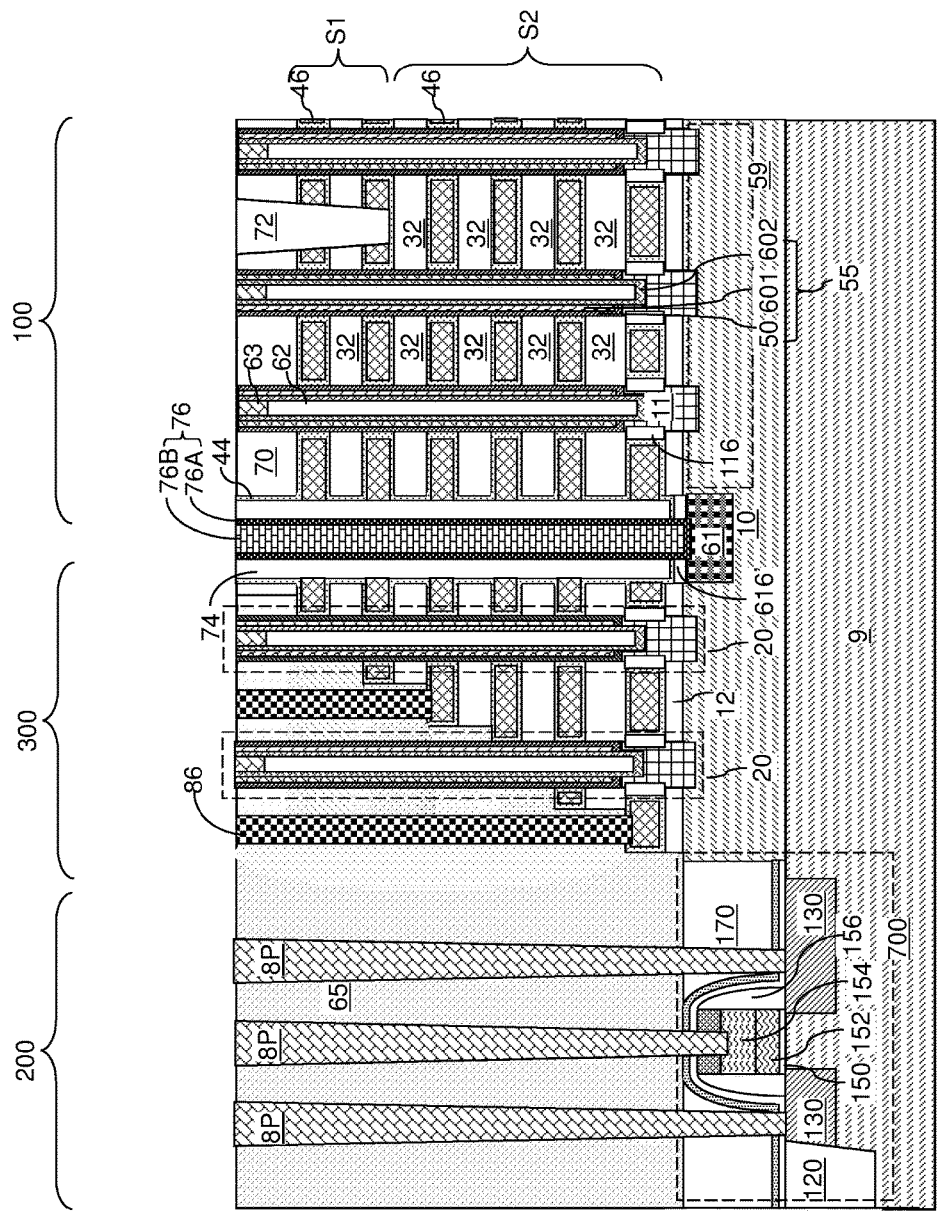
FIG. 24 is a schematic vertical cross-sectional view of the alternate embodiment of the second exemplary structure after formation of dielectric isolation structures and additional contact via structures according to the second embodiment of the present disclosure.

Referring to FIG. 24, the processing steps of FIGS. 22A and 22B can be performed to form dielectric isolation structures 72 and various contact via structures (86, 8P). As in the first embodiment, the dielectric isolation structures 72 are formed in a volume from which portions of the metallic fill material layer 46B and the metallic liner layer 46A are removed.

Referring to FIGS. 22A, 22B, and 24, the second exemplary structure or the alternate embodiment thereof can include a three-dimensional memory device. The three-dimensional memory device can include: an alternating stack of insulating layers 32 and electrically conductive layers 46 located over a substrate (9, 10); memory stack structures 55 extending through the alternating stack (32, 46), wherein each of the memory stack structures 55 comprises a memory film 50 and a vertical semiconductor channel 60 contacting an inner sidewall of the memory film 50; and a dielectric isolation structure 72 extending through a first subset S1 of layers in the drain select level within the alternating stack (32, 46) that is less than an entirety of the alternating stack (32, 46). The first subset S1 of layers within the alternating stack (32, 46) is located in an upper portion of the alternating stack (32, 46); and each electrically conductive layer 46 within the first subset S1 of layers comprises a drain select gate including an instance of a metallic liner layer 46A and an instance of at least one metallic fill material layer 46B that physically contacts sidewalls of the dielectric isolation structures 72.

In one embodiment, a second subset S2 of layers that is a complementary subset of the first subset S1 of layers underlies the first subset S1, and each electrically conductive layer 46 within the second subset S2 comprises a source select gate or a word line containing a respective instance of the metallic liner layer 46A and a respective instance of the at least one metallic fill material layer 46B. In one embodiment, the at least one metallic fill material layer 46B consists of a single metallic fill material layer 46B.

In one embodiment, the three-dimensional memory device further includes a backside blocking dielectric layer 44 that contacts outer sidewalls of the memory stack structures 55 and is located between each vertically neighboring pair of an insulating layer 32 and an electrically conductive layer 46 within the alternating stack (32, 46). The dielectric isolation structure 72 physically contacts a sidewall of each insulating layer 32 among the first subset S1 of layers.

Figure 25:
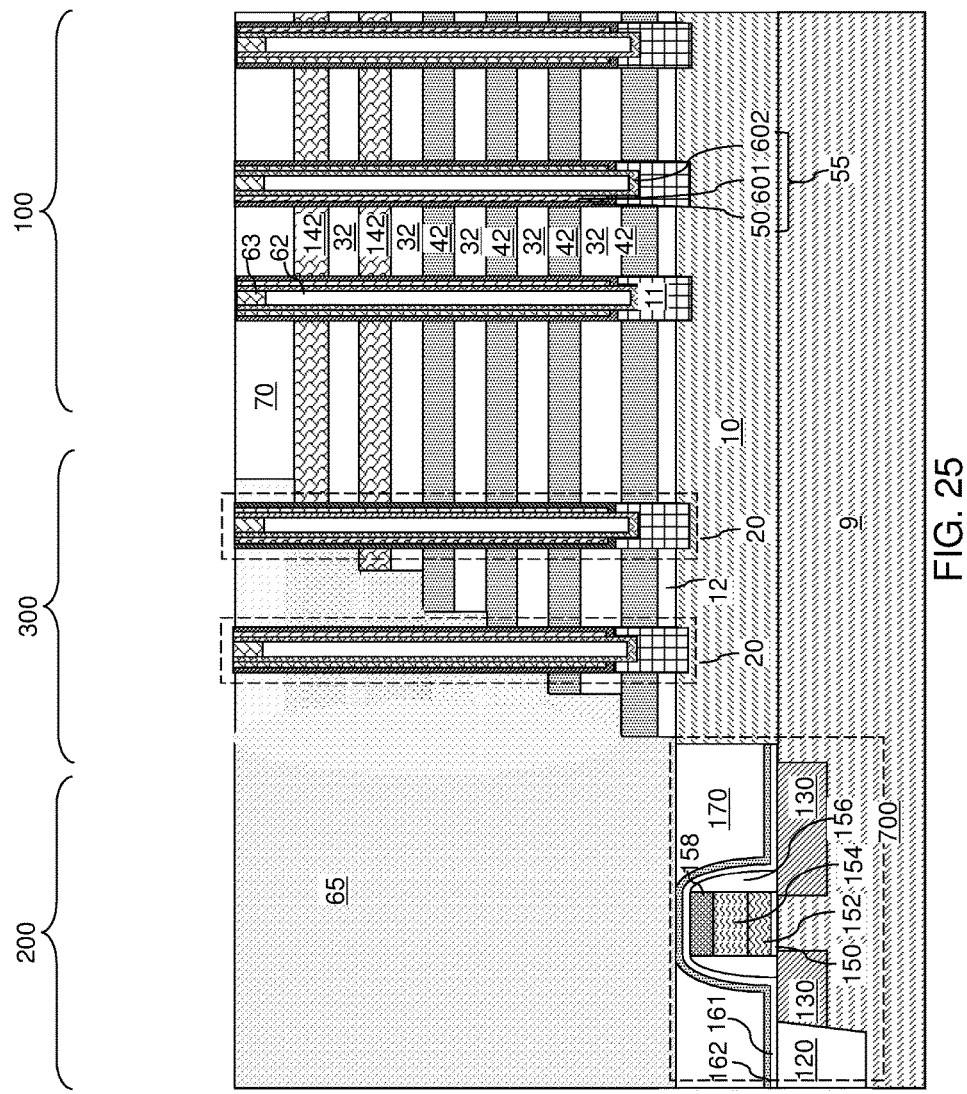
FIG. 25 is a vertical cross-sectional view of a third exemplary structure after formation of memory stack structures and support pillar structures according to a third embodiment of the present disclosure.

Referring to FIG. 25, a third exemplary structure according to a third embodiment of the present disclosure can be derived from the first exemplary structure by forming an alternating stack of insulating layers 32 and sacrificial material layers 42 at the processing steps of FIG. 2, and by forming at least one additional material layer that includes at least one additional sacrificial material layer 142. Subsequently, the insulating cap layer 70 can be formed above the topmost additional sacrificial material layer 142. In case the at least one additional sacrificial material layer 142 includes a plurality of additional sacrificial material layers 142, additional insulating layers 32 can be formed between each vertically neighboring pair of additional sacrificial material layers 142 to form an additional alternating stack (32, 142).

The at least one additional sacrificial material layer 142 includes a material that is different from the material of the sacrificial material layers 42. The material of the sacrificial material layers 42 is selected such that the sacrificial material layers 42 can be subsequently removed selective to the insulating layers 32 and the additional sacrificial material layers 142. The material of the at least one additional sacrificial material layer 142 is selected such that the at least one additional sacrificial material layer 142 can be removed selective to the insulating layers 32 in a subsequent processing step. In an illustrative example, the insulating layers 32 can include silicon oxide, the sacrificial material layers 42 can include silicon nitride, and the at least one additional sacrificial material layer 142 can include a semiconductor material such as silicon (e.g., polysilicon), a silicon-germanium alloy, germanium, a silicon-carbon alloy, or a III-V compound semiconductor material. The at least one sacrificial material layer 142 is formed at drain select gate electrode levels, i.e., at levels at which subsequently formed electrically conductive layers function as drain select gate electrodes for vertical field effect transistors of a three-dimensional memory device. Sacrificial material layers 42 are formed in the stack (32, 42) at the word line and source select gate levels below the stack (32, 142).

Subsequently, the processing steps of FIGS. 3, 4A-4B, and 5A-5H can be sequentially performed to provide the third exemplary structure illustrated in FIG. 25.

Figure 26A:
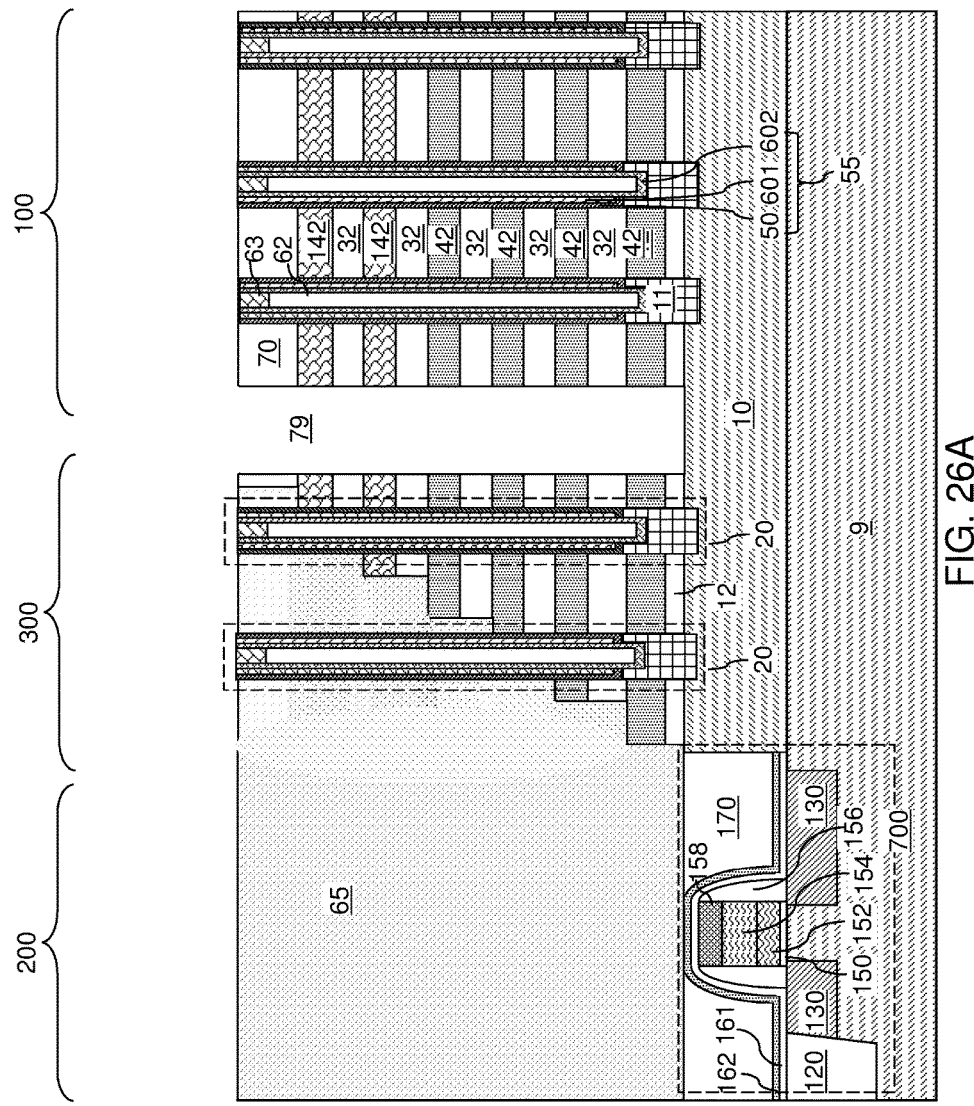
FIG. 26A is a vertical cross-sectional view of the third exemplary structure after formation of backside trenches according to the third embodiment of the present disclosure.
Figure 26B:
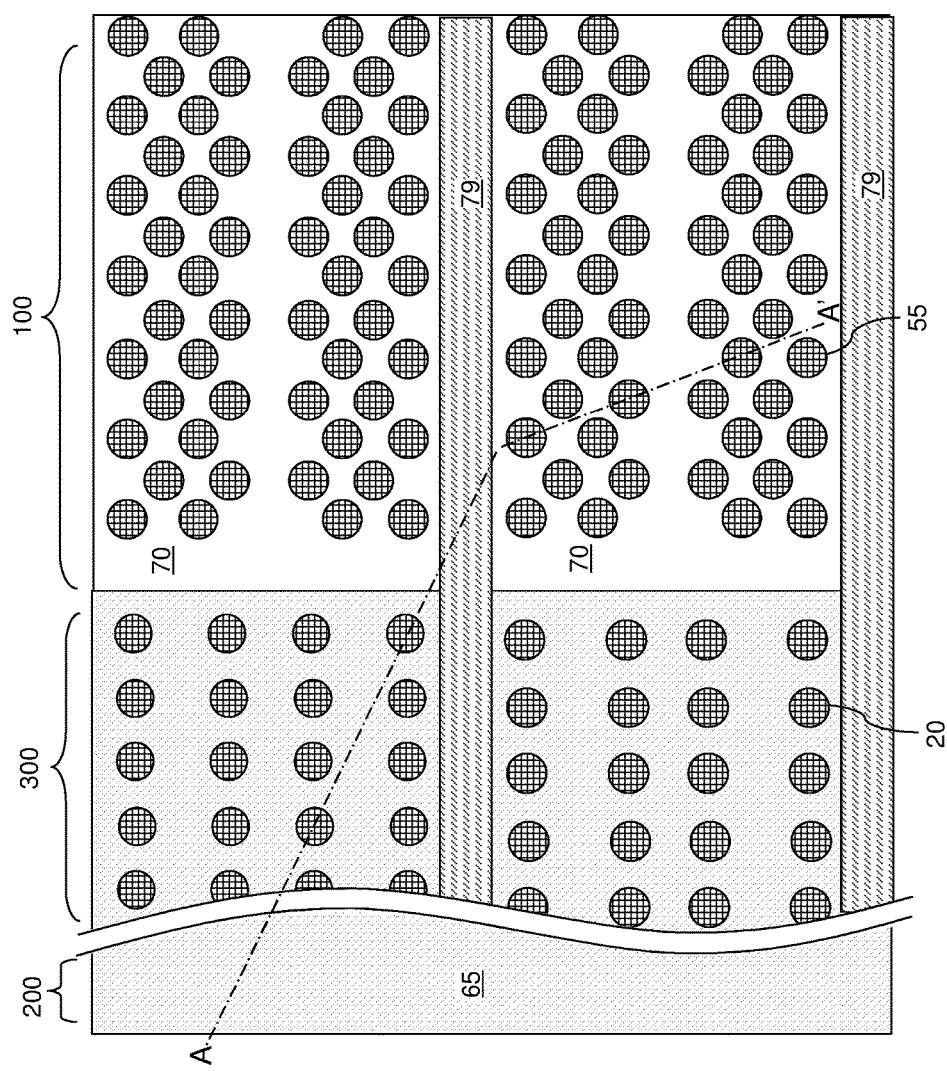
FIG. 26B is a top-down view of the third exemplary structure of FIG. 26A. The vertical plane A-A' is the plane of the schematic vertical cross-sectional view of FIG. 26A.

Referring to FIGS. 26A and 26B, the processing steps of FIGS. 7, 8A, and 8B can be performed to form backside trenches 79.

Figure 27A:
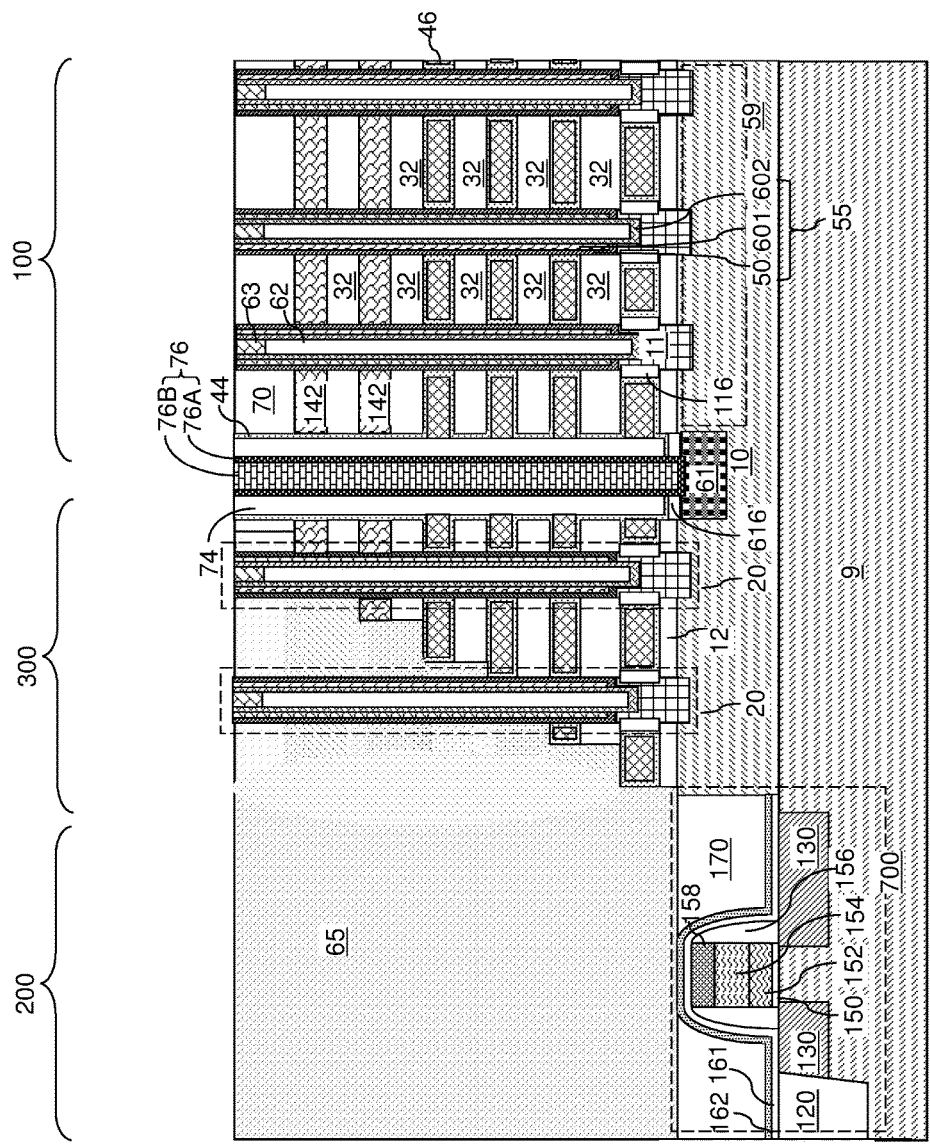
FIG. 27A is a vertical cross-sectional view of the third exemplary structure after formation of insulating spacers and backside contact structures according to the third embodiment of the present disclosure.
Figure 27B:
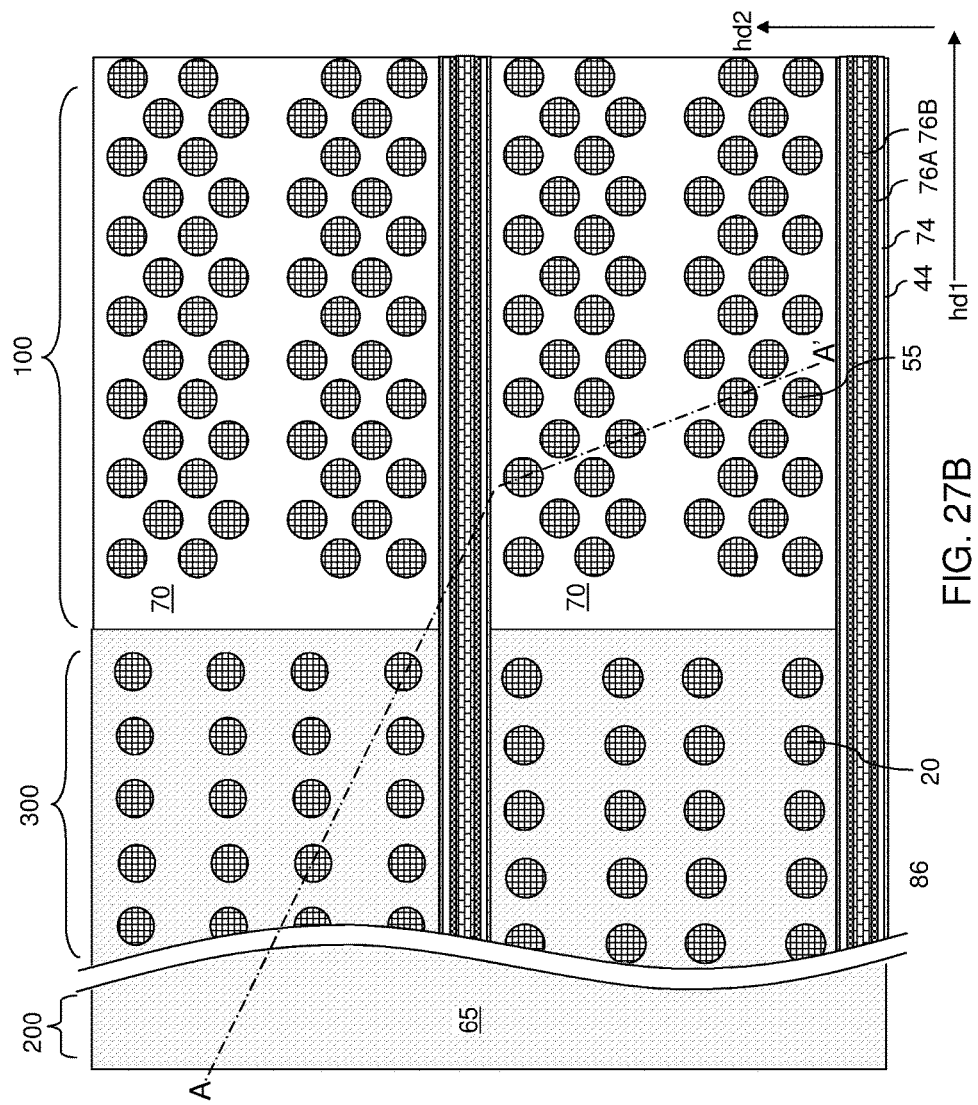
FIG. 27B is a top-down view of the third exemplary structure of FIG. 27A. The vertical plane A-A' is the plane of the schematic vertical cross-sectional view of FIG. 27A.

Referring to FIGS. 27A and 27B, the processing steps of FIG. 9 can be performed to form backside recesses 43 by removing the sacrificial material layers 42 selective to the insulating layers 32 and the at least one additional sacrificial material layer 142. The at least one additional sacrificial material layer 142 remains intact during formation of the backside recesses 43. Subsequently, the processing steps of FIGS. 10B and 10C can be performed to deposit a backside blocking dielectric layer 44 and a metallic liner layer 46A. The processing steps of FIGS. 17A, 17B, and 18 can then be performed to deposit a metallic fill material layer 46B, thereby forming electrically conductive layers 46 in the backside recesses and a continuous metallic material layer 46L. The processing steps of FIG. 19 can be performed to remove the continuous metallic material layer 46L from inside the backside trenches 79 and from above the insulating cap layer 70 and the retro-stepped dielectric material portion 65. The processing steps of FIGS. 13A, 13B, and 14 can be performed to form an insulating spacer 74 within each backside trench 79. The processing steps of FIG. 15 can be performed to form source regions 61 and backside contact via structures 76.

Figure 28A:
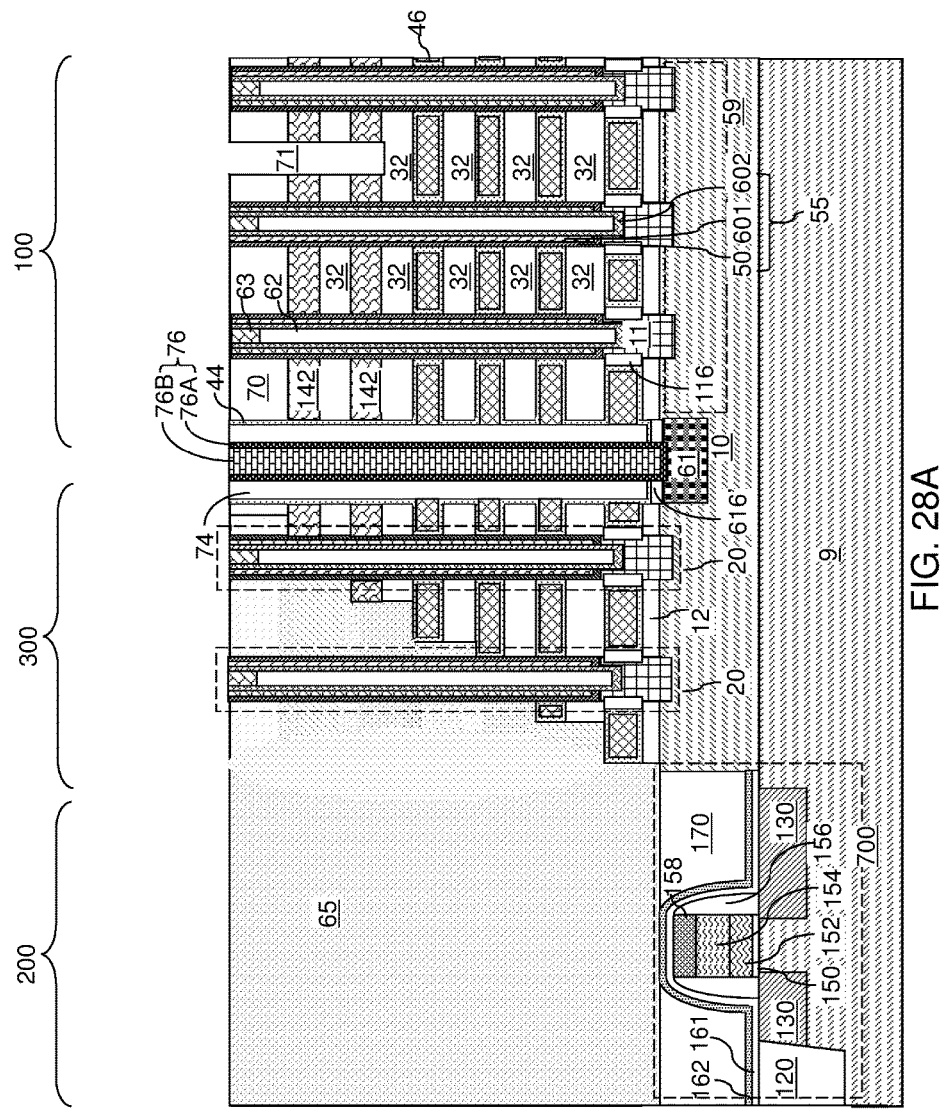
FIG. 28A is a schematic vertical cross-sectional view of the third exemplary structure after formation of isolation trenches according to the third embodiment of the present disclosure.
Figure 28B:
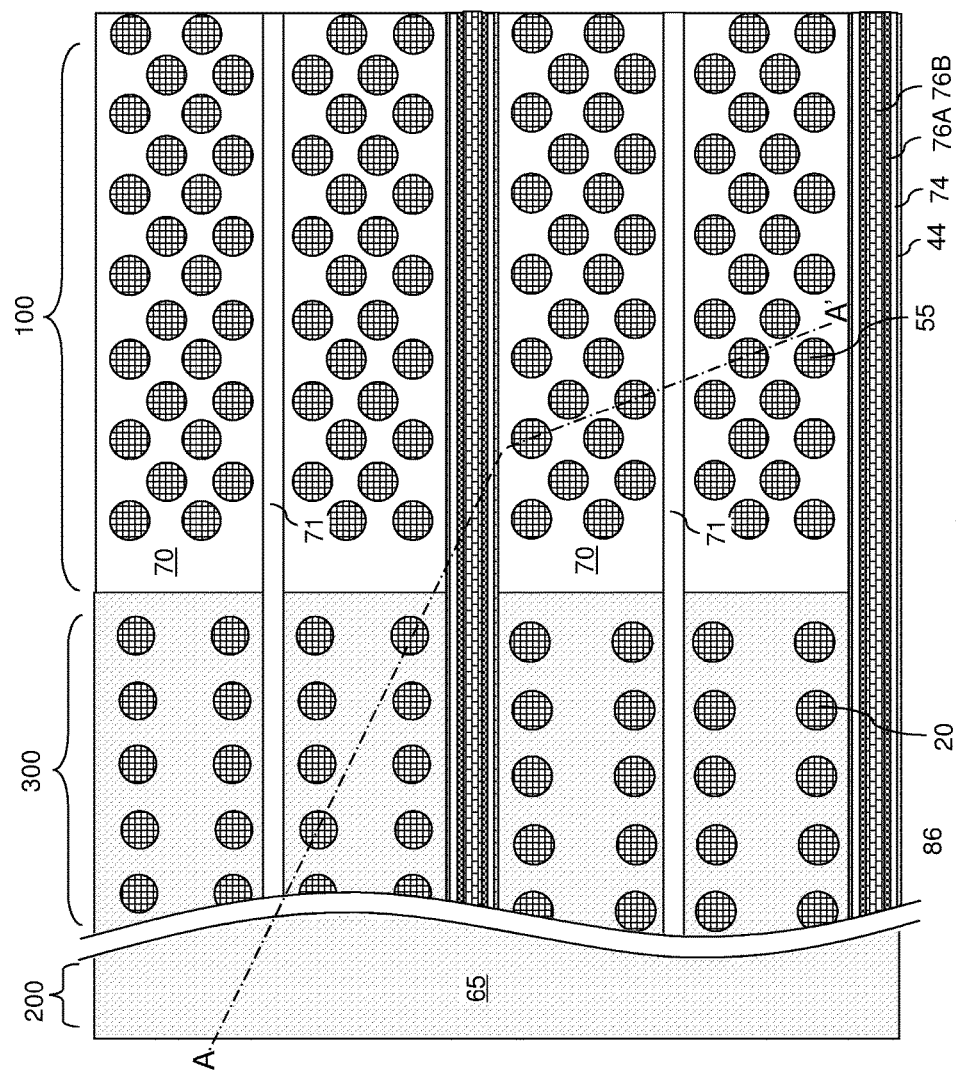
FIG. 28B is a top-down view of the third exemplary structure of FIG. 28A. The vertical plane A-A' is the plane of the schematic vertical cross-sectional view of FIG. 28A.

Referring to FIGS. 28A and 28B, isolation trenches 71 can be formed after forming the backside trenches 79. The isolation trenches 71 can be formed through the insulating cap layer 70 and each of the at least one sacrificial material layer 142, which is located at each of the drain select gate level(s). For example, a photoresist layer (not shown) can be applied over the insulating cap layer 70 and the retro-stepped dielectric material portion 65, and can be lithographically patterned to form laterally extending openings, which can extend along a first horizontal direction hd1. The laterally extending openings can be mutually spaced from one another along a second horizontal direction hd2, which may be perpendicular to the first horizontal direction. The openings in the photoresist layer can overlie regions between groups of memory stack structures 55 and support pillar structures 20, i.e., in regions free of the memory stack structures 55 and the support pillar structures 20. An anisotropic etch can be performed to transfer the pattern in the photoresist layer into the insulating cap layer 70 and the at least one additional sacrificial material layer 142 located at the drain select gate level(s), and a subset of the insulating layers 32 (if any) located above the sacrificial material layer 42 at the bottommost drain select gate level. The transferred pattern through the insulating cap layer 70, the at least one additional sacrificial material layer 142 located at the drain select gate level(s), and the intervening insulating layer(s) 32, if any, constitutes the isolation trenches 71. Each isolation trench 71 can extend through the memory array region 100 and the contact region 300, and can laterally separate different groups of the memory stack structures 55 and the support pillar structures 20. Each isolation trench 71 can be located between a pair of backside contact via structures 76, which extend along the first horizontal direction hd1. The photoresist layer can be subsequently removed, for example, by ashing.

Figure 29:
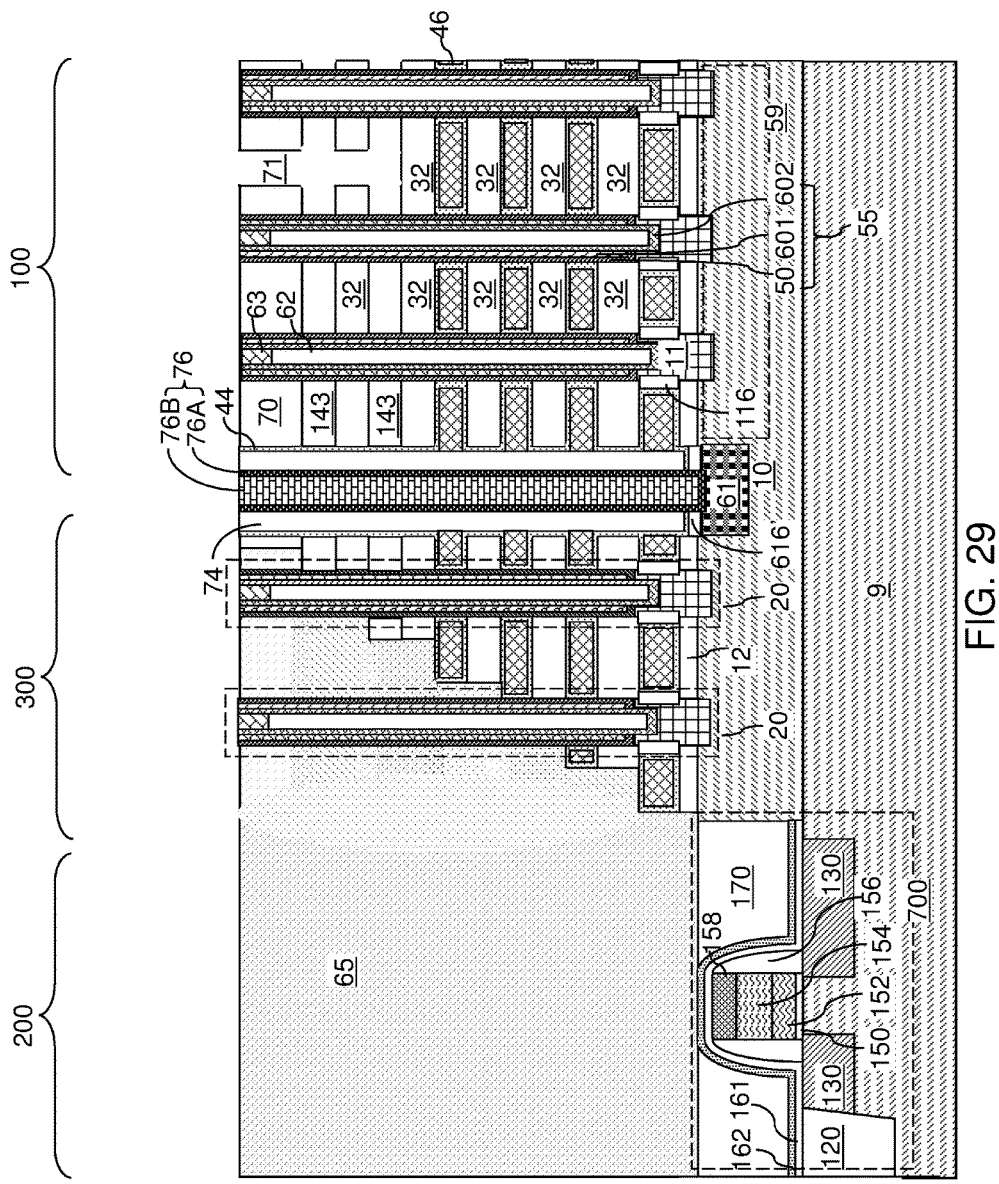
FIG. 29 is a schematic vertical cross-sectional view of the third exemplary structure after formation of second backside recesses according to the third embodiment of the present disclosure.

Referring to FIG. 29, an etchant that etches the material of the at least one additional sacrificial material layer 142 selective to the material of the insulating layers 32 and the electrically conductive layers can be introduced through the isolation trenches 71. The etchant can isotropically etch the at least one additional sacrificial material layer 142 selective to the insulating layers 32, the backside blocking dielectric layer 44 or the insulating spacers 74, and the outermost layer of the memory film 50 in the memory stack structures 55. For example, if the at least one additional sacrificial material layer 142 includes silicon, a wet etch employing a KOH solution or a trimethyl-2 hydroxyethyl ammonium hydroxide (TMY) solution can be employed to remove the at least one additional sacrificial material layer 142 selective to the insulating layers 32. Additional backside recesses 143 are formed in the volumes from which the at least one additional sacrificial material layer 142 is removed. In the third embodiment, the backside recesses 43 formed by removal of the sacrificial material layers 42 are referred to as first backside recesses, and the additional backside recesses 143 formed by removal of the at least one additional sacrificial material layer 142 are referred to as second backside recesses.

Figure 30A:
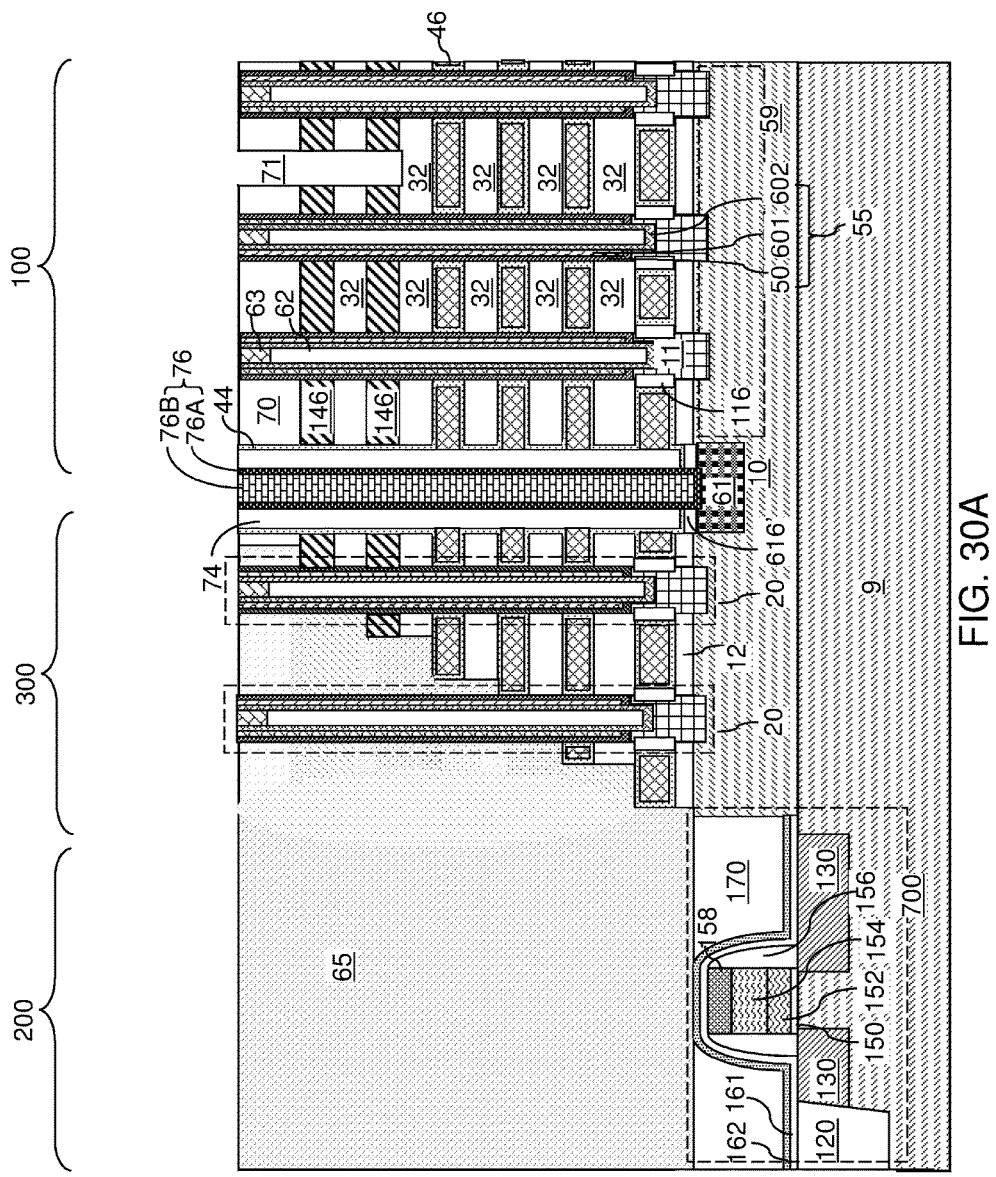
FIG. 30A is a schematic vertical cross-sectional view of the third exemplary structure after formation of second electrically conductive layers according to the third embodiment of the present disclosure.
Figure 30B:
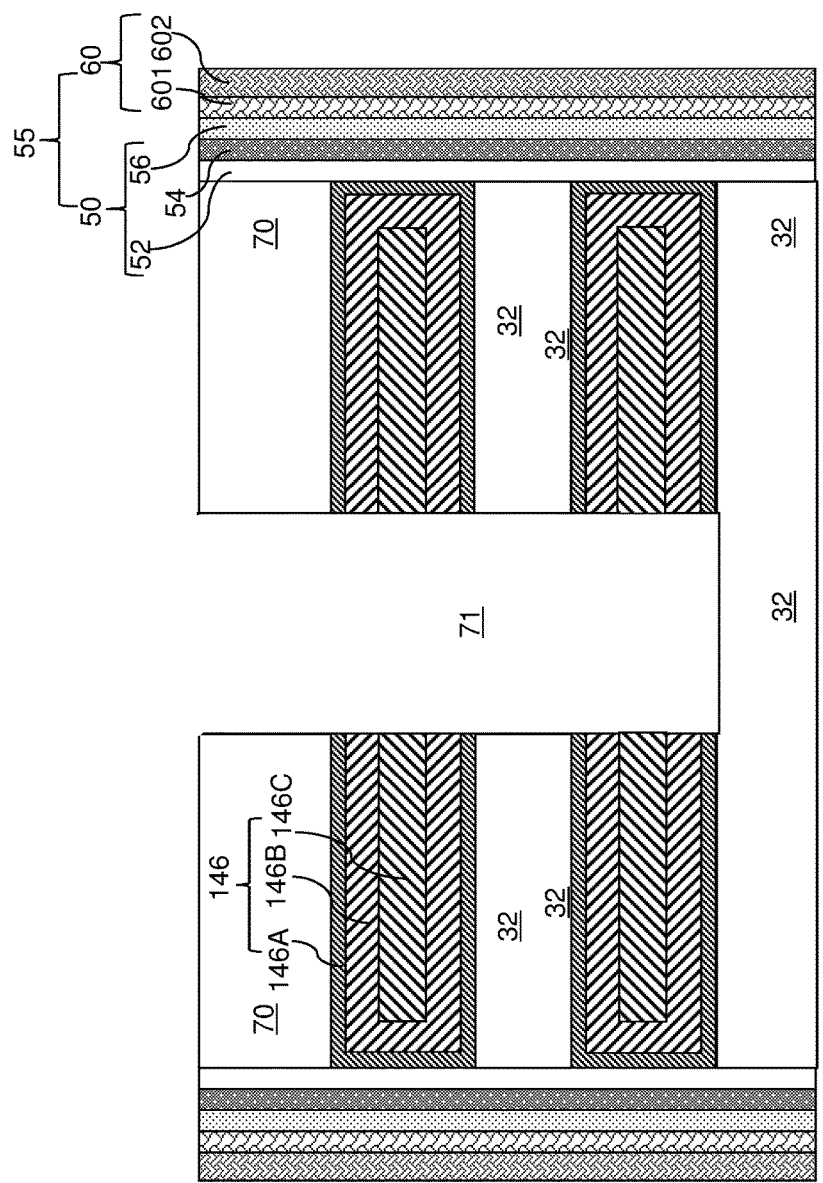
FIG. 30B is a top-down view of the third exemplary structure of FIG. 30A. The vertical plane A-A' is the plane of the schematic vertical cross-sectional view of FIG. 30A.

Referring to FIGS. 30A and 30B, at least one conductive material layer can be deposited in the additional backside recesses 143. In one embodiment, the materials of the at least one conductive material layer can include the material of the metallic liner layer 46A of the first and second embodiments, and can further include the material of the at least one metallic fill material layer (46B, 46C) of the first embodiment or the material of the metallic fill material layer of the second embodiment. The deposited conductive material(s) in the additional backside recesses 143 constitute additional electrically conductive layers 146. In the third embodiment, the electrically conductive layers 46 formed by replacing the first sacrificial material layers 42 are referred to as first electrically conductive layers 46, and the at least one additional electrically conductive layer 146 formed by replacement of the at least one additional sacrificial material layer 142 is referred to as at least one second electrically conductive layer 146.

Multiple anisotropic etch processes can be performed to remove the metallic material from the isolation trenches 71 as in the first embodiment, for example, by performing the processing steps of 11A and 11B multiple times as in the first embodiment. Alternatively, a single anisotropic etch process can be performed to remove the metallic material from the isolation trenches 71 as in the second embodiment, for example, by performing the processing steps of FIG. 21 or FIG. 23. Thus, conductive materials are removed from the isolation trenches 71 after formation of the at least one second electrically conductive layer 146.

In one embodiment, each of the at least one electrically conductive layer 146 (i.e., the at least one second electrically conductive layer 146) can include a metallic liner layer 146A (which may include any of the materials that can be employed for the metallic liner layer 46A), and can include at least one metallic fill material layer (146B, 146C) (which may include any of the materials that can be employed for the at least one metallic fill material layer (46B, 46C)).

Figure 31A:
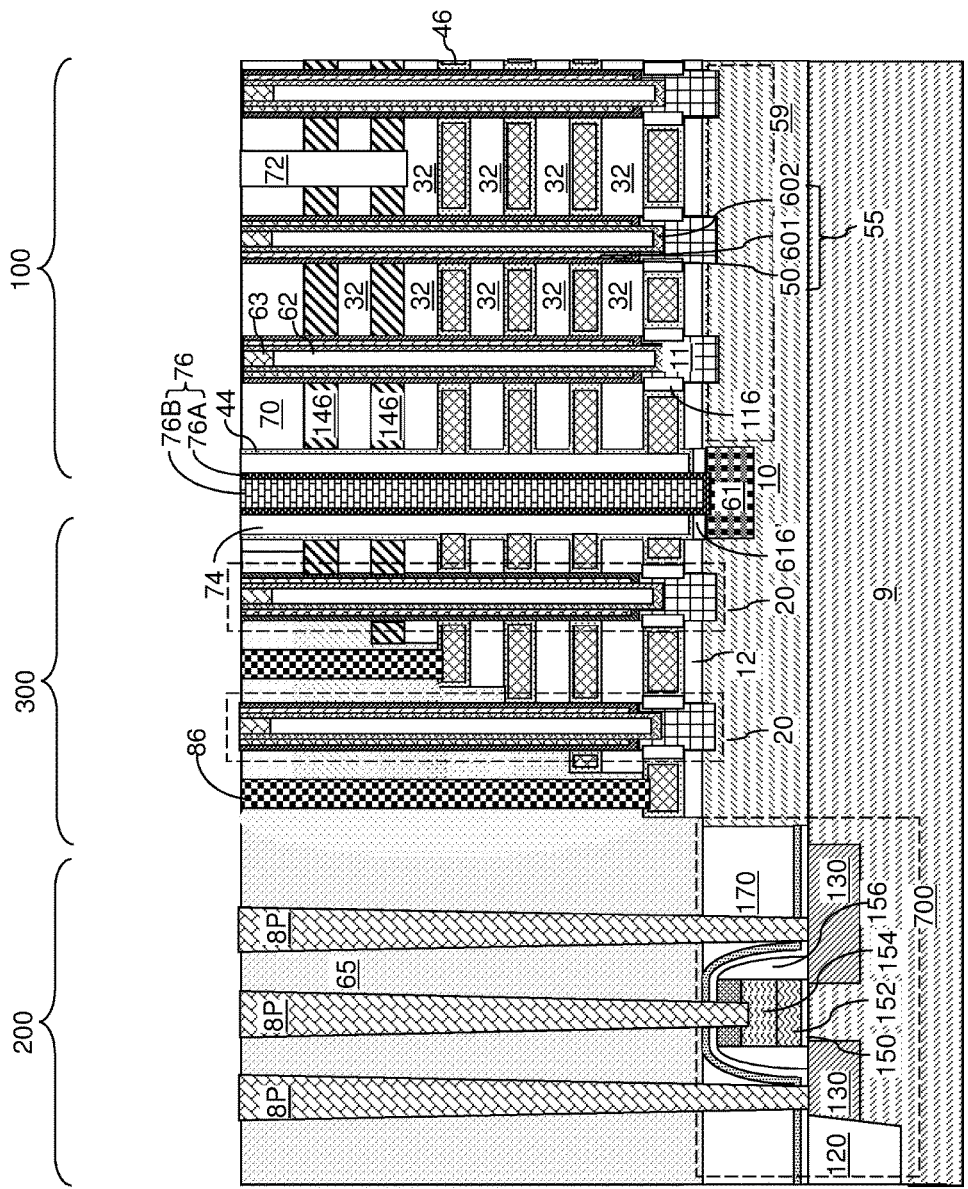
FIG. 31A is a schematic vertical cross-sectional view of the third exemplary structure after formation of dielectric isolation structures according to the third embodiment of the present disclosure.
Figure 31B:
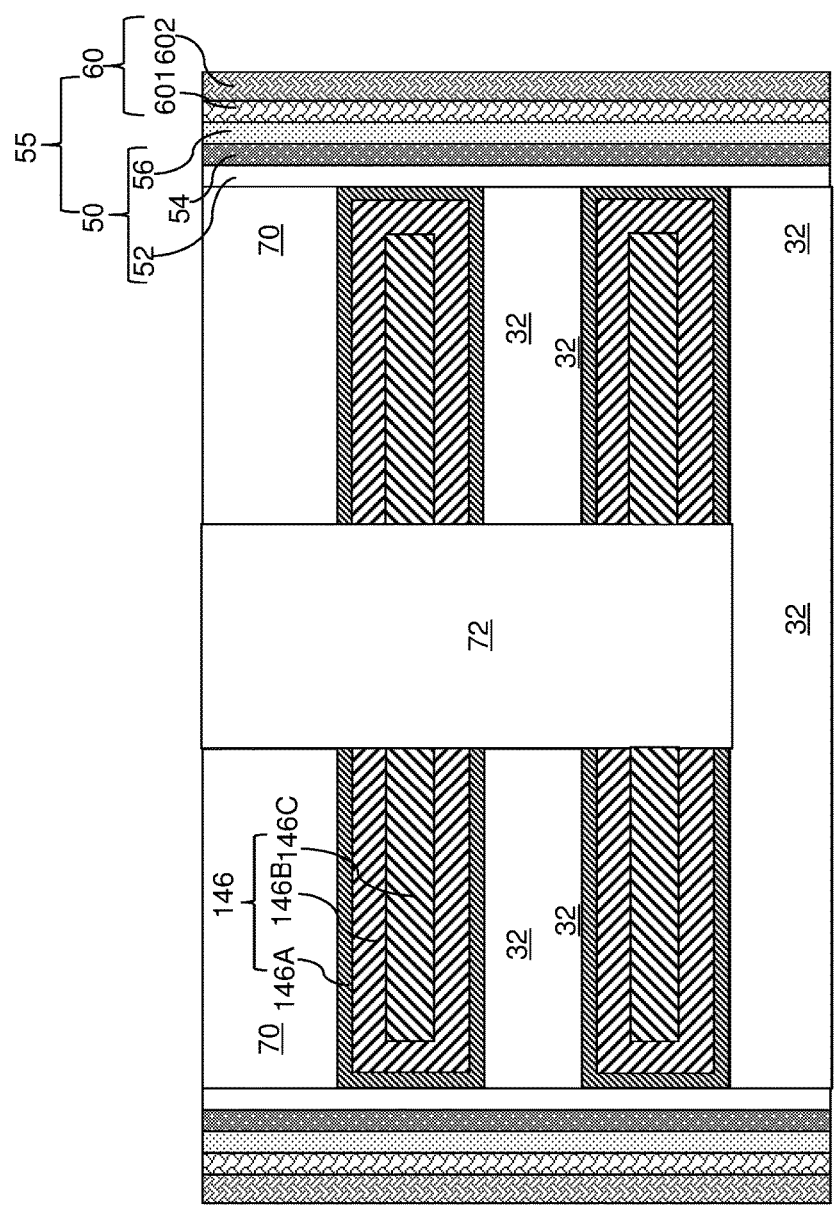
FIG. 31B is a magnified view of a region of a dielectric isolation structure in the third exemplary structure of FIG. 31A.

Referring to FIGS. 31A and 31B, the processing steps of FIGS. 22A and 22B or the processing steps of FIG. 24 can be performed to form dielectric isolation structures 72 in the isolation trenches 71. Further, additional contact via structures (86, 8P) can be formed through the insulating cap layer 70, and optionally through the retro-stepped dielectric material portion 65. Word line contact via structures 86 can be formed on the electrically conductive layers 46 through the insulating cap layer 70, and through the retro-stepped dielectric material portion 65. Peripheral device contact via structures 8P can be formed through the retro-stepped dielectric material portion 65 directly on respective nodes of the peripheral devices.

In the third embodiment, the at least one additional sacrificial material layer 142 is replaced with at least one additional electrically conductive layer 146 after formation of the isolation trenches 71. An etchant that removes the at least one additional sacrificial material layer 142 selective to the insulating layers 32 is introduced through the isolation trenches 71 to form additional lateral recesses 143. At least one conductive material is deposited in the additional lateral recesses 143 to form the at least one additional electrically conductive layer 146.

The third exemplary structure includes a layer stack (32, 42, 142) located over a substrate (9, 10). The layer stack (32, 46, 146) includes an alternating stack of insulating layers 32 and electrically conductive layers 46, and further includes an additional electrically conductive layer 146 formed after formation of the electrically conductive layers 46.

The third exemplary structure includes a three-dimensional memory device. The three-dimensional memory device can include: an alternating stack of insulating layers 32 and electrically conductive layers (46, 146) located over a substrate (9, 10); memory stack structures 55 extending through the alternating stack (32, 46), wherein each of the memory stack structures 55 comprises a memory film 50 and a vertical semiconductor channel 60 contacting an inner sidewall of the memory film 50; and a dielectric isolation structure 72 extending through a first subset S1 of layers in the drain select level within the alternating stack (32, 46, 246) that is less than an entirety of the alternating stack. The first subset S1 of layers within the alternating stack (32, 46, 146) is located in an upper portion of the alternating stack (32, 46, 146). Each electrically conductive layer 46 within the first subset S1 of layers comprises a drain select gate including an instance of a metallic liner layer 146A and an instance of at least one metallic fill material layer (146B, 146C) that physically contacts sidewalls of the dielectric isolation structures 72.

In one embodiment, a second subset S2 of layers that is a complementary subset of the first subset S1 of layers underlies the first subset S1. Each electrically conductive layer 46 within the second subset S2 comprises a word line or source select gate including a respective instance of the metallic liner layer 46A and a respective instance of the at least one metallic fill material layer (46B, 46C) as illustrated in FIG. 13A or FIG. 17A.

In one embodiment, the at least one metallic fill material layer (146B, 146C) can include a plurality of metallic fill material layers (146B, 146C) having a thickness less than one half of a width of the dielectric isolation structure 72 multiple deposition processes and multiple anisotropic etch processes are employed to form the at least one additional electrically conducive layer 146. In one embodiment, the metallic liner layer 146A can include a conductive metallic nitride material, and each of the at least one metallic fill material layer (146B, 146C) can include a material selected from tungsten, cobalt, ruthenium, molybdenum, and copper.

In one embodiment, the at least one metallic fill material layer 146B can consist of a single metallic fill material layer 146B if a single deposition process and a single anisotropic etch process is employed to form the at least one metallic fill material layer 146B.

In one embodiment, the at least one metallic fill material layer (146B, 146C) within the first subset S1 of the alternating stack (32, 46, 146) comprises a plurality of metallic fill material layers (146B, 146C). A second subset S2 of layers that is a complementary subset of the first subset S1 of layers underlies the first subset S1. Each electrically conductive layer 46 within the second subset S2 can consist of an instance of another metallic liner layer 46A and an instance of a single metallic fill material layer 46B.

In one embodiment, each electrically conductive layer 146 within the first subset S1 of layers in the drain select level physically contacts a horizontal surface of an insulating layer 32 within the first subset S1 of layers. In one embodiment, each vertically neighboring pair of an electrically conductive layer 46 and an insulating layer 32 within the second subset S2 of layers is vertically spaced from each other by a backside blocking dielectric layer 44.

Figure 32:
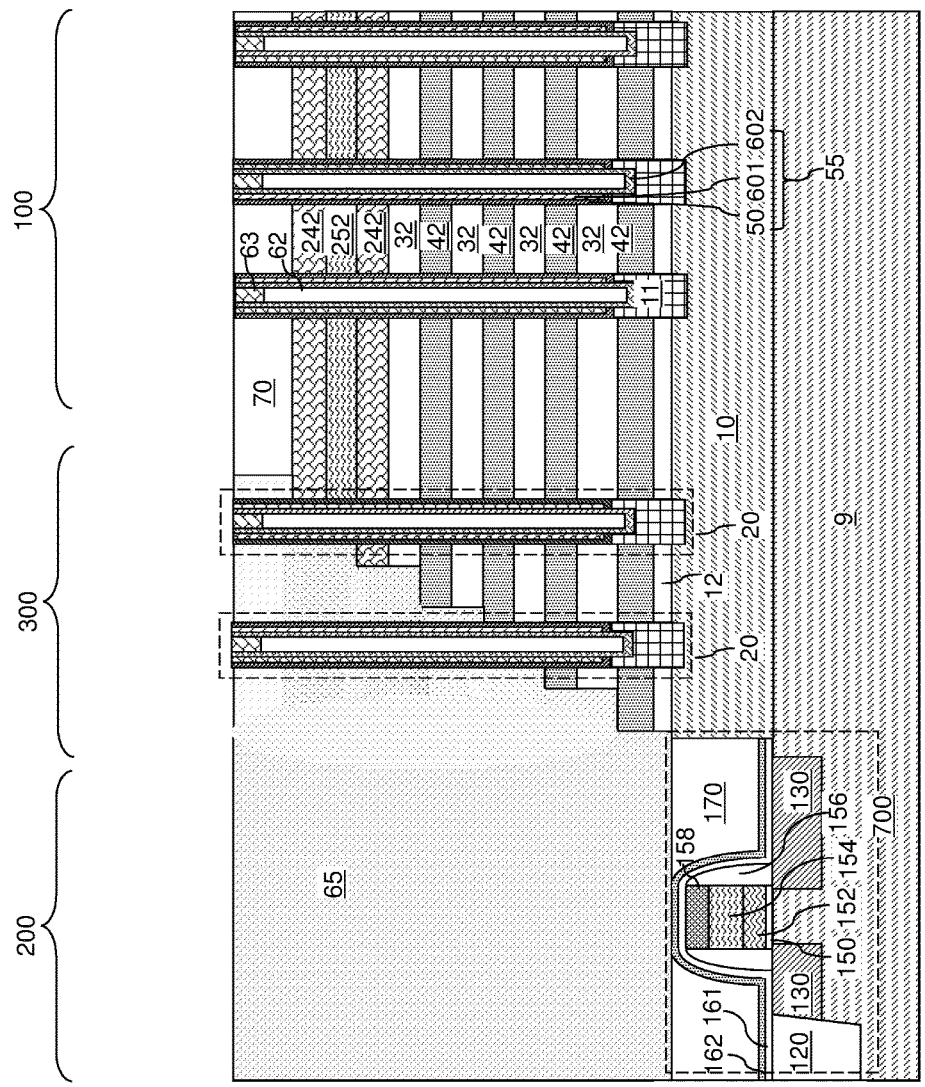
FIG. 32 is a vertical cross-sectional view of a fourth exemplary structure after formation of memory stack structures and support pillar structures according to a fourth embodiment of the present disclosure.

Referring to FIG. 32, a fourth exemplary structure according to a fourth embodiment of the present disclosure can be derived from the third exemplary structure by forming a layer stack including at least one template semiconductor material layer 242 and at least one sacrificial material layer 252, which can be a sacrificial semiconductor material layer. In case a plurality of template semiconductor material layers 242 or a plurality of sacrificial semiconductor material layers 252 is employed in the layer stack, the at least one template semiconductor material layer 242 and the at least one sacrificial semiconductor material layer 252 are arranged in an alternating manner to form an upper alternating stack (242, 252). The upper alternating stack (242, 252) is located above the lower alternating stack (32, 42) described above.

Each of the at least one template semiconductor material layer 242 includes a semiconductor material that is subsequently employed as a template material for forming a metal-semiconductor alloy layer (such as a metal silicide layer). Each of the at least one sacrificial semiconductor material layer 252 includes a semiconductor material that can be removed selective to the at least one template semiconductor material layer 242 and selective to the insulating layers 32. In an illustrative example, the at least one template semiconductor material layer 242 can include p-type (e.g., boron-doped) amorphous silicon or polysilicon, and the at least one sacrificial semiconductor material layer 252 can include intrinsic (e.g., undoped) polysilicon or amorphous silicon. In another illustrative example, the at least one template semiconductor material layer 242 can include doped or undoped silicon, and the at least one sacrificial semiconductor material layer 252 can include germanium or a silicon-germanium alloy having an atomic concentration of germanium greater than 40%. Each of the at least one template semiconductor material layer 242 can have a thickness in a range from 15 nm to 60 nm, although lesser and greater thicknesses can also be employed. Each of the at least one sacrificial semiconductor material layer 252 can have a thickness in a range from 15 nm to 60 nm, although lesser and greater thicknesses can also be employed.

Each of the at least one template semiconductor material layer 242 can be located at drain select gate level(s). An insulating cap layer 70 can be formed above the layer stack of the at least one template semiconductor material layer 242 and the at least one sacrificial semiconductor material layer 252.

Subsequently, the processing steps of FIGS. 3, 4A-4B, and 5A-5H can be sequentially performed to provide the fourth exemplary structure illustrated in FIG. 32.

Figure 33A:
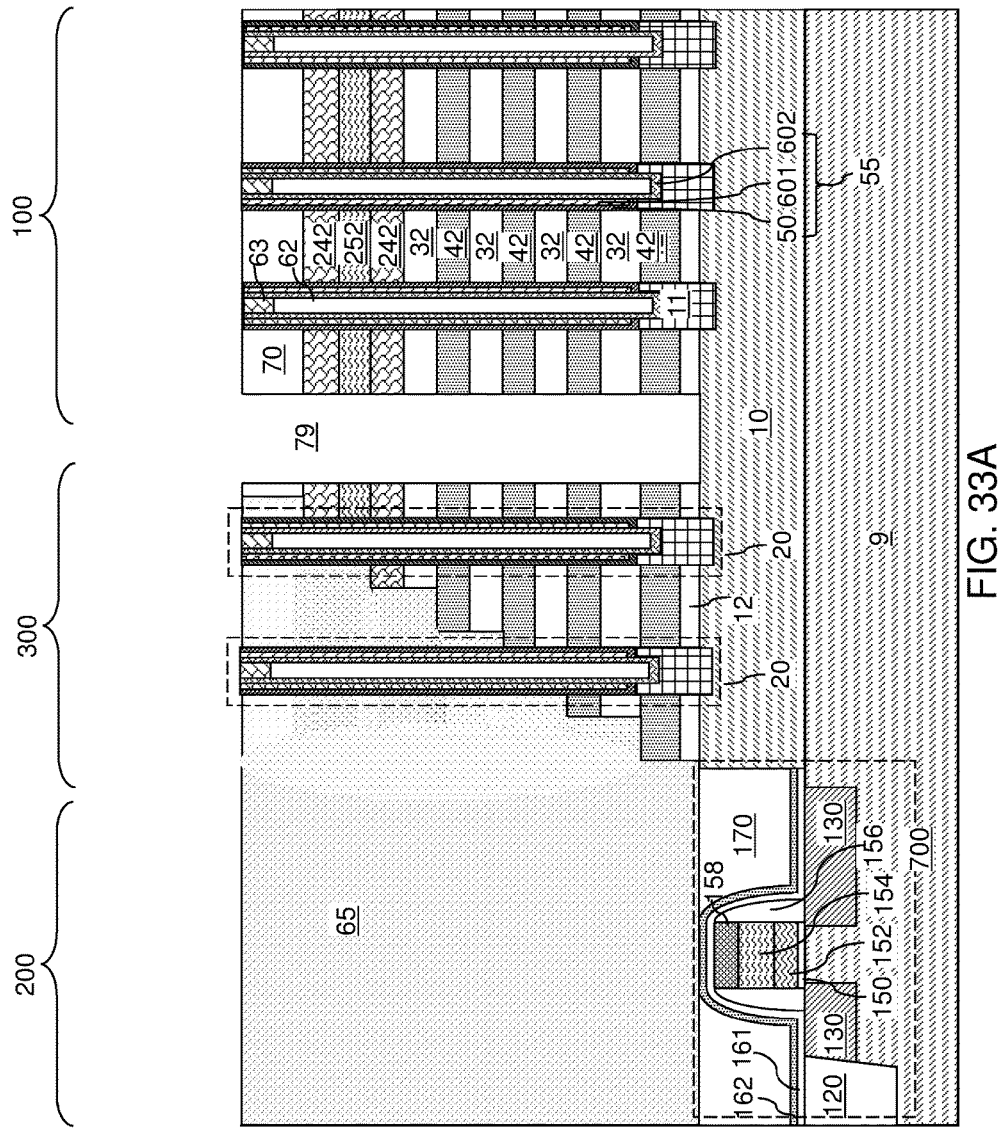
FIG. 33A is a vertical cross-sectional view of the fourth exemplary structure after formation of backside trenches according to the fourth embodiment of the present disclosure.
Figure 33B:
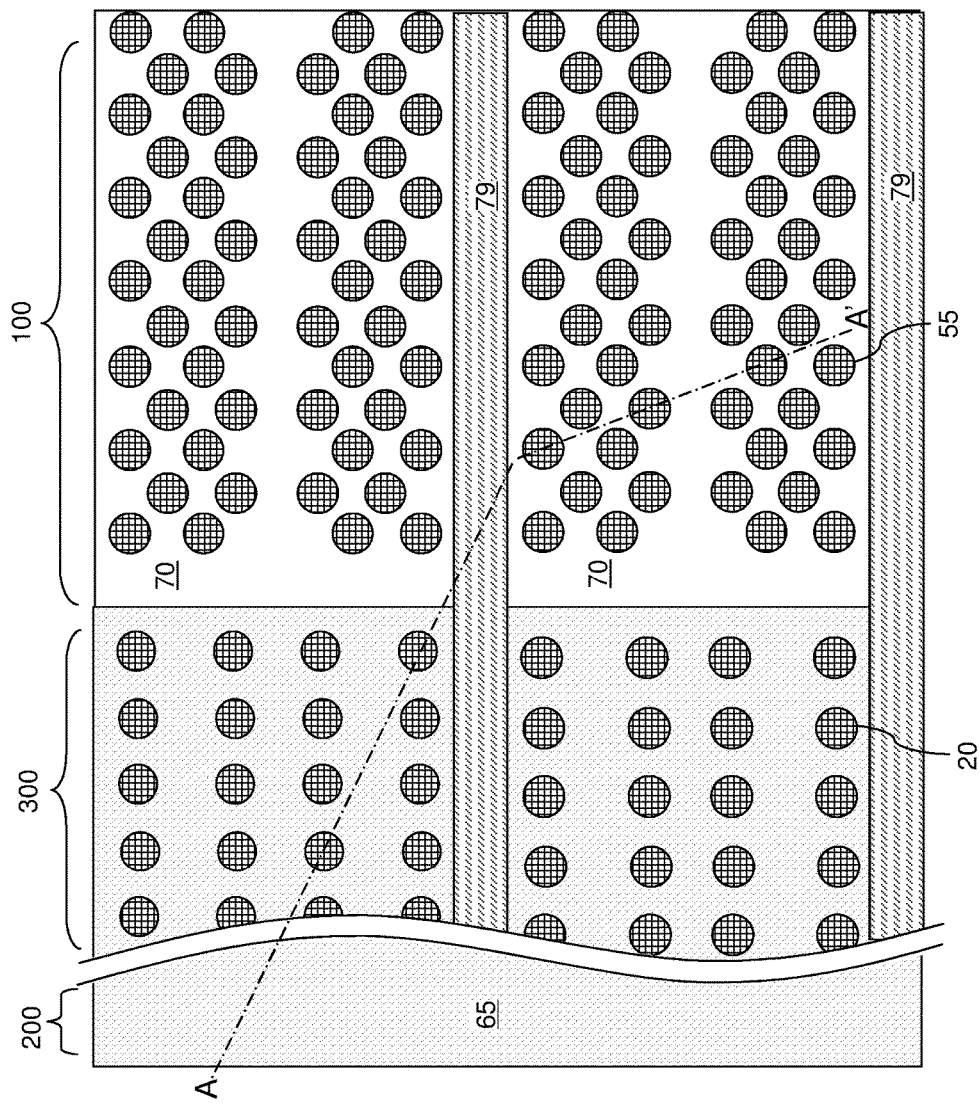
FIG. 33B is a top-down view of the fourth exemplary structure of FIG. 33A. The vertical plane A-A' is the plane of the schematic vertical cross-sectional view of FIG. 33A.

Referring to FIGS. 33A and 33B, the processing steps of FIGS. 7, 8A, and 8B can be performed to form backside trenches 79.

Figure 34A:
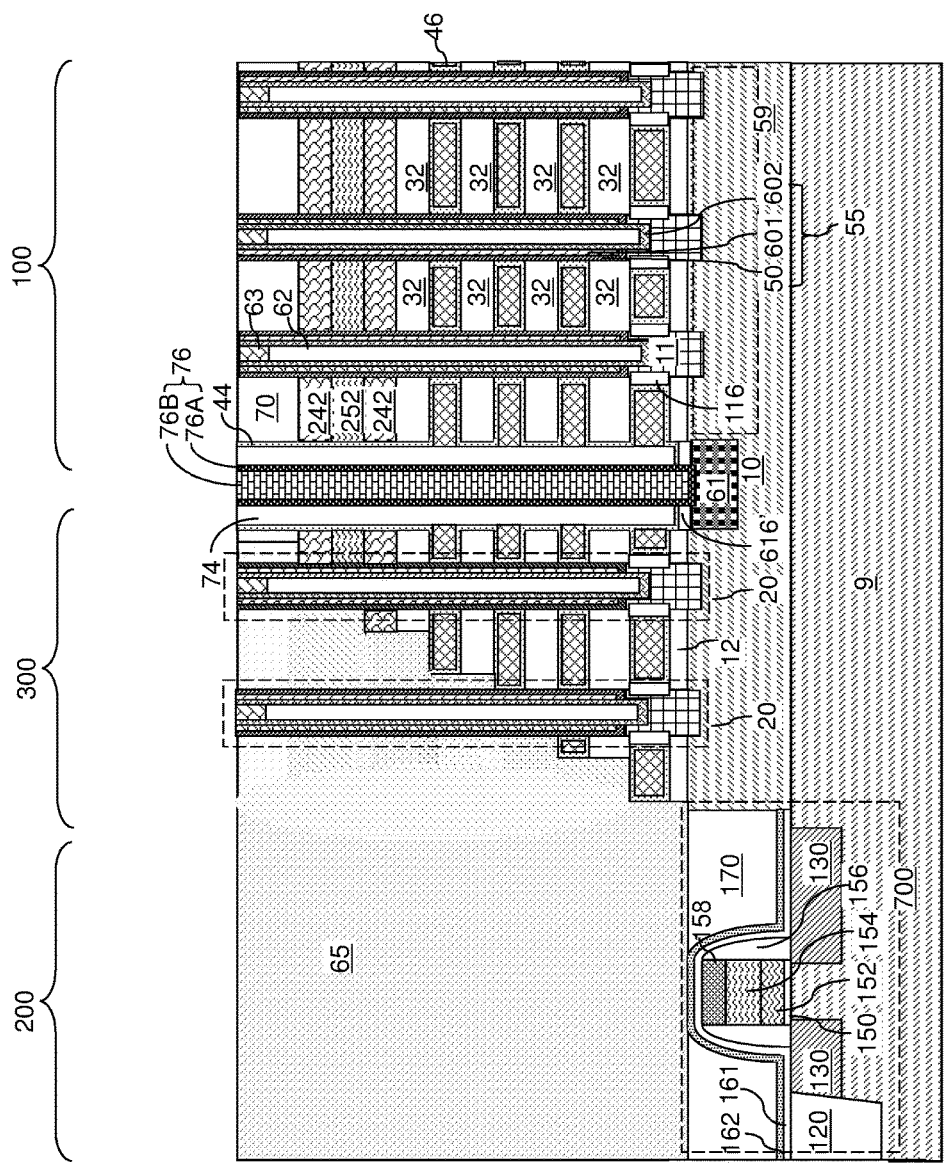
FIG. 34A is a vertical cross-sectional view of the fourth exemplary structure after formation of insulating spacers and backside contact structures according to the fourth embodiment of the present disclosure.

Referring to FIGS. 34A and 34B, the processing steps of FIG. 9 can be performed to form backside recesses 43 by removing the sacrificial material layers 42 selective to the insulating layers 32 and the layer stack of the at least one template semiconductor material layer 242 and the at least one sacrificial semiconductor material layer 252. For example, in case the sacrificial material layers 42 include silicon nitride, the insulating layers 32 include silicon oxide, and the layer stack of the at least one template semiconductor material layer 242 and the at least one sacrificial semiconductor material layer 252 include semiconductor materials, a wet etch employing hot phosphoric acid can be employed to remove the sacrificial material layers 42 selective to the insulating layers 32 and the layer stack of the at least one template semiconductor material layer 242 and the at least one sacrificial semiconductor material layer 252. The layer stack of the at least one template semiconductor material layer 242 and the at least one sacrificial semiconductor material layer 252 remains intact during formation of the backside recesses 43.

Subsequently, the processing steps of FIGS. 10B and 10C can be performed to deposit a backside blocking dielectric layer 44 and a metallic liner layer 46A. The processing steps of FIGS. 17A, 17B, and 18 can then be performed to deposit a metallic fill material layer 46B, thereby forming electrically conductive layers 46 in the backside recesses and a continuous metallic material layer 46L. The processing steps of FIG. 19 can be performed to remove the continuous metallic material layer 46L from inside the backside trenches 79 and from above the insulating cap layer 70 and the retro-stepped dielectric material portion 65. The processing steps of FIGS. 13A, 13B, and 14 can be performed to form an insulating spacer 74 within each backside trench 79. The processing steps of FIG. 15 can be performed to form source regions 61 and backside contact via structures 76.

Figure 35A:
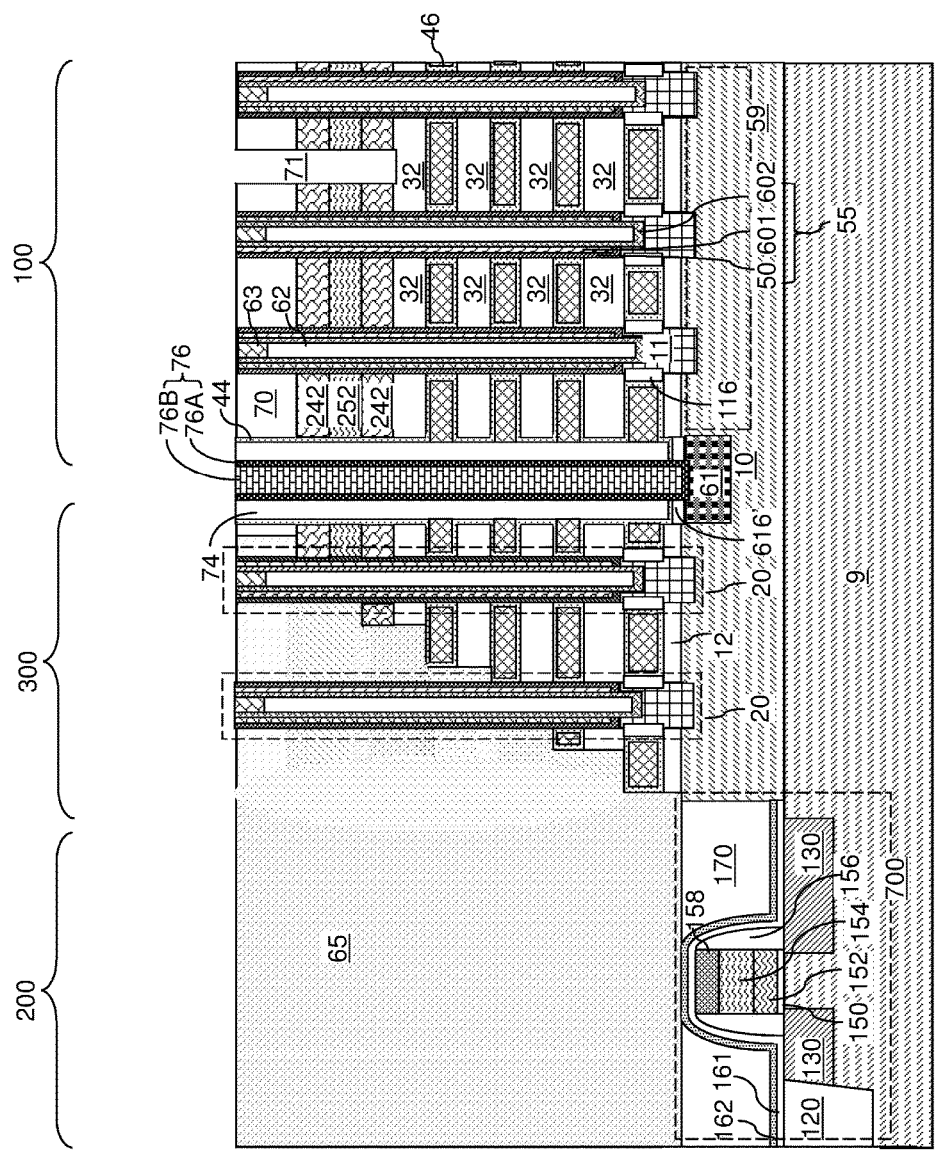
FIG. 35A is a schematic vertical cross-sectional view of the fourth exemplary structure after formation of isolation trenches according to the fourth embodiment of the present disclosure.
Figure 35B:
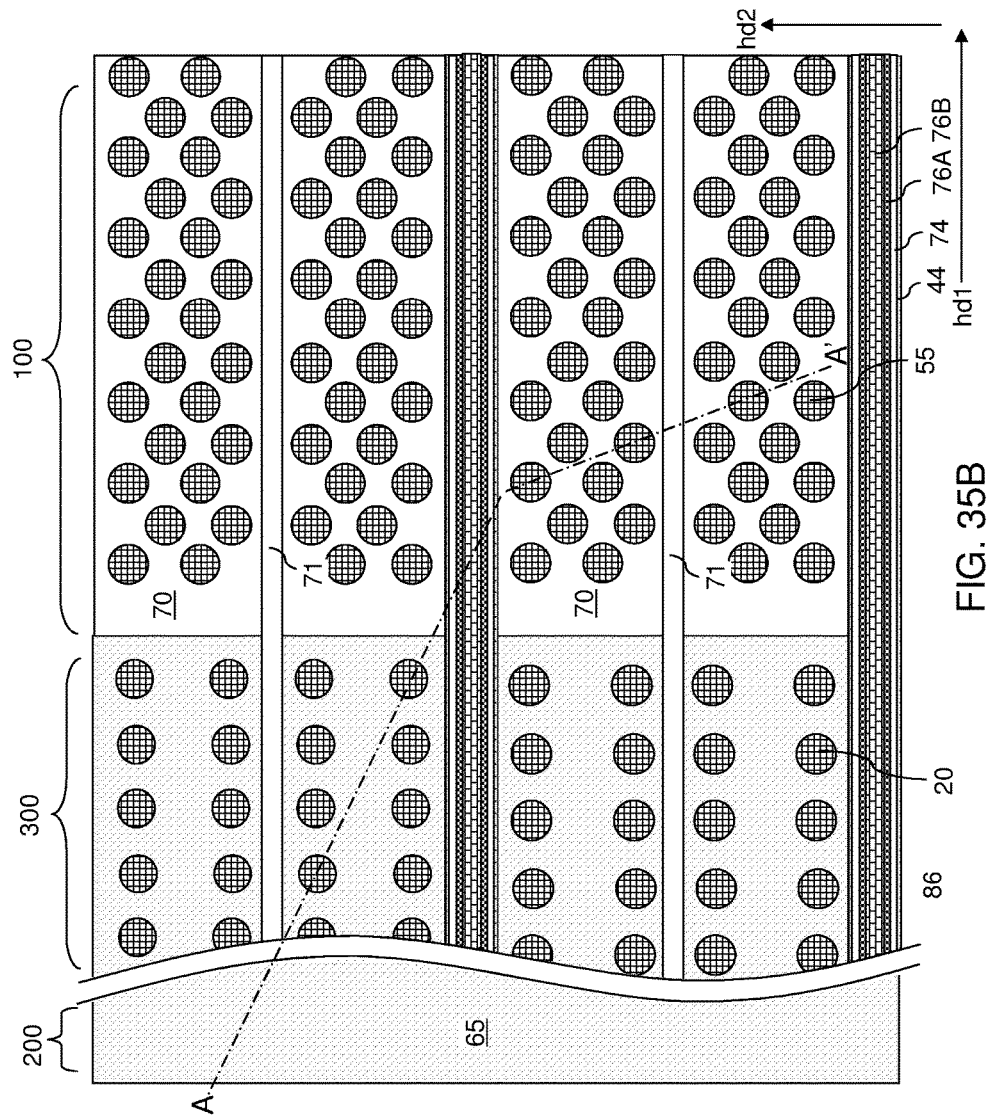
FIG. 35B is a top-down view of the fourth exemplary structure of FIG. 35A. The vertical plane A-A' is the plane of the schematic vertical cross-sectional view of FIG. 35A.

Referring to FIGS. 35A and 35B, isolation trenches 71 can be formed through the insulating cap layer 70 and the layer stack of the at least one template semiconductor material layer 242 and the at least one sacrificial semiconductor material layer 252. For example, a photoresist layer (not shown) can be applied over the insulating cap layer 70 and the retro-stepped dielectric material portion 65, and can be lithographically patterned to form laterally extending openings, which can extend along a first horizontal direction hd1. The laterally extending openings can be mutually spaced from one another along a second horizontal direction hd2, which may be perpendicular to the first horizontal direction. The openings in the photoresist layer can overlie regions between groups of memory stack structures 55 and support pillar structures 20, i.e., in regions free of the memory stack structures 55 and the support pillar structures 20.

An anisotropic etch can be performed to transfer the pattern in the photoresist layer into the insulating cap layer 70 and the layer stack of the at least one template semiconductor material layer 242 and the at least one sacrificial semiconductor material layer 252. The transferred pattern through the insulating cap layer 70 and the layer stack of the at least one template semiconductor material layer 242 and the at least one sacrificial semiconductor material layer 252 constitutes the isolation trenches 71. Each isolation trench 71 can extend through the memory array region 100 and the contact region 300, and can laterally separate different groups of the memory stack structures 55 and the support pillar structures 20. Each isolation trench 71 can be located between a pair of backside contact via structures 76, which extend along the first horizontal direction hd1. The photoresist layer can be subsequently removed, for example, by ashing. Each layer within the layer stack of the at least one template semiconductor material layer 242 and the at least one sacrificial semiconductor material layer 252 is laterally divided into a pair of physically disjoined portions by each isolation trench 71.

Figure 36:
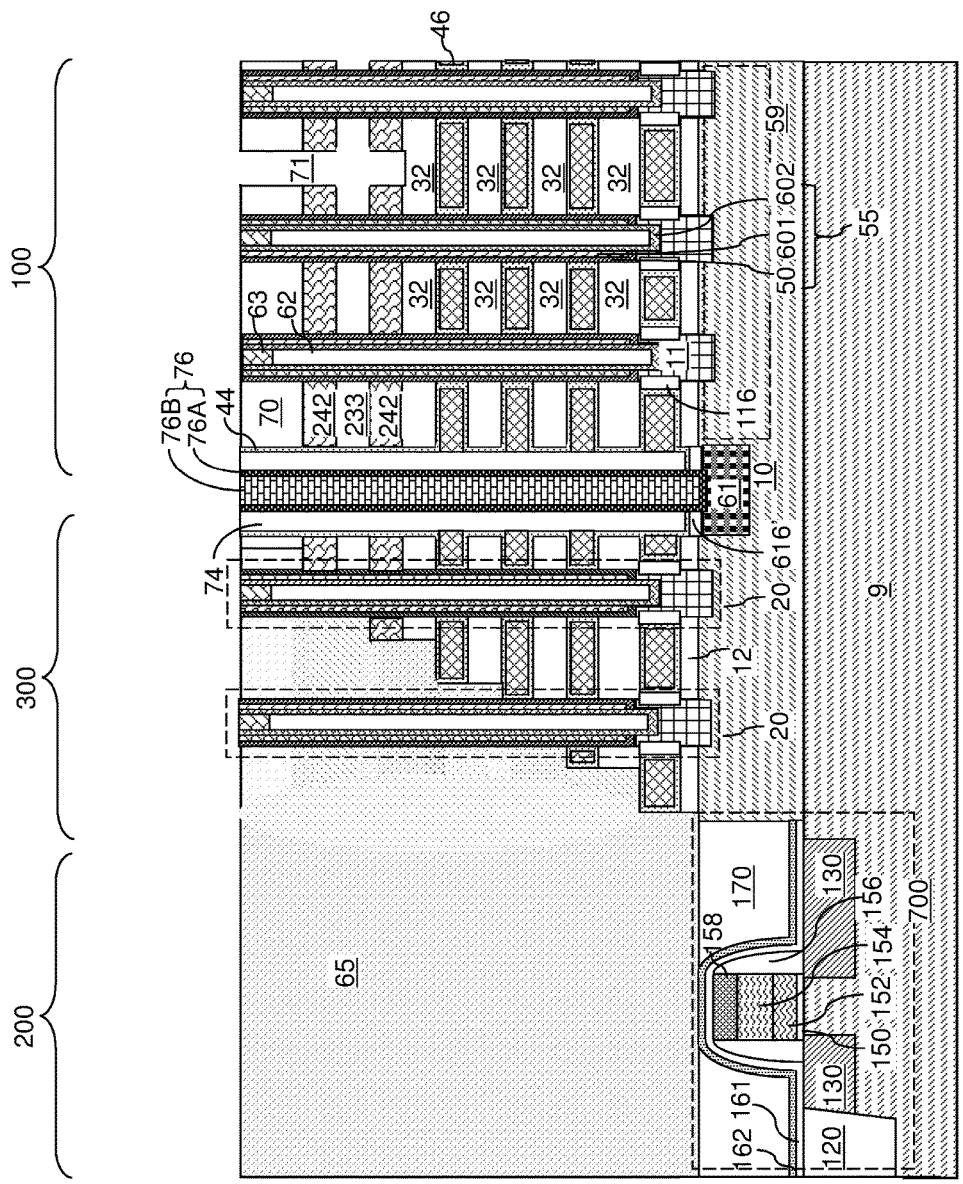
FIG. 36 is a schematic vertical cross-sectional view of the fourth exemplary structure after formation of a second backside recess according to the fourth embodiment of the present disclosure.

Referring to FIG. 36, an etchant that etches the material of the at least one sacrificial semiconductor material layer 252 selective to the material of the insulating layers 32 and the at least one template semiconductor material layer 242 can be introduced through the isolation trenches 71 while the backside trenches are filled. For example, if the insulating layers 32 include silicon oxide, the at least one template semiconductor material layer 242 includes p-doped amorphous silicon or p-doped polysilicon, and the at least one sacrificial semiconductor material layer 252 includes undoped amorphous silicon or undoped polysilicon, a wet etch process employing trimethylaluminum (TMA) can be employed to remove the at least one sacrificial semiconductor material layer 252 selective to the insulating layers 32 and the at least one template semiconductor material layer 242. In another example, if the insulating layers 32 include silicon oxide, the at least one template semiconductor material layer 242 includes amorphous silicon or polysilicon, and the at least one sacrificial semiconductor material layer 252 includes germanium or a silicon-germanium alloy including germanium at an atomic concentration greater than 40%, a wet etch process employing ammonium hydroxide and hydrogen peroxide can be employed to remove the at least one sacrificial semiconductor material layer 252 selective to the insulating layers 32 and the at least one template semiconductor material layer 242. The etchant can isotropically etch the at least one sacrificial semiconductor material layer 252 selective to the insulating layers 32, the backside blocking dielectric layer 44 or the insulating spacers 74, and the outermost layer of the memory film 50 in the memory stack structures 55.

Additional backside recesses 233 are formed in the volumes from which the at least one sacrificial semiconductor material layer 252 is removed. In the fourth embodiment, the backside recesses 43 formed by removal of the sacrificial material layers 42 are referred to as first backside recesses, and the additional backside recesses 233 formed by removal of the at least one sacrificial semiconductor material layer 252 are referred to as second backside recesses.

Figure 37:
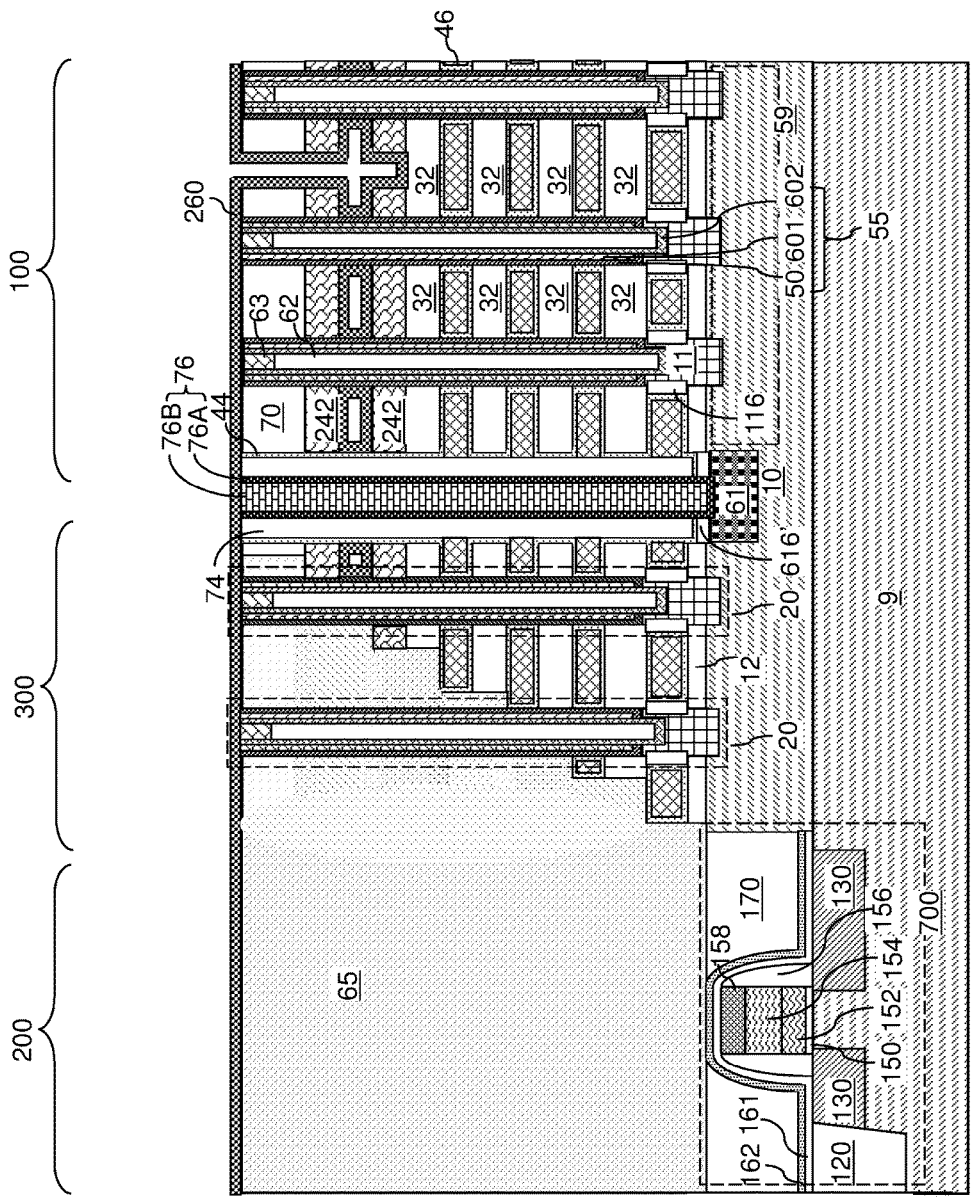
FIG. 37 is a schematic vertical cross-sectional view of the fourth exemplary structure after deposition of a metal layer according to the fourth embodiment of the present disclosure.

Referring to FIG. 37, a metal layer 260 can be deposited in the additional backside recesses 233 by a conformal deposition process. In one embodiment, the metal layer 260 includes a metal that forms a metal-semiconductor compound upon interaction with the semiconductor material of the at least one template semiconductor material layer 242. For example, if the at least one template semiconductor material layer 242 includes silicon, the metal layer 260 includes a metal that forms a metal silicide, which may be any of titanium, tungsten, cobalt, nickel, platinum, or a combination thereof. The metal layer 260 can be deposited by a conformal deposition method (such as chemical vapor deposition or atomic layer deposition) with a thickness that is less than one half of the minimum height of the additional backside recesses 233 and less than one half of the width of the isolation trenches 71. Thus, a continuous cavity that extends through unfilled volumes of the additional backside recesses and the isolation trench is present in the fourth exemplary structure. For example, the thickness of the metal layer 260 can be in a range from 5 nm to 30 nm, although lesser and greater thicknesses can also be employed.

Figure 38:
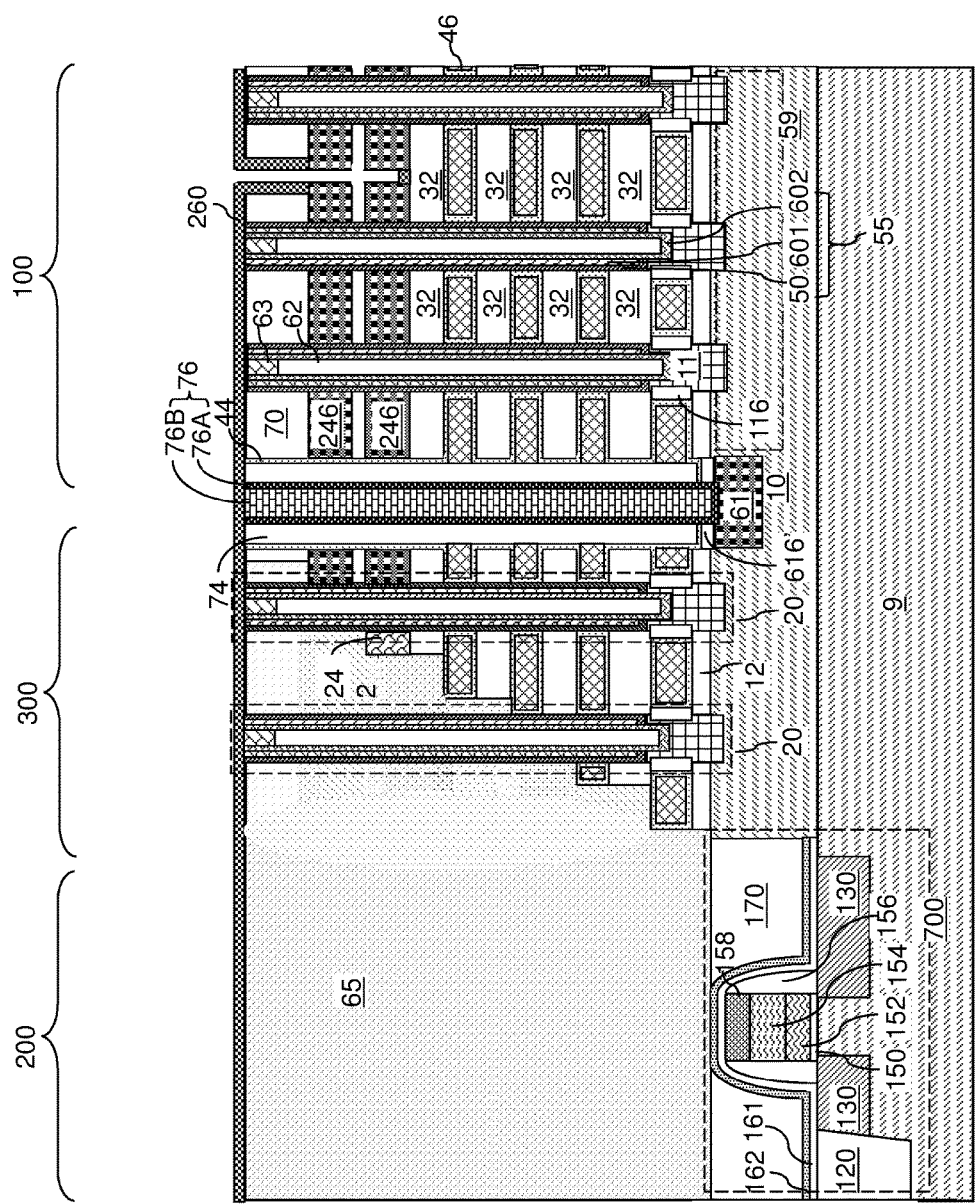
FIG. 38 is a schematic vertical cross-sectional view of the fourth exemplary structure after formation of second electrically conductive layers according to the fourth embodiment of the present disclosure.

Referring to FIG. 38, an anneal is performed at an elevated temperature to induce interdiffusion between the semiconductor material of the at least one template semiconductor material layer 242 and the metal of the metal layer 260. The anneal temperature can be selected based on the compositions of the semiconductor material and the metal. For example, the anneal temperature can be in a range from 550 degrees Celsius to 750 degrees Celsius, although lesser and greater anneal temperatures can also be employed. Each of the at least one template semiconductor material layer 242 can be converted into a metal-semiconductor alloy layer, which is herein referred to as an additional electrically conductive layer 246. If the template semiconductor material layer 242 comprises silicon (e.g., polysilicon), then additional electrically conductive layer 246 comprise a metal silicide, such as titanium, tungsten, cobalt, nickel, or platinum silicide. In case multiple additional electrically conductive layers 246 are present, each of the additional electrically conductive layers 246 can be vertically spaced from one another by a respective air gap. As used herein, an "air gap" refers to a volume that is filled only with a gas phase material or is in vacuum.

Figure 39:
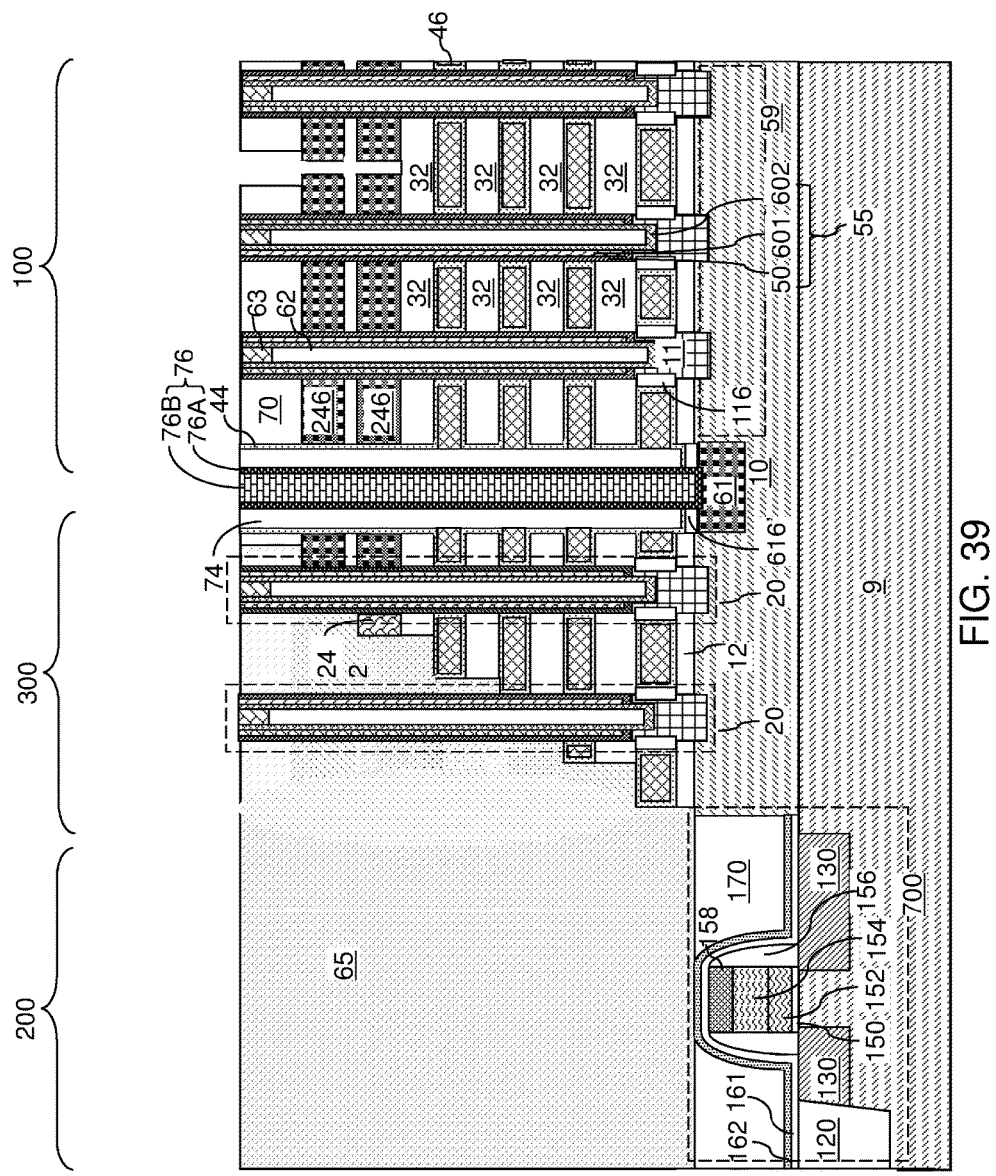
FIG. 39 is a schematic vertical cross-sectional view of the fourth exemplary structure after removal of unreacted portions of the metal layer according to the fourth embodiment of the present disclosure.

Referring to FIG. 39, unreacted portions of the metal layer 260 can be removed selective to the metal-semiconductor alloy material of the additional electrically conductive layers 246. A wet etch process that removes the metal of the metal layer 260 selective to the metal-semiconductor alloy material can be employed.

Figure 40:
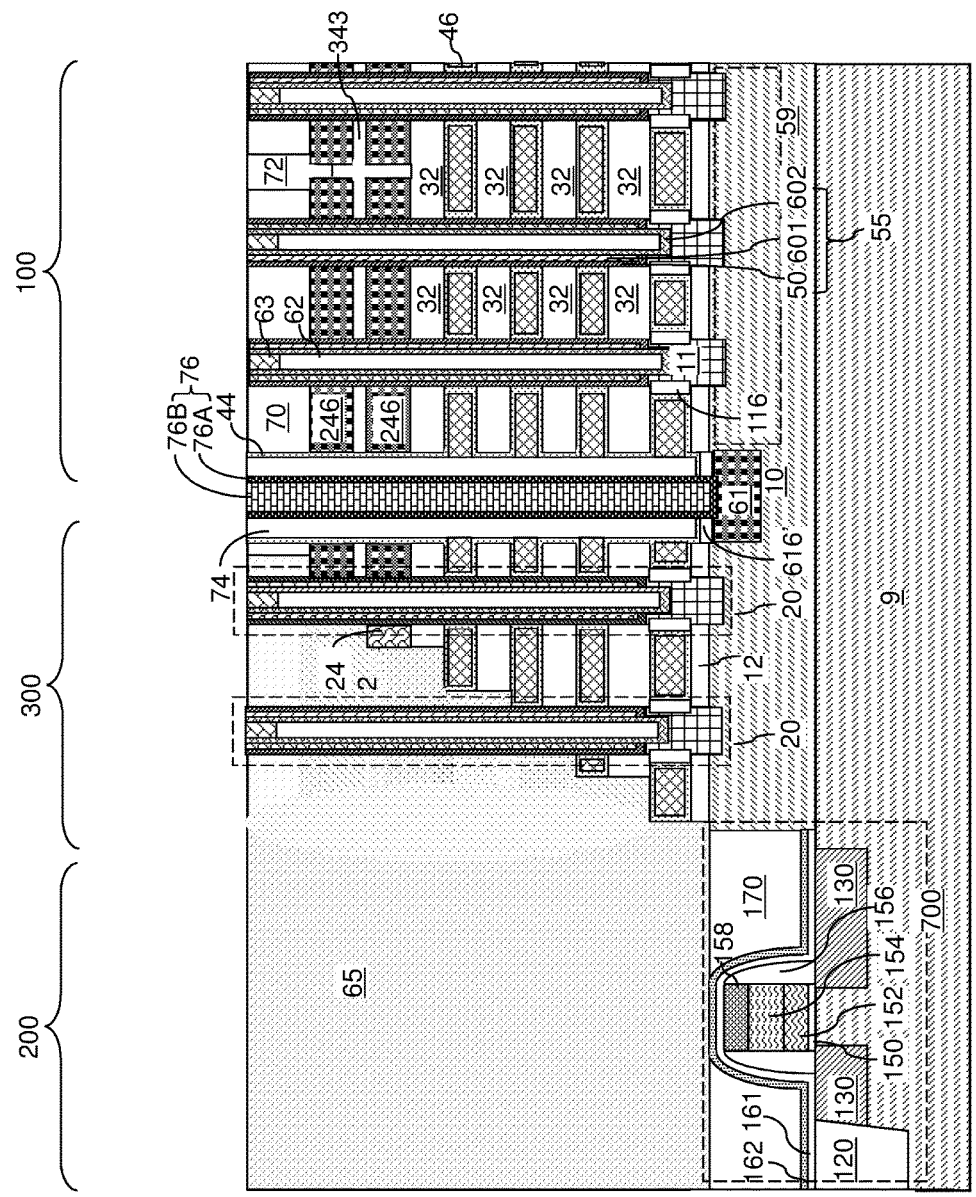
FIG. 40 is a schematic vertical cross-sectional view of the fourth exemplary structure after formation of dielectric isolation structures and an air gap according to the fourth embodiment of the present disclosure.

Referring to FIG. 40, a dielectric material can be anisotropically deposited, for example, by plasma enhanced chemical vapor deposition (PECVD), to form dielectric isolation structures 72. An air gap 343 may be present between at each level from which the at least one sacrificial semiconductor material layer 252 is removed.

Figure 41:
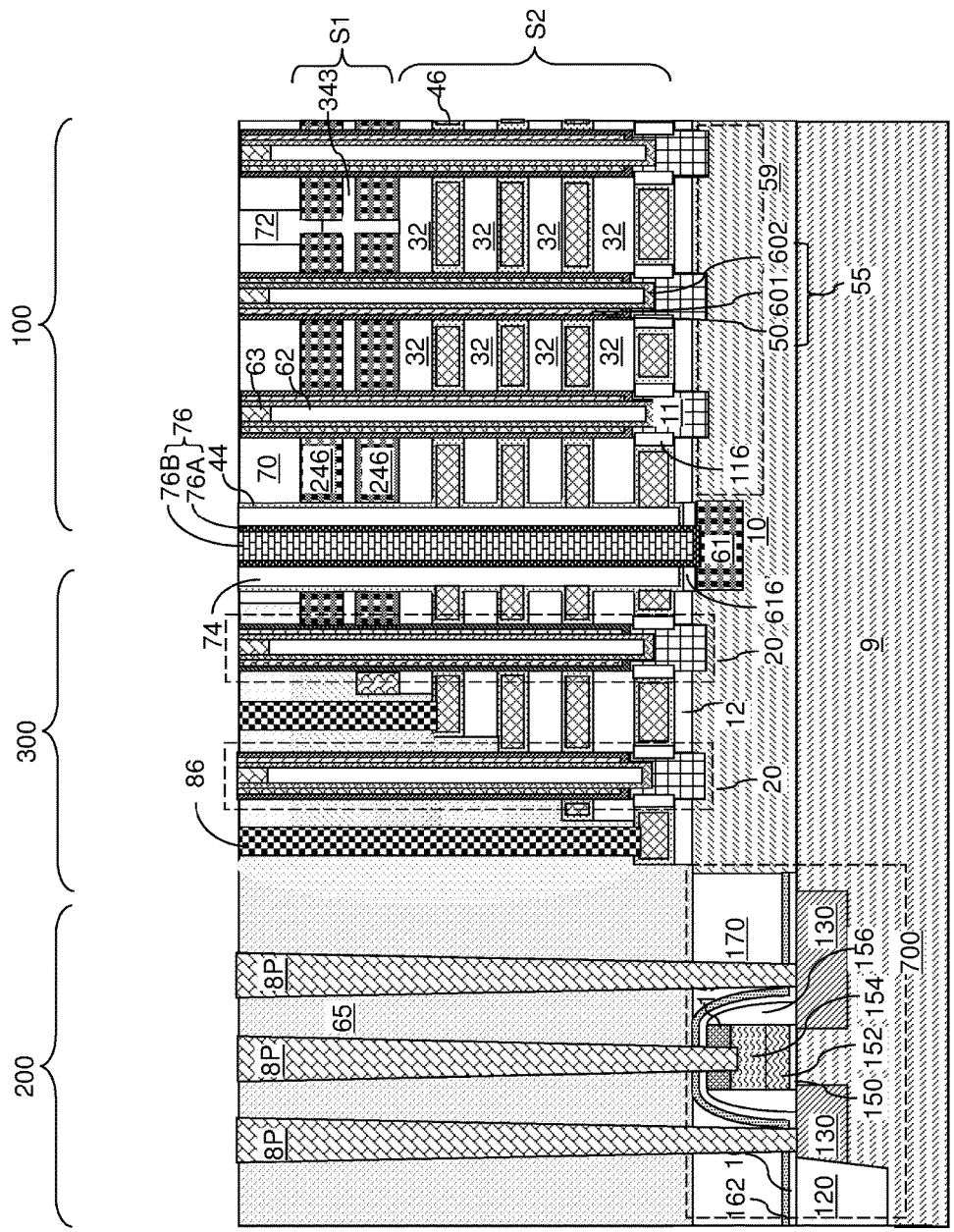
FIG. 41 is a schematic vertical cross-sectional view of the fourth exemplary structure after formation of additional contact via structures according to the fourth embodiment of the present disclosure.

Referring to FIG. 41, additional contact via structures (86, 8P) can be formed through the insulating cap layer 70, and optionally through the retro-stepped dielectric material portion 65. Word line contact via structures 86 can be formed on the electrically conductive layers 46 through the insulating cap layer 70, and through the retro-stepped dielectric material portion 65. Peripheral device contact via structures 8P can be formed through the retro-stepped dielectric material portion 65 directly on respective nodes of the peripheral devices.

Figure 42:
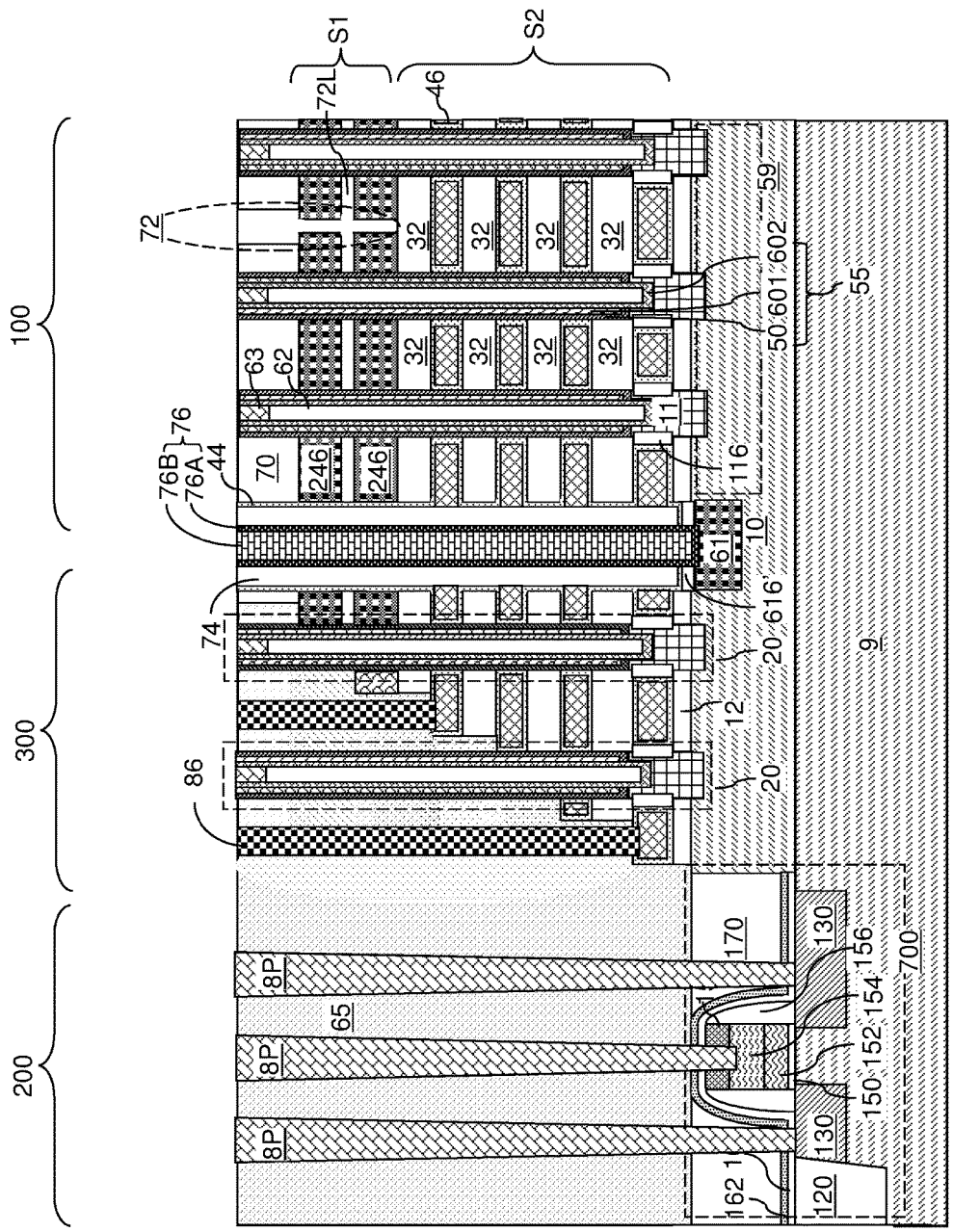
FIG. 42 is a schematic vertical cross-sectional view of an alternate embodiment of the fourth exemplary structure after formation of additional contact via structures according to the fourth embodiment of the present disclosure.

Referring to FIG. 42, an alternate embodiment of the fourth exemplary structure is illustrated, which can be derived from the fourth exemplary structure of FIG. 39 by depositing a dielectric material in the continuous cavity formed by removal of the at least one sacrificial semiconductor material layer 252. In this case, at least one dielectric material layer 72L including at least one horizontally-extending portion and a vertically-extending portion can be formed. The at least one horizontally-extending portion of the at least one dielectric material layer 72L is formed at each level from which the at least one sacrificial semiconductor material layer 252 is removed. The vertically-extending portion of the dielectric material layer constitutes a dielectric isolation structure 72 that laterally divides each layer within a first subset S1 of layers, which includes each of the additional electrically conductive layers 246 and the horizontally-extending portions of the at least one dielectric material layer 72L.

In the fourth embodiment, the at least one template semiconductor material layer 242 is modified to form at least one additional electrically conductive layer 246 after formation of the isolation trenches 71. An etchant that removes the at least one sacrificial semiconductor material layer 252 selective to the insulating layers 32 and selective to the at least one template semiconductor layer 242 is introduced through the isolation trenches 71 to form additional lateral recesses 233.

The fourth exemplary structure can include a three-dimensional memory device. The three-dimensional memory device can include: an alternating stack of insulating layers 32 and first electrically conductive layers 46 located over a substrate (9, 10); at least one second electrically conductive layer 246 located over the alternating stack (32, 46) and comprising a metal-semiconductor alloy material that has a composition different from any material within the first electrically conductive layers 246 (which may not include any semiconductor atoms above trace level); memory stack structures 55 extending through the alternating stack (32, 46) and the at least one second electrically conductive layer 246, wherein each of the memory stack structures 55 comprises a memory film 50 and a vertical semiconductor channel 60 contacting an inner sidewall of the memory film 50; and a dielectric isolation structure 72 extending above the at least one second electrically conductive layer 246, and contacting a sidewall of at least a topmost layer of the at least one second electrically conductive layer 246. The dielectric isolation structure 72 can contact sidewalls of each of the at least one second electrically conductive layer 246 as illustrated in FIG. 42, or may contact sidewalls of a subset of the at least one second electrically conductive layer 246 as illustrated in FIG. 41.

In one embodiment, the at least one second electrically conductive layer 246 can comprise a plurality of second electrically conductive layers 246 that are vertically spaced from one another by at least one air gap 343 that extends laterally.

In one embodiment, the at least one second electrically conductive layer 246 can comprise a plurality of second electrically conductive layers 246 that are vertically spaced from one another by at least one dielectric material layer 72L that extends laterally.

In one embodiment, each of the at least one second electrically conductive layer 246 can be physically divided into respective discrete portions by, or directly underneath, the dielectric isolation structure 72.

In one embodiment, each of the first electrically conductive layers 46 can be substantially free of semiconductor atoms, such as silicon or germanium atoms. As used herein, a structure is "substantially free of" an atomic species if the atomic species is not present within the structure above trace level. As used herein, a trace level is defined as a level less than 0.1 part per million.

The layer stack above the substrate includes a first subset S1 of layers in the drain select level that includes the at least one second electrically conductive layers 246 (i.e., drain select gate layers) and the at least one air gap 343 or horizontally extending portions of the at least one dielectric material layer 72L. The layer stack further includes a second subset S2 of layers that include an alternating stack (32, 46) of the insulating layers 32 and the first electrically conductive layers 46 (i.e., word lines or source select gate layers).

Each of exemplary structures of the present disclosure can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60).

The various embodiments of the present disclosure can be employed to form dielectric isolation structures 72 after formation of backside trenches and formation of electrically conductive layers 46 at word line levels. The electrically conductive layers (46, 146, 246) may be formed at the same time as formation of the electrically conductive layers 46 at the word line levels (as in the first and second embodiments), or after formation of the electrically conductive layers 46 at the word line levels (as in the third and fourth embodiments). By forming the dielectric isolation structures 72 after formation of the electrically conductive layers 46 at word line levels, the locations of the dielectric isolation structures 72 may be selected with lesser design constraint. Furthermore, the dielectric isolation structures 72 do not block formation of middle drain select gate electrodes during the replacement process. Particularly, a region between a neighboring pair of backside trenches 79 can be divided into more than two portions employing more two or more dielectric isolation structures 72 formed between the neighboring pair of backside trenches 79. Thus, more effective areal use of a semiconductor chip can be enabled through the methods of the present disclosure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:

forming a layer stack over a substrate, wherein the layer stack comprises an alternating stack of insulating layers and sacrificial material layers;

forming memory stack structures through the alternating stack;

forming a backside trench through the alternating stack;

forming backside recesses by removing the sacrificial material layers selective to the insulating layers;

forming electrically conductive layers in the backside recesses;

forming a dielectric isolation structure in drain select level of the three-dimensional memory device after formation of the electrically conductive layers;

forming an isolation trench through the drain select level, wherein the dielectric isolation structure is formed in the isolation trench and wherein the drain select level comprises a set of layers including the topmost electrically conductive layer among the electrically conductive layers which comprises a drain select gate;

depositing and removing at least one metallic fill material layer in the isolation trench prior to formation of the dielectric isolation structure in the isolation trench, wherein portions of the at least one metallic fill material layer deposited in the backside recesses constitute the electrically conductive layers;

depositing the at least one metallic fill material layer in the isolation trench to fill the isolation trench; and removing a portion of the at least one metallic fill material layer from within the isolation trench, wherein the dielectric isolation structure is formed in a volume from which the portion of the at least one metallic fill material layer is removed.

2. The method of claim 1, wherein:

the three-dimensional memory device comprises a monolithic three-dimensional NAND memory device;

the electrically conductive layers comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

3. A method of forming a three-dimensional memory device, comprising:
- forming a layer stack over a substrate, wherein the layer stack comprises an alternating stack of insulating layers and sacrificial material layers;
- forming memory stack structures through the alternating stack;
- forming a backside trench through the alternating stack;
- forming backside recesses by removing the sacrificial material layers selective to the insulating layers;
- forming electrically conductive layers in the backside recesses;
- forming a dielectric isolation structure in drain select level of the three-dimensional memory device after formation of the electrically conductive layers; and
- forming an isolation trench through the drain select level, wherein the dielectric isolation structure is formed in the isolation trench;

wherein:
- the drain select level comprises an additional electrically conductive layer which comprises a drain select gate which is formed after formation of the electrically conductive layers;
- the layer stack further comprises an additional material layer overlying the alternating stack; and
- the additional electrically conductive layer is formed by replacing or modifying the additional material layer by introducing a conductive material through the isolation trench.

4. The method of claim 3, wherein:
- the additional material layer comprises a material different from materials of the insulating layers and the sacrificial material layers; and
- the additional material layer is replaced or modified after formation of the electrically conductive layers.

5. The method of claim 4, wherein the additional material layer is replaced with the additional electrically conductive layer by:
- introducing an etchant that removes the additional material layer selective to the insulating layers to form additional lateral recesses; and
- depositing a conductive material in the additional lateral recesses.

6. The method of claim 4, wherein:
- the additional material layer comprises a semiconductor material; and
- the additional material layer is modified into a metal-semiconductor alloy layer by reacting with a metal deposited on the additional material layer through the isolation trench.

7. The method of claim 6, further comprising forming at least one air gap by depositing a dielectric material employing a conformal deposition process during formation of the dielectric isolation structure.

8. The method of claim 6, further comprising forming a dielectric material layer directly on the metal-semiconductor alloy layer during formation of the dielectric isolation structure.

9. The method of claim 3, wherein:
- the three-dimensional memory device comprises a monolithic three-dimensional NAND memory device;
- the electrically conductive layers comprise, or are electrically connected to, a respective word line of the monolithic three-dimensional NAND memory device;
- the substrate comprises a silicon substrate;
- the monolithic three-dimensional NAND memory device comprises an array of monolithic three-dimensional NAND strings over the silicon substrate;
- at least one memory cell in a first device level of the array of monolithic three-dimensional NAND strings is located over another memory cell in a second device level of the array of monolithic three-dimensional NAND strings;
- the silicon substrate contains an integrated circuit comprising a driver circuit for the memory device located thereon;
- the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
- the array of monolithic three-dimensional NAND strings comprises:
  - a plurality of semiconductor channels, wherein at least one end portion of each of the plurality of semiconductor channels extends substantially perpendicular to a top surface of the substrate, and
  - a plurality of charge storage elements, each charge storage element located adjacent to a respective one of the plurality of semiconductor channels.

* * * * *